(12) United States Patent
Ooishi

(10) Patent No.: US 6,330,200 B2
(45) Date of Patent: Dec. 11, 2001

(54) SYNCHRONOUS SEMICONDUCTOR MEMORY DEVICE HAVING IMPROVED OPERATIONAL FREQUENCY MARGIN AT DATA INPUT/OUTPUT

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/833,735

(22) Filed: Apr. 13, 2001

Related U.S. Application Data

(62) Division of application No. 09/266,918, filed on Mar. 12, 1999.

(30) Foreign Application Priority Data

Jun. 17, 1998 (JP) .................................................. 10-169881
Sep. 24, 1998 (JP) .................................................. 10-269761

(51) Int. Cl.[7] ...................................................... G11C 7/00
(52) U.S. Cl. ............................................. 365/201; 365/233
(58) Field of Search ..................................... 365/201, 233

(56) References Cited

U.S. PATENT DOCUMENTS

| 5,544,106 | * 8/1996 | Koike | ................................... 365/201 |
|---|---|---|---|
| 6,072,743 | 6/2000 | Amano et al. | ................... 365/230.03 |
| 6,115,280 | 9/2000 | Wada | ....................................... 365/78 |

FOREIGN PATENT DOCUMENTS

| 62-211763 | 9/1987 | (JP) . |
|---|---|---|
| 08-138377 | 5/1996 | (JP) . |
| 09-120672 | 5/1997 | (JP) . |

OTHER PUBLICATIONS

"A 2.5–ns Clock Access, 250–MHz, 256–Mb SDRAM with Synchronous Mirror Delay", by Saeki et al., IEEE Journal of Solid–State Circuits, vol. 31, No. 11 (Nov. 1996), pp. 1656–1665.

* cited by examiner

Primary Examiner—David Nelms
Assistant Examiner—M. Tran
(74) Attorney, Agent, or Firm—McDermott, Will & Emery

(57) ABSTRACT

A synchronous semiconductor memory device includes a latch for temporarily storing data to be output to the outside, and a latch temporarily storing data input from the outside. The latches operate based on an internal clock when exchanging data with internal memory block, and operate based on a clock in phase with an external clock when exchanging data with the outside.

5 Claims, 54 Drawing Sheets

FIG.22

|  | #1 | #2 | #3 | #4 |
|---|---|---|---|---|
| DQ0 | CKE | BA0 | A7 | DT7 |
| DQ4 | /CS | BA1 | A6 | DT6 |
| DQ8 | /RAS | BA2 | A5 | DT5 |
| DQ12 | /CAS | A12 | A4 | DT4 |
| DQ16 | /WE | A11 | A3 | DT3 |
| DQ20 | DM0 | A10 | A2 | DT2 |
| DQ24 | DM1 | A9 | A1 | DT1 |
| DQ28 | — | A8 | A0 | DT0 |
|  | COMMAND | ADDRESS | ADDRESS | DATA |

⇩

DATA PATTERN

SYNCHRONOUS SEMICONDUCTOR MEMORY DEVICE HAVING IMPROVED OPERATIONAL FREQUENCY MARGIN AT DATA INPUT/OUTPUT

This application is a division of Ser. No. 09/266,918 filed Mar. 12, 1999.

BACKGROUND OF THE INVENTION

1. Field of the Invention

The present invention relates to a synchronous semiconductor memory device and, more particularly, to an input/output circuit for inputting/outputting data in synchronization with a clock as well as to a synchronous semiconductor memory device including the input/output circuit.

2. Description of the Background Art

Conventionally, in a data input/output circuit used in a semiconductor device, for example in a semiconductor memory device, a plurality of data to be output are shifted or offset in phase with respect to an internal clock, so as to enable data transfer from the semiconductor memory device at a rate higher than the dock frequency.

As the speed of operation of semiconductor devices has been increased recently, however, there arises a problem of data collision or erroneous data pickup when a plurality of data are interleaved and picked up by an externally connected circuit.

In a very large sychronous semiconductor memory device having as large a memory capacity as 1 G bit, there is considerably large skew in internal signals, especially in a dock controlling the overall operation of the chip, which skew limits the operational frequency of the chip. Especially when an externally input reference clock is received by a clock buffer and addresses, data and commands are received based on the dock, it is necessary to distribute the received clock to respective address, data and command input terminals. Delay involved in the clock distribution limits performance of the chip. Further, at the time of output, if the output buffer is controlled based on the dock, the output is delayed by the amount of clock skew, which may reduce margin of the output data received externally.

As a second problem, the following is experienced in an operation test during manufacturing or before shipment of the product, as the speed of operation of the semiconductor memory device has been increased.

More specifically, as the storage capacity of the semiconductor memory device increases, the time necessary for testing the device increases and, eventually, the cost for the test and manufacturing cost of the product have been increased.

As a measure to address the increased test time associated with increased storage capacity of the semiconductor memory device, efficiency of testing is improved by testing a plurality of semiconductor memory devices in parallel. The increased storage capacity of the semiconductor memory device mentioned above involves increased number of bits of the address signals to be applied to the semiconductor memory device and multiple bits data input/output interface, and therefore the number of pins for control signals and input/output pins per one semiconductor memory device are increased. Accordingly, the number of semiconductor memory devices which can be tested in parallel at one time is limited.

The number of chips of the semiconductor memory devices which can be measured at one time by a tester is determined by the relation between the number of pins of the tester and the number of pins required by the chip, which relation is generally represented by the following equation.

(Number of pins of the tester)/(number of pins required by the chip)>(number of chips measurable at one time)

Further, if the speed of operation of a tester for testing the semiconductor memory device is to be improved along with the improvement of the speed of operation of the simiconductor device, very expensive testing apparatus is necessary, which results in increased cost of testing.

A third problem is that in a synchronous semiconductor memory device attaining reduced cost and improved function by employing complicated system such as BIST (Built In Self Test) and dock generation by DLL (Delay Locked Loop), it is difficult to monitor state of operation of this circuit externally.

SUMMARY OF THE INVENTION

An object of the present invention is to provide an input/output circuit and a synchronous semiconductor memory device having improved operation frequency margin with respect to data input/output.

Another object of the present invention is to provide a synchronous semiconductor memory device of which cost of testing is reduced by reducing the number of terminals used for testing so that the number of chips which can be measured simultaneously by one tester is increased.

An additional object of the present invention is to provide a synchronous semiconductor memory device of which internal circuitry can be tested and evaluated easily, as external monitoring of the states of internal circuits which cannot be directly monitored from the outside in normal operation is made possible through an input/output circuit.

In summary, the present invention provides a synchronous semiconductor memory device including an input/output terminal, an internal circuit and an input/output circuit.

The input/output terminal input/outputs data. The internal circuit stores data. The input/output circuit exchanges data with the outside through the input/output terminal, and exchanges data with the internal circuit through a data bus. The input/output circuit includes a first data holding circuit holding first data, and a second data holding circuit holding second data.

According to another aspect, the present invention provides a synchronous semiconductor device including a first terminal group, a second terminal group, a first internal circuit, a second internal circuit and a test control circuit.

The first terminal group receives as inputs first data group in the normal operation mode, and receives as inputs first data group and second data group time divisionally in accordance with an external clock in a test mode. The second terminal group receives as inputs the second data group in the normal operation mode. The first internal circuit operates in response to the first data group. The second internal circuit operates in response to the second data group. The test control circuit receives the first data group from the first data terminal group and outputs the data group to the first internal circuit and receives the second data group from the second data terminal group and outputs the data group to the second internal circuit, in the normal operation mode, and the test control circuit receives the first data group and the second data group from the first input terminal group and outputs the data groups to the first internal circuit and the second internal circuit respectively, in the test mode.

According to a still another aspect, the present invention provides a synchronous semiconductor memory device including an internal circuit, a first terminal group and a data transmission circuit. The data transmission circuit is provided between the internal circuit and the first terminal group, activated in the test mode and outputs a data group indicating the state of the internal circuit to the first terminal group.

Therefore, a main advantage of the present invention is that operation margin is enlarged, as the clock for the data exchange with the internal circuit cam be set independent from the clock for data exchange with the external circuit.

Another advantage of the present invention is that the number of input/output terminals when operation is confirmed in the step of testing can be reduced, and therefore cost for testing can be reduced.

An additional advantage of the present invention is that when BIST or the like is incorporated, internal state can be monitored by the test apparatus, and therefore the result of confirmation of operation is more reliable, and it becomes easier to find cause of any trouble.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 is an illustration of contents of data trains D1, D2 and D3 of FIG. 21.

DESCRIPTION OF THE PREFERRED EMBODIMENTS

Figure 1:
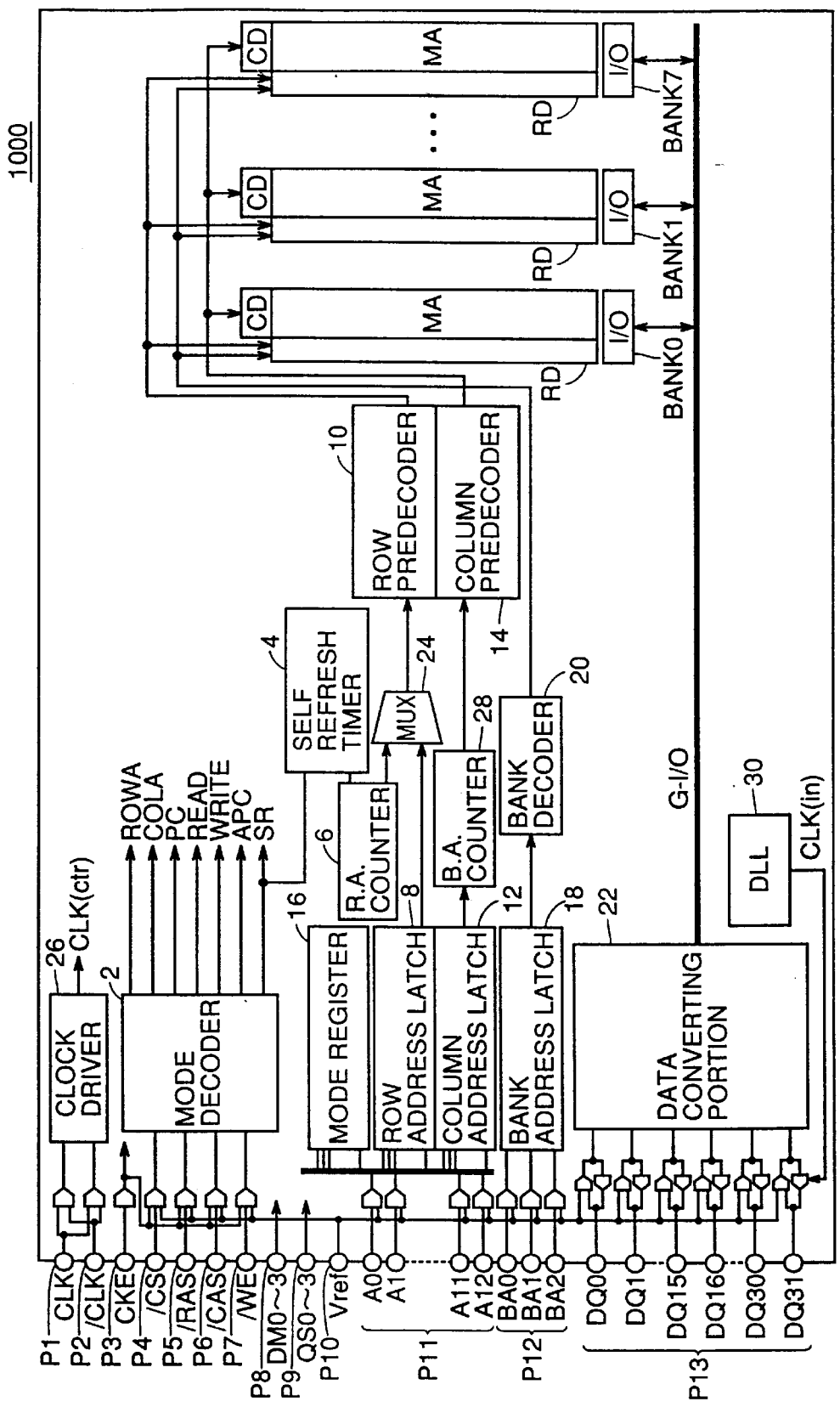
FIG. 1 is a schematic block diagram showing an overall structure of the synchronous semiconductor conductor memory device 1000 in accordance with the present invention.

Embodiments of the present invention will be described in detail in the following with reference to the figures. In the figures, same reference characters denote the same or corresponding portions. Storing operation includes reading and writing operations in this specification.

First Embodiment

FIG. 1 is a schematic block diagram showing an overall structure of a synchronous semiconductor memory device 1000 of the present invention.

Referring to FIG. 1, synchronous semiconductor memory device 1000 is a double data rate synchronous dynamic random access memory (hereinafter referred to as DDR-SDRAM) having a capacity of 1 G bits.

Synchronous semiconductor memory device 1000 includes: terminals P1 and P2 receiving externally applied complementary clock signals CLK and /CLK as references for overall operation; a terminal P3 receiving an enable signal CKE enabling input to the chip; a terminal P4 receiving a signal /CS identifying a command input; a terminal P5 receiving a signal /RAS indicating input of a row related command; a terminal P6 receiving a signal /CAS indicating input of a column related command; a terminal P7 receiving a signal WE which is a signal for identifying read and write; a terminal group P8 for inputting/outputting data mask signals DM0 to DM3 for identifying invalidity of data at the time of reading or writing; a terminal group P9 for inputting/outputting data strobe signals QSO to QS3 identity data time at the time of reading or writing; a terminal P10 to which a reference potential Vref for determining H level /L level of an input signal is input; a terminal group P11 receiving address signals A0 to A12 as inputs; a terminal group P12 receiving bank addresses BA0 to BA2 of 3 bits of 8 memory banks contained in the device; and a terminal group P13 for inputting/outputting data input/output signals DQ0 to DQ31 of 32 bits.

Synchronous semiconductor memory device 1000 does not operate while enable signal CKE is inactive. In this inactive period, the synchronous semiconductor memory device is in a standby state or in a self refresh state.

While the signal /CS is active, a command is recognized at a rising edge of the clock. Data mask signals DM0 to DM2 are transmitted from the semiconductor memory device to a controller IC when data invalidity is to be notified at the time of reading, while the signals are transmitted from the controller IC to the semiconductor memory device when data invalidity is to be notified at the time of writing. One data mask signal DM is allotted to every 8 data input/output signals DQ.

Similarly, data strobe signal QS is transmitted from the semiconductor memory device to the controller IC signaling data timing at the time of reading, and transmitted from the controller IC to the semiconductor memory device at the time of writing. One data strobe signal QS is allotted to every 8 data input/output signals DQ.

As for the address signals; A0 to A12, 13 bits are all used a; a row address input, while 10 bits out of 13 bits are used as a column address input. Further, some of the address signals are used for writing to a mode register.

Synchronous semiconductor memory device 1000 further includes: a mode decoder 2 recognizing an input command; a mode register 16 holding an operation mode; a row address latch 8 for taking a row address from an address terminal group; a column address latch 12 taking a column address from an address terminal group; a bank address latch 18 taking a bank address signal from a bank address terminal group; and a bank decoder 20 for decoding a bank address output from bank address latch 18 and activating a corresponding bank.

Synchronous semiconductor memory device 1000 further includes: a self refresh timer 4 and a refresh address counter 6 for generating a refresh address at the time of refresh operation; a multiplexer 24 selecting one of an address output from row address latch 8 and an address output from refresh address counter 6; a row predecoder 10 receiving an address output from multiplexer 24 for outputting a corresponding signal to row decoder RD; a burst address counter 28 generating continuous column addresses at the time of burst operation; and a column predecoder 14 receiving an address output from burst address counter 28 for outputting a corresponding signal to column decoder CD.

Synchronous semiconductor memory device 1000 further includes: a delay locked loop (hereinafter referred to as DLL) circuit 30 generating a clock CLK (in) which is in phase with an externally input dock CLK; and a data converting portion 22 for converting data rate between data terminal group P13 and a global input/output line G-I/O for data exchange.

Global input/output line G-I/O exchanges data with 8 memory banks BANK0 to BANK7.

Figure 2:
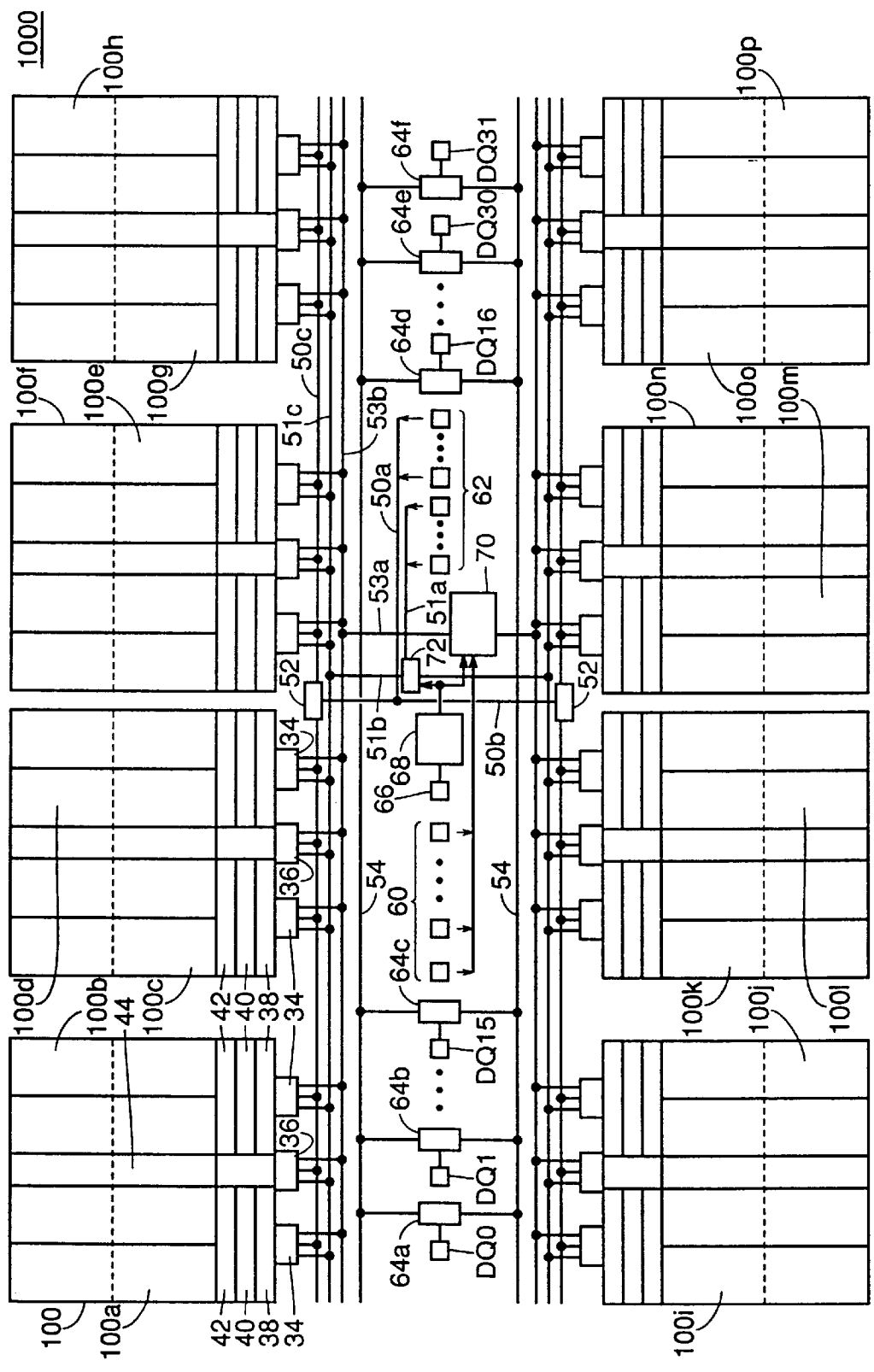
FIG. 2 is a schematic diagram showing an exemplary arrangement of blocks in synchronous semiconductor memory device 1000 in accordance with a first embodiment of the present invention.

FIG. 2 is a schematic diagram showing an example of arrangement of various blocks in synchronous semiconductor memory device 1000 in accordance with the present embodiment.

Referring to FIG. 2, synchronous semiconductor memory device 1000 includes a control circuit 70 receiving external control signals /RAS, /CAS, /WE, /CS and so on applied through external control signal input terminal group 60, decoding the external control signals and generating internal control signals; command data buses 53a and 53b transmitting internal control signals output from control circuit 70; and a memory cell array 100 having memory cells arranged in a matrix of rows and columns.

Memory array 100 is, as shown in FIG. 2, divided into a total of 16 memory cell blocks 100a to 100p. For example, if synchronous semiconductor memory device 1000 has the storage capacity of 1 G bits, each memory cell block has the capacity of 64M bits. Each block has such a structure that allows independent operation as a bank.

Synchronous semiconductor memory device 1000 further includes an internal synchronizing signal generating circuit 18 receiving an external clock signal CLK applied to a clock signal input terminal 66, starting synchronizing operation under the control of control circuit 70 and outputting an internal dock signal CLK (in).

Internal synchronizing signal generating circuit 18 generates, by using a DLL circuit or the like, for example, the internal clock signal CLK (in) which is synchronous with the external clock signal CLK.

External address signals A0 to A12 and BA0 to BA2 applied through address signal input terminal group 62 are taken under the control of control circuit 70 into semiconductor memory device 1000 in synchronization with the internal dock signal CLK (in).

External address signals BA0 to BA2 are applied to bank decoder 72 through address bus 51a. Decoded bank addresses B0 to B7 are transmitted to respective memory cell blocks through address buses 51b and 51c from bank decoder 72.

Bank addresses B0 to B7 activates a total of two memory cell blocks, that is, any one of the memory cell blocks provided corresponding to data input terminals DQ0 to DQ15 and any one of the memory cell blocks provided corresponding to data input/output terminals DQ16 to DQ31.

Other external address signals applied to address signal input terminal group 62 are transmitted through address buses 50a and 50b to address driver 52. Further, the external address signals are transmitted from address driver 52 through address bus 50c to respective memory cell blocks.

Synchronous semiconductor memory device 1000 further includes: a row predecoder 36 provided corresponding to every pair of memory cell blocks, for latching a row address transmitted from address bus 50c and predecoding the latched row address under the control of control circuit 70; a row decoder 44 for selecting a corresponding row (word line) of a selected memory cell block based on an output from row predecoder 36; a column predecoder 34 provided corresponding to every memory cell block, for latching and predecoding a column address transmitted through address bus 50c under the control of control circuit 70; a column predecoder line 40 for transmitting an output from column predecoder 34; and a column decoder 42 for selecting a corresponding column (bit line pair) of the selected memory cell based on an output from column predecoder line 40.

Synchronous semiconductor memory device 1000 further includes data input/output terminals DQ0 to DQ15 and DQ16 to DQ31 arranged in a region at the central portion of the chip along the longer side and outside the region where external control signal input terminal group 60 and address signal input terminal group 62 are formed; input/output buffer circuits 64a to 64f provided corresponding to data input/output terminals DQ0 to DQ31; a data bus 54 for transmitting data between input/output buffers and corresponding memory cell blocks; and read/write amplifiers 38 provided corresponding to memory cell blocks 100a to 100p, respectively, for exchanging data between data bus 54 and selected column of memory cells.

The signal /RAS applied to external control signal input terminal group 60 is a row address strobe signal for initiating internal operation of synchronous semiconductor memory device 1000 and determining active period of the internal operation. In response to activation of the signal /RAS, circuits related to the operation of selecting a row in the memory cell array 100 such as row decoder 44 are set to the active state.

The signal /CAS applied to external control signal input terminal group 60 is a column address strobe signal, for setting circuits selecting a column in memory cell array 100 to the active state.

The signal /CS applied to external control signal input terminal group 60 is a chip select signal indicating that the synchronous semiconductor memory device 1000 is selected, and the signal /WE is a signal instructing writing operation of the synchronous semiconductor memory device 1000.

The operation of taking signals /CS, /RAS, /CAS and /WE takes place in synchronization with internal dock signal CLK (in).

Further, the operation of taking an address signal applied to address signal input terminal group 62 also takes place in synchronization with internal clock signal CLK (in).

Description of the Concept of Asynchronism

The present invention is to enable asynchronous internal and external operations in the input/output circuit. Prior to description of specific structure, the concept of asynchronism will be briefly described.

Figure 3:
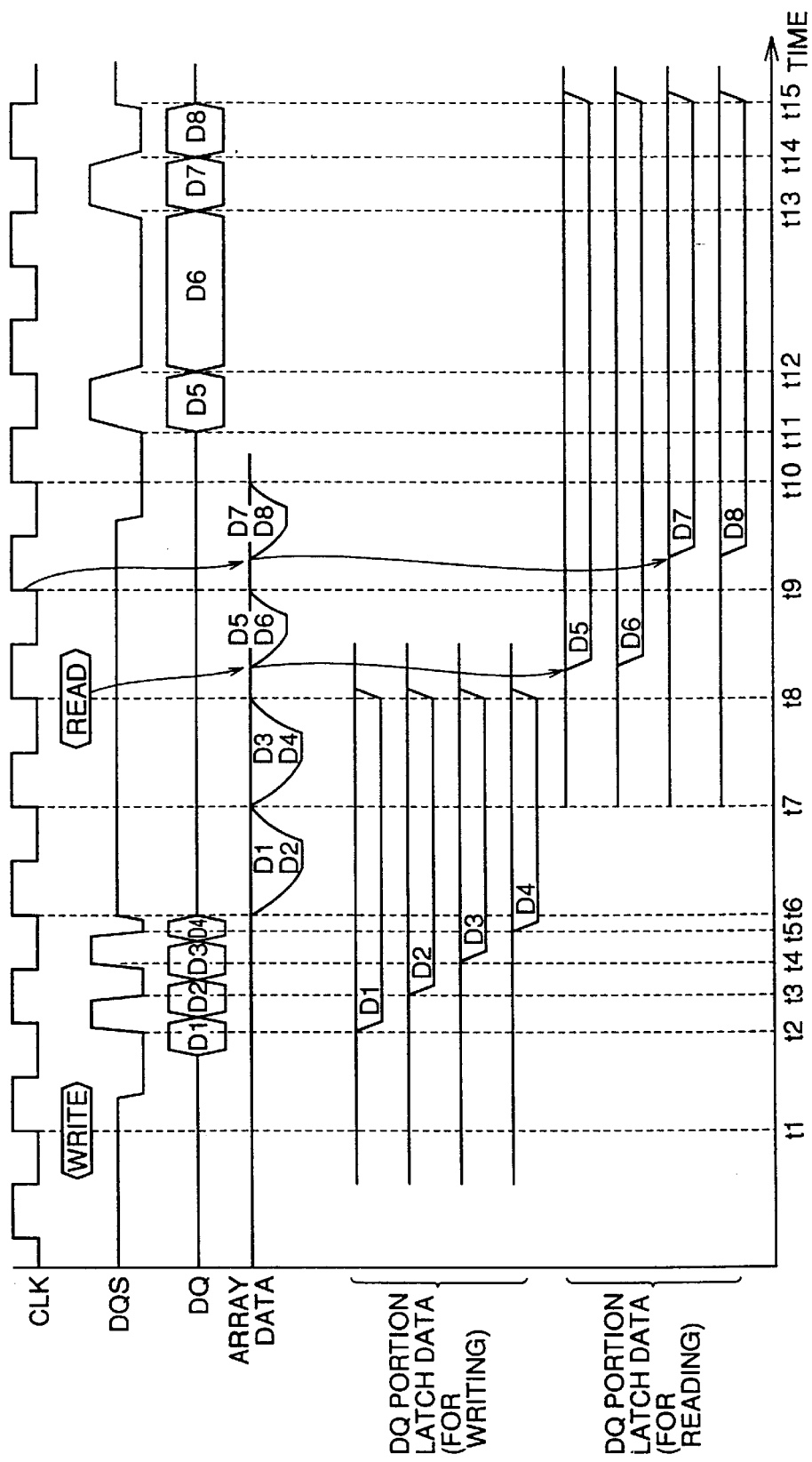
FIG. 3 is a diagram of operational waveforms illustrating the concept of asynchronism.

FIG. 3 is a diagram of operational waveforms illustrating the concept of asynchronism.

Referring to FIG. 3, an externally input dock CLK is a reference for data reading/writing from and to the memory array inside the synchronous semiconductor memory device.

At time t1, a write command is input externally.

At the time of writing, the synchronous semiconductor memory device takes in data in accordance with the timing of the signal DQS externally input in synchronization with the data. At time t2, data D1 which has been input to data terminal DQ is taken in response to the rise of the signal DQS and written to a latch for writing provided at the input/output circuit portion. Similarly, at time points t3, t4 and t5, data D2, D3 and D4 are taken to the write latches at the timings of change of the signal DQS.

At time t6, data D1 and D2 which have been taken in write latches are written to the memory array in response to the rise of the dock CLK. Thereafter, at time t7, data D3 and D4 which have been taken in the write latches are written to the memory array.

At time t8, burst writing is completed, and the latch for writing is reset.

Simultaneously, at time t8, a read command is input from the outside. In the period from t8 to t9, in accordance with an internal clock generated internally based on the dock CLK, data D5 and D6 written in the memory array portion are transmitted to a latch for reading of the input/output circuit portion. Thereafter, from t9 to t10, data D7 and D8 which have been written in the memory array, are transmitted to the latch for reading in the input/output circuit portion in accordance with the internal clock generated internally based on the clock CLK. At the time of reading, the data held in the latch at the input/output circuit portion is output at a timing when the system connected to the outside of the semiconductor memory device requires data, and the signal DQS which corresponds to the timing is transmitted from the synchronous semiconductor memory device to the external system.

As the signal DQS changes in the time period from t11 to t15, data D5 to D8 are output successively.

Here, the timing of outputting data is not always in synchronization with the externally input dock CLK as shown in FIG. 3.

At time t15, burst reading is completed and the latch for reading is reset.

As described above, synchronous semiconductor memory device reads and writes data from and to the memory array in accordance with the internal clock generated internally based on the externally input clock CLK. When data is to be exchanged with the outside, the synchronous semiconductor memory device takes data to a latch portion or transmits data from the latch portion in response to a signal DQS indicating a timing which matches the specification of the system connected to the outside.

Description of Detailed Structure of the Input/Output Circuit Portion

Figure 4:
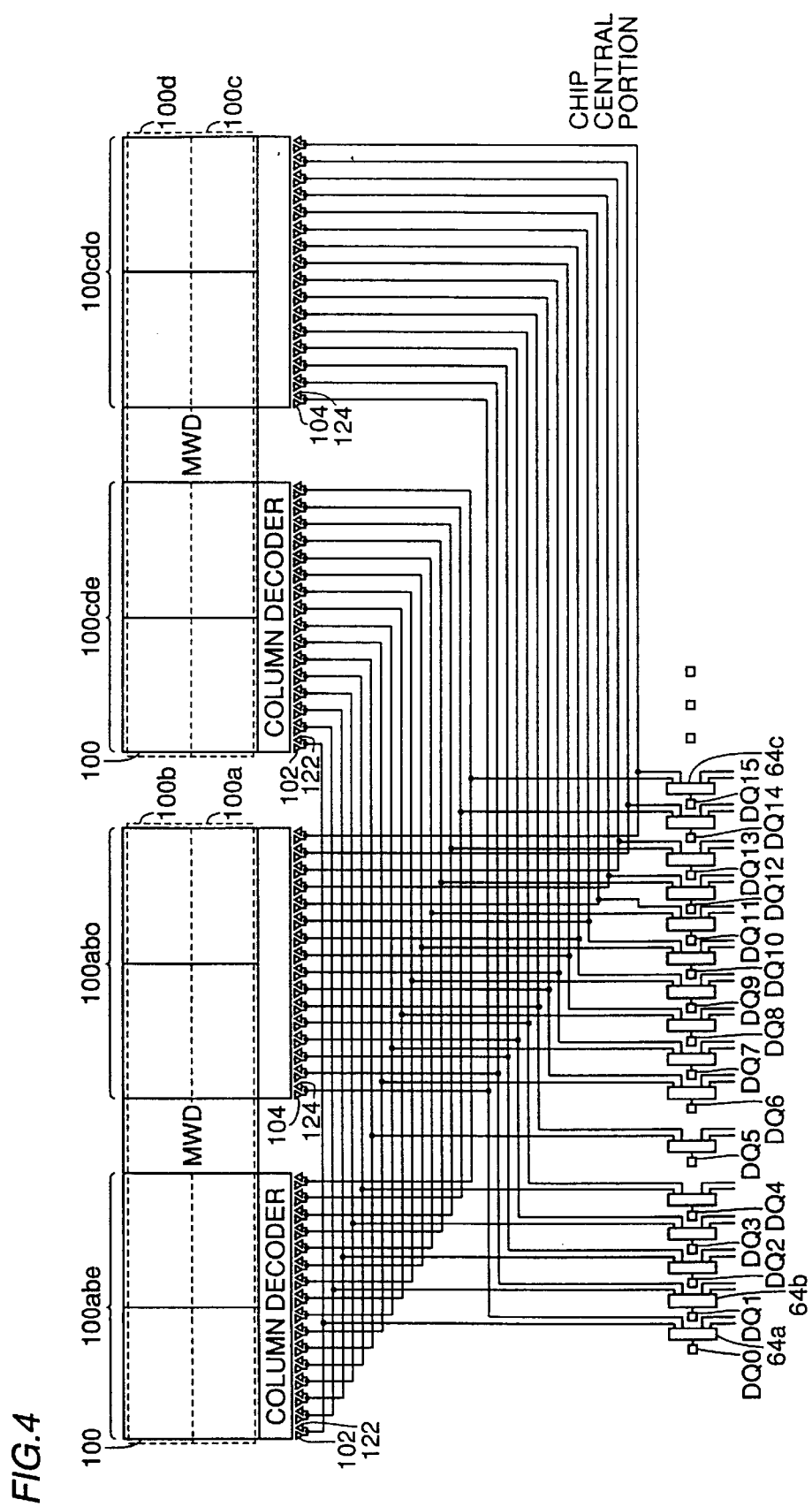
FIG. 4 is a schematic illustration showing connection between banks and input/output circuits respectively.

FIG. 4 is a schematic diagram showing connection between each bank and each input/output circuit.

FIG. 4 shows, in enlargement, an area corresponding to 256M bits of an upper half of a left half of a chip, showing connection between banks 100*a* to 100*d* of the synchronous semiconductor memory device and input/output circuits at data input/output terminals DQ0 to DQ 15, described with reference to FIG. 2. Referring to FIG. 4, banks 100*a* and 100*b* are divided into areas 100*abe* and 100*abo* corresponding to even-numbered addresses and odd-numbered addresses, on both sides of a main word driver MWD, respectively.

In the double data rate method, it is necessary that the data are output at a frequency twice that of the internal clock. By such division, it becomes possible to simultaneously access data corresponding to odd-numbered and even-numbered addresses, and therefore data output operation at twice the frequency is facilitated.

It is, however, not a necessary condition. Such operation can be realized by advancing the timing of access to the corresponding area dependent on whether the data to be output first has an odd-numbered address or an even-numbered address and by delaying the timing of accessing the area corresponding to the data to be accessed next. This method also prevents occurrence of a large current peak. However, the phase of access timing must be changed dependent on whether the first address to be accessed is odd-numbered or even-numbered, and therefore operation control is complicated.

Data from an area for the even-numbered address and data from an area for the odd-numbered address of one bank are input to the same DQ portion.

For example, to an input/output circuit 64*a* provided corresponding to data terminal DQ0, a read amplifier 102 for reading data from even-numbered address areas 100*abe* and 100*cde* and a write amplifier 122 for writing data are connected. Further, to the input/output circuit 64*a*, read amplifier 104 for reading data from odd-numbered address areas 100*abo* and 100*cdo* and write amplifier 124 for writing data are connected.

Similarly, input/output circuits are provided corresponding to data terminals DQ1 to DQ15, and read amplifiers and write amplifiers for the odd-numbered address areas and even-numbered address areas are connected to respective input/output circuits.

Figure 5:
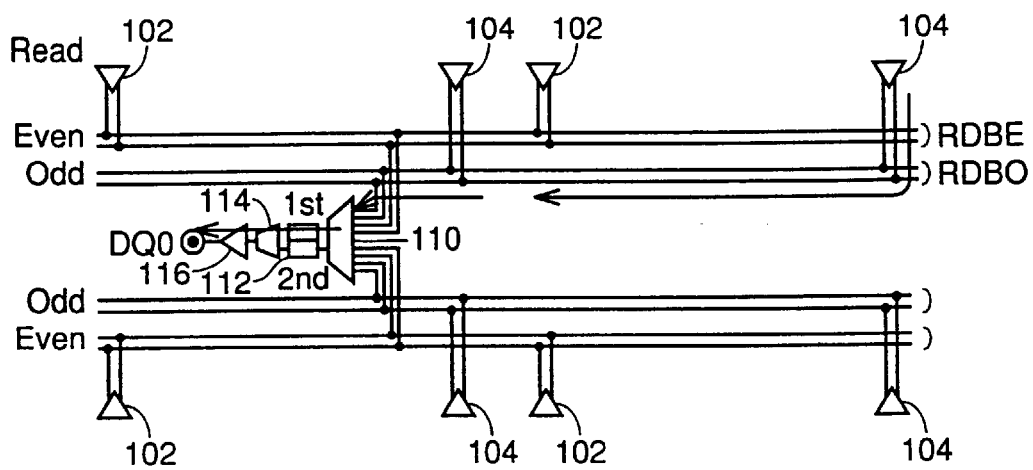
FIG. 5 is an illustration related to flow of data output from a memory bank to a data terminal DQ0.

FIG. 5 is an illustration of a data flow from the memory bank to data terminal DQ0.

When data of an odd-numbered area of the bank is read, the data read from the memory cell array by read amplifier 104 is output to read data bus RDBO. The data is selected by multiplexer 110, temporarily held in latch 112, and thereafter output through multiplexer 114 and output buffer 116 to tie terminal. When data is to be read from an even-numbered area, data is applied from read amplifier 102 through read data bus RDBE to multiplexer 110.

Figure 6:
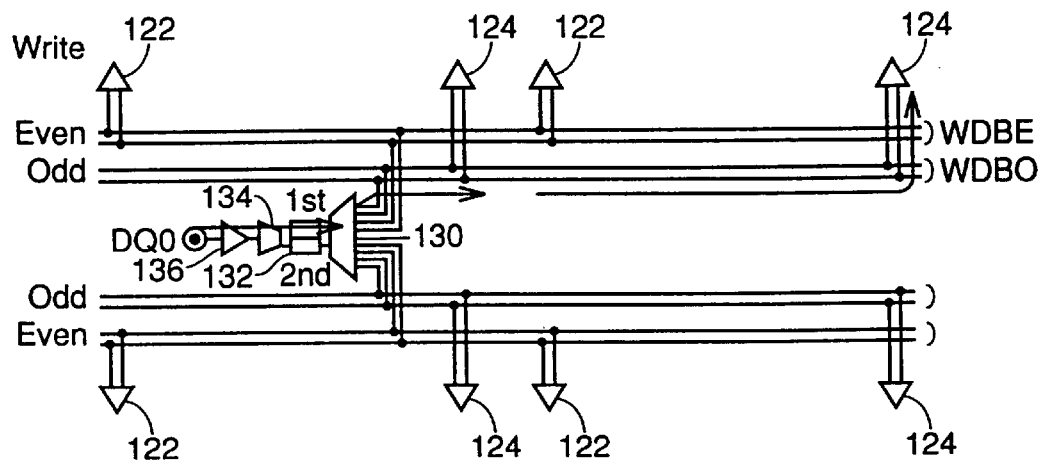
FIG. 6 is an illustration related to flow of data from data input/output terminal DQ0 to a bank.

FIG. 6 is an illustration showing flow of data written from data input/output terminal DQ0 to the bank.

Referring to FIG. 6, when data is to be written to an odd-numbered address, the data input from a terminal is output to write data bus WDBO to input buffer 136, demultiplexer 134, latch 132 and demultiplexer 130, and transmitted by write amplifier 124 to the memory array. When data is to be written to an even-numbered address, similarly, data is transmitted through demultiplexer 130 and write data bus WDBE to write amplifier 122, amplified and transmitted to the memory array.

Figure 7:
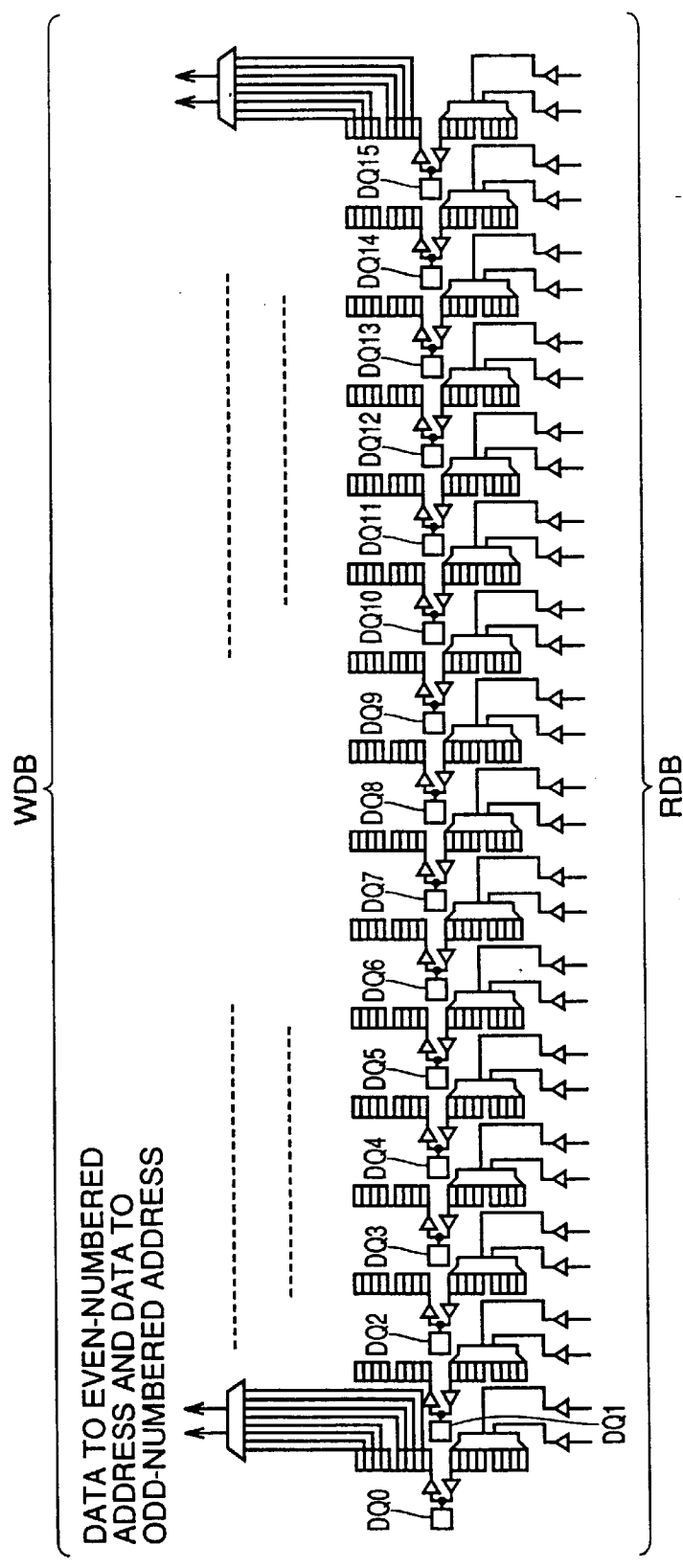
FIG. 7 is a schematic illustration of the structure of data input/output terminals DQ0 to DQ15.

FIG. 7 shows a schematic structure of the portion corresponding to data input/output terminals DQ0 to DQ15.

Referring to FIG. 7, data input/output terminals DQ0 to DQ15 are arranged side by side successively, and input/output circuits each including a latch are provided corresponding thereto. A read data bus RDB and a write data bus WDB are connected to the input/output circuit. The read data bus and the write data bus may be a common bus.

Though not shown, input/output circuits are similarly provided for data input/output terminals DQ16 to DQ31.

Figure 8:
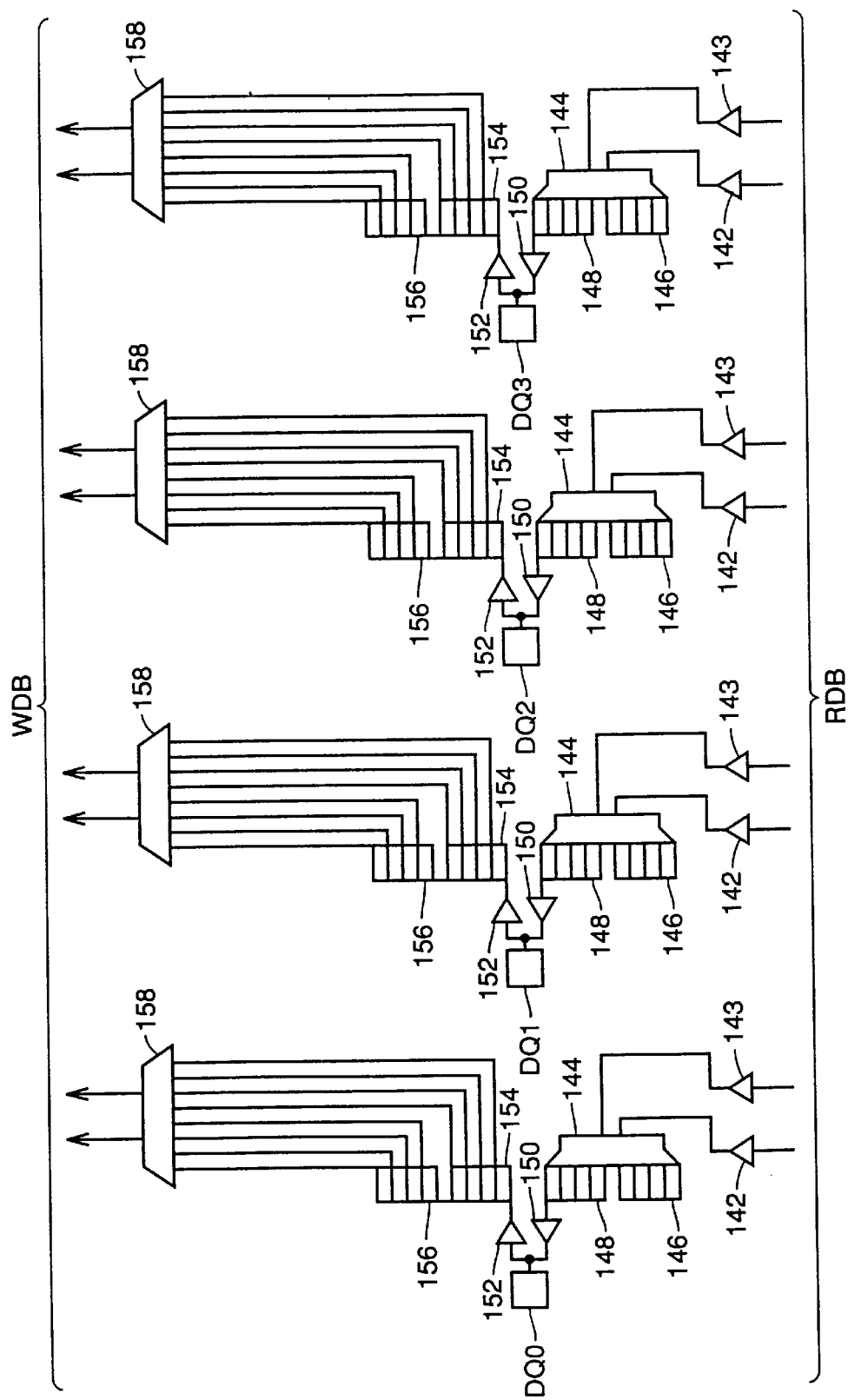
FIG. 8 shows, in enlargement, a portion corresponding to data input/output terminals DQ0 to DQ3 shown in FIG. 7.

FIG. 8 is an enlarged view of the portion corresponding to data input/output terminals DQ0 to DQ3 shown in FIG. 7.

Referring to FIG. 8, the input/output circuit provided for the data terminal includes: receivers 142 and 143 receiving data from the read data bus RDB; a multiplexer, 144 receiving data from receivers 142 and 143 for allocating data dependent on which of the data from the receivers is to be output first; a latch 148 corresponding to 4 data, receiving data from multiplexer 144 and outputting data at an odd-numbered clock edge after a CAS latency; a latch 146 for 4 data receiving data from multiplexer 144 and outputting the data at an even-numbered clock edge after the CAS latency; and an output buffer 150 amplifying and outputting to a terminal the data provided from latches 148 and 146.

The input/output circuit further includes: an input buffer 152 for amplifying data externally applied to input/output terminal DQ0; a latch 156 for 4 data latching the data output from input buffer 152 at a icing edge of the clock; a latch 154 for 4 data taking the data output from input buffer 152 at a falling edge of the clock; and a multiplexer 158 for distributing data either to a data bus for even-numbered address or to a data bus for odd-numbered address, in accordance with the address when the data taken in the latches 154 and 156 for the input data are to be transmitted internally. An output from multiplexer 158 is connected to a write data bus WDB including a write data bus for the even-numbered address and a write data bus for an odd-numbered address.

Figure 9:
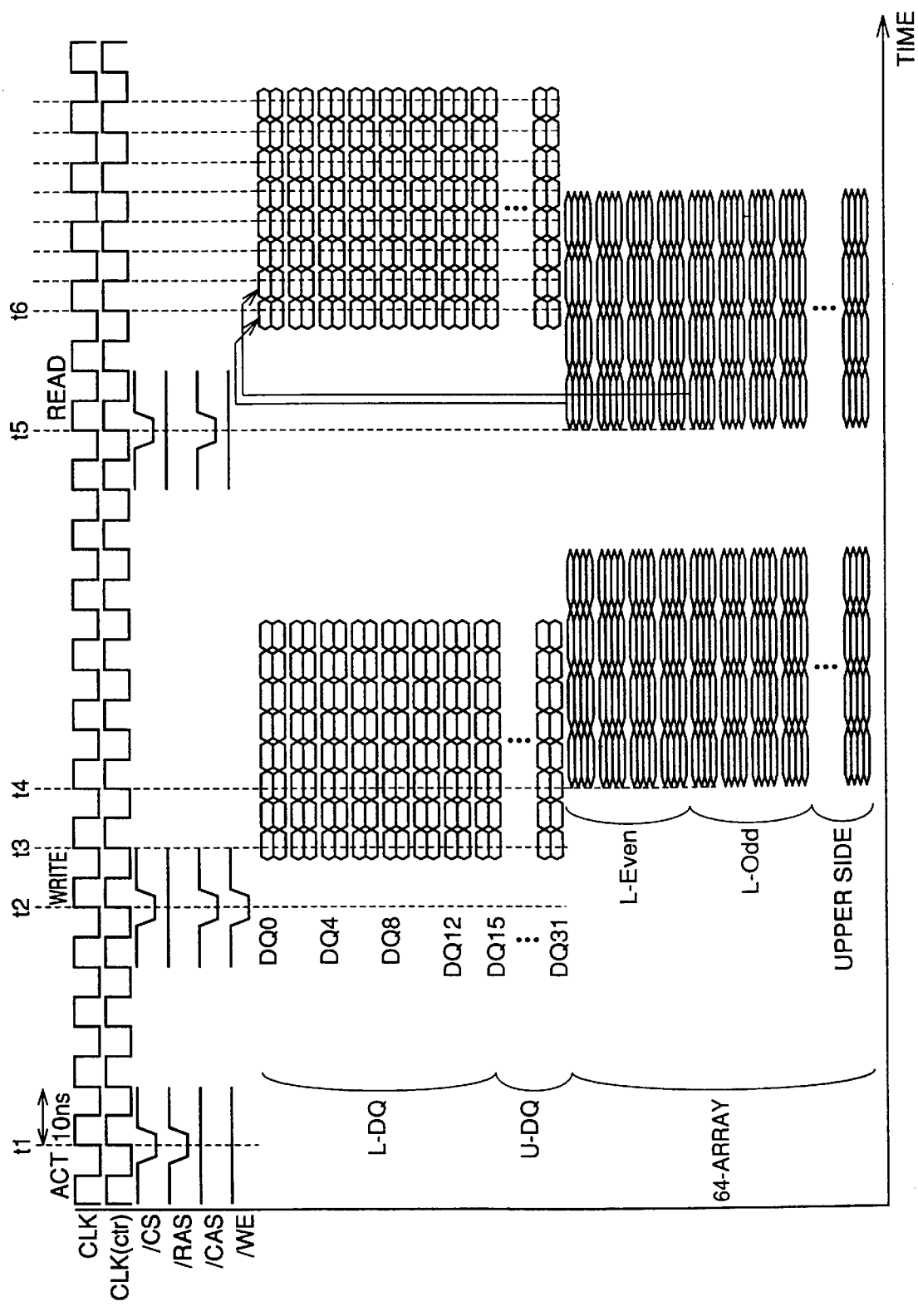
FIG. 9 is a schematic illustration of data exchange to and from synchronous semiconductor memory device 1000 through input/output circuit portion.

FIG. 9 is a schematic illustration showing data exchange with synchronous semiconductor memory device 1000 through the input/output circuit portion.

Referring to FIG.9, the signal CLK is an externally applied dock signal, the signal CLK (ctr) in an internal clock generated internally based on the clock signal CLK and serving as a reference for memory array operation, and the signals /CS, /RAS, /CAS and /WE are control signals used by the synchronous semiconductor memory device 1000 to recognize commands.

The signal L-DQ is a data signal input/output to and from the lower bit side of the data terminals, that is, data terminals DQ0 to DQ 15, while the signal U-DQ is a data signal input/output to and from the upper bits of the data terminals, that is, data terminals DQ16 to DQ31.

A signal 64-ARRAY represents a signal on a data bus for inputting/outputting date between the input/output circuit portion and the internal memory array. Here, a signal L-Even represents data from an area corresponding to even-numbered address of the lower bit side of data, while a signal LOdd represent data from an area corresponding to an odd-numbered address on the lower bit side of the data.

At time t1, an active command (ACT) is input and, at time t2, a write command (WRITE) is input.

After the time point t3, continuous data having the burst length of 8 are input at a data rate twice that of the clock CLK, to data terminals DQ0 to DQ31.

At a rising edge at time t3 and at the following falling edge of the clock, 2 data are taken to the input/output circuit, and after t4, successively output to the memory array. At this time, the data externally input by 32 bits are converted to the data having twice the bit number, that is, 64 bits, with the frequency reduced to one half, and 64 bits of data are written at a time to the memory array. More specifically, the data of 32 bits with the burst length of 8 are converted to 4 data of 64 bits synchronized with internal clock CLK (ctr) and written to the internal memory array.

At time t5, a read command READ is input, 64 bits of data are read simultaneously from the internal memory array, and from time point t6, data of 32 bits with double data rate are externally output from the semiconductor memory device.

Figure 10:
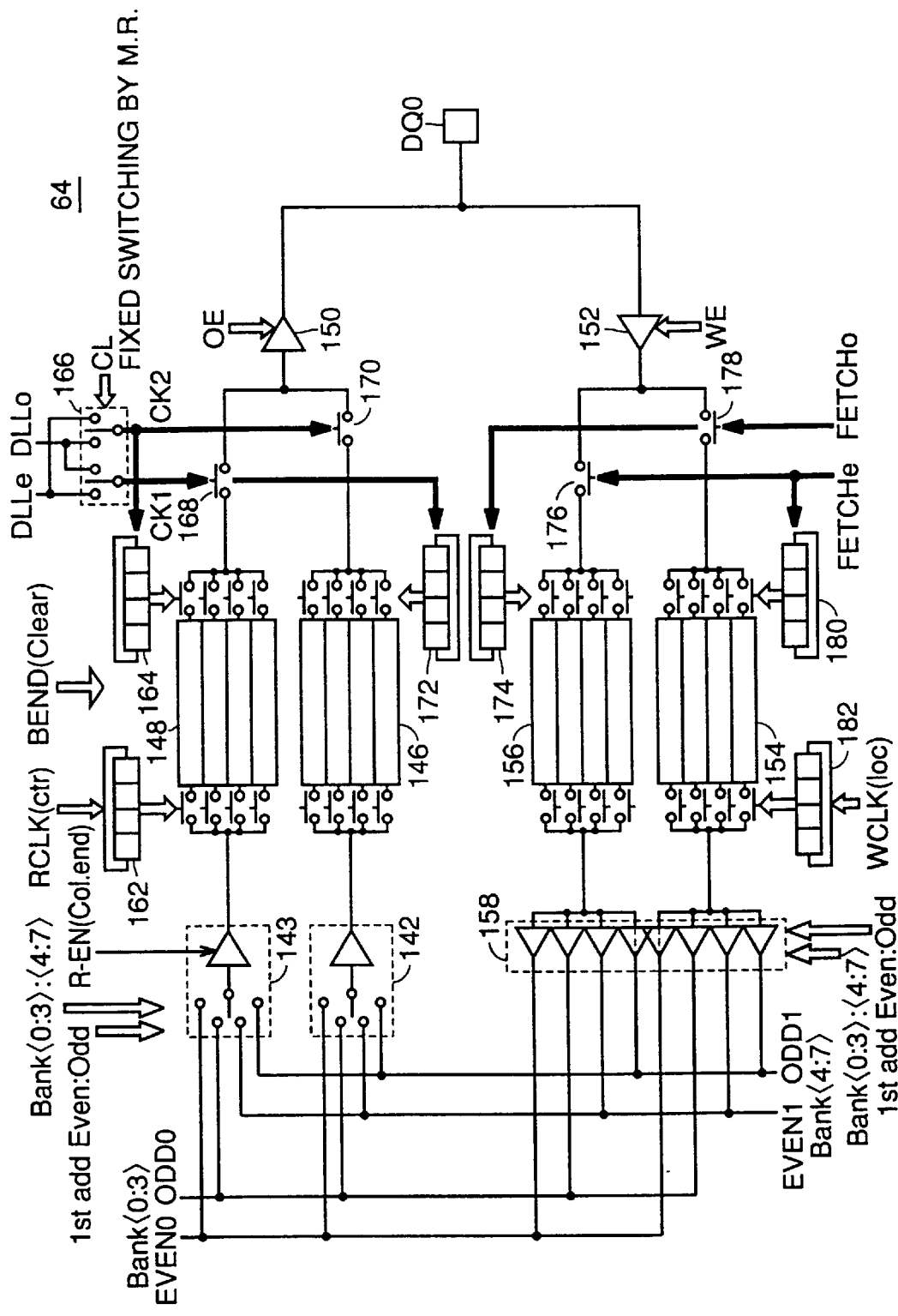
FIG. 10 is a circuit diagram showing a structure of an input/output circuit 64 used in the first embodiment.

FIG. 10 is a circuit diagram showing a structure of input/output circuit 64 used in the first embodiment.

Referring to FIG. 10, an address bus EVEN0 is a data bus connected to an even-numbered address area of banks 0 to 3, and an address bus ODD0 is a data bus connected to the odd-numbered address area of banks 0 to 3. An address bus EVEN1 is a data bus connected to the even-numbered address area of banks 4 to 7, and an address bus ODD1 is a data bus connected to the odd-numbered address area of banks 4 to 7

Input/output circuit 64 includes: receivers 142 and 143 for selecting one of address buses EVEN0, ODD0, EVEN1 and ODD1 in accordance with the selected bank and dependent on whether the address corresponding to the first data to be output is an even-numbered address or an odd-numbered address, for outputting data transmitted through the address bus in response to a receiver activating signal R-EN; a shift register 162 performing shifting operation at the read clock RCLK (ctr) and outputting a select signal; and latches 146 and 148 for taking data output from receivers 142 and 143 in accordance with the select signal output from shift register 162.

Input/output circuit 64 further includes: a switch 166 receiving skipped clocks DLLe and DLLo generated based on the clock DLL generated by the DLL circuit, and transmitting these clocks as clocks CK1 and CK2 for data output to the inside of the input/output circuit in accordance with CAS latency and mode resistance setting; a shift register 164 for shifting data in response to output clock CK2; and a shift register 172 for shifting data in response to output dock CK1. Latches 146 and 148 select and output data latched in accordance with the outputs from shift registers 172 and 164, respectively.

Input/output circuit 64 further includes an output buffer 150 activated by an enable signal OE for outputting data to terminal DQ0; a switch 168 responsive to activation of output dock CK1 for applying an output of latch 148 to output buffer 150; and a switch 170 responsive to activation of output clock CK2 for applying an output from latch 146 to output buffer 150.

The input/output circuit 64 further includes; an input buffer 152 for receiving as input and amplifying the data externally input to terminal DQ0 in response to the enable signal WE; switches 176 and 178 for internally transmitting an output from input buffer 152 in response to signals FETCHe and FETCHo generated internally in response to an externally input strobe signals; a shift register 174 receiving the signal FETCHo as a shift clock and outputting a select signal; a shift register 180 receiving the signal FETCHe as a shift clock and outputting a select signal; a latch 156 responsive to the select signal output from shift register 174 for taking the signal transmitted through switch 176; and a latch 154 responsive to the select signal output from shift register 180 for taking the signal transmitted through switch 178.

Input/output circuit 64 further includes: a shift register 182 receiving write clock WCLK (loc) as a shift clock and outputting a select signal; and a bus driver 158 for receiving data output from latches 154 and 156 in response to the select signal output from shift register 182. Bus driver 158 distributes and outputs data to data buses EVEN0, ODD0, EVEN1 and ODD1 dependent on whether the address (first address) to which the data received for the first time from the outside is an even-numbered address or an odd-numbered address, and dependent on the bank where the received data is to be written.

The operation will be briefly described. Any of the data coming from the even-numbered address area and odd-number address area of banks 0 to 3, and data coming from even-numbered address area and odd-numbered address are of banks 4 to 7 is classified at a four points switch provided at the input portion of receivers 142 and 143, and taken in.

Here, a signal for distinguishing upper/lower banks, and a signal indicating whether the first address at the time of burst reading is an even-numbered address or an odd-numbered address are input. The path having receiver 143, latch 148 and switch 168 is for the data output first, while the path having receiver 142, latch 146 and switch 170 is for the data output secondly. Data which has passed through the switch of input portions of receivers 143 and 142 is amplified by the amplifier, and transferred to the selector portion in the input portion of latches 148 and 146. The selector selects one of the four paths included in the latch. Selection of the path is successively shifted in response to the internal clock RCLK (ctr) for reading applied to shift register 162 which receives the select signal at the latch, and the input data are latched successively.

The data stored in the latch is output using, as a reference, a clock different from the clock used when the data is input to the latch. Selection path on the output side of the latch is shifted successively, in accordance with select signals output from shift registers 164 and 172 which perform shifting operation in response to output side clocks DLLe and DLLo. Among the output data, the data to be output at odd-numbered times (first, third, . . . ) are stored in latch 148, while data to be output at even-numbered times (second, fourth, . . . ) are stored in latch 146. Therefore, dependent on the latency from the read clock RCLK (ctr) at which the read command is recognized until external output of the data, which of the clocks DLLe and DLLo is to be input as a control signal to switch 168 is determined, and the other one of the docks is input as a control signal to switch 170. For example, if the latency is 1.5, the dock DLLo is input as a control signal to switch 168, and clock DLLe is input as a control signal to switch 170.

At the time of writing, the data externally input first is unconditionally transferred to latch 156, the data input next is unconditionally transferred to latch 154, and thereafter, data are transferred alternately to latches 156 and 154.

The latched data is transmitted to bus driver 158 in response to an internal dock WCLK (loc) for writing. Bus driver 158 outputs, in response to a bank address and a first address of the burst data, data to the corresponding data bus.

Though a circuit structure for the input/output circuit has been described with reference to FIG. 10, the same circuit may be used and operated with the same margin only for the data input portion used as a data mask at the time of writing. In that case, the circuit is necessary on the data input side only. However, in order to attain balanced capacitance, a circuit may be arranged as a dummy, though not actually operated, on the output side.

The same applies to the strobe terminal related to data output. In that case, the circuit is necessary on the data output side only. However, in order to attain balanced capacitance, a circuit for the input system may be arranged as a dummy, though it is not actually operated.

Further, the circuit structure for the data mask and the strobe may be shared. One same bus may be used for the strobe signal corresponding to the output data and the input of the write mask data, if there is not a possibility of collision. In that case, the same circuit structure as the input/output circuit used for the data input/output terminal DQ may be used, with the circuit for the output data strobe allotted on the output side, and the circuit for the write mask data allotted on the input side.

Figure 11:
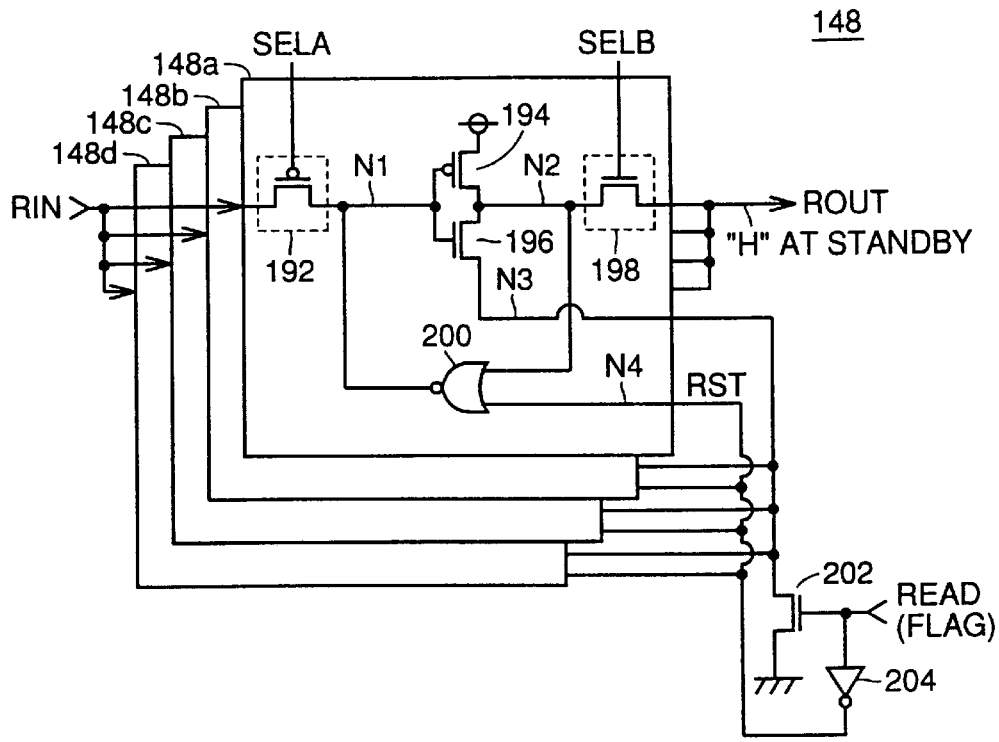
FIG. 11 is a circuit diagram showing a structure of a latch 148 for holding data at a time of reading shown in FIG. 10.

FIG. 11 is a circuit diagram showing a structure of a latch 148 holding data at the time of reading, shown in FIG. 10.

Referring to FIG. 11, latch 148 includes four latches 148a to 148d receiving, taking and holding data RIN read from the memory array, and outputting the signal as an output signal ROUT. Latch 148a includes: a P channel MOS transistor 192 for applying the input signal RIN to an internal node N1 in response to activation of a selection signal SELA; a P channel MOS transistor 194 having its source coupled to the power supply potential, its gate connected to node N1 and its drain connected to a node N2; an N channel MOS transistor 196 having its gate connected to node N1, its source connected to a node N3 and its drain connected to node N2; an N channel MOS transistor 198 for applying the potential at node N2 as the output signal ROUT to the outside of the latch, in response to activation of a select signal SELB; and an NOR circuit 200 having its input connected to nodes N2 and N4 and its output connected to node N1.

Latches 148b, 148c and 148d have the same structure as that of 148a, and therefore, description thereof is not repeated.

Latch 148 further includes an N channel MOS transistor 202 provided commonly to latches 148a 148d, for coupling node N3 to the ground potential in response to activation of a read flag READ (FLAG), and an inverter 204 for inverting read flag READ (LAG) when it is inactive to provide a reset signal and applying the reset signal to node N4.

Transistors having low threshold voltages are used as transistors 194 and 196 used in the latch, as the transistors are operated at high speed with low voltage, while a transistor having high threshold voltage is used as N channel MOS transistor 202 in order to suppress subthreshold current flowing to transistors 194 and 196 when reading operation is not performed.

Latch 146 shown in FIG. 10 has the same structure latch 140, and therefore description thereof is not repeated.

Figure 12:
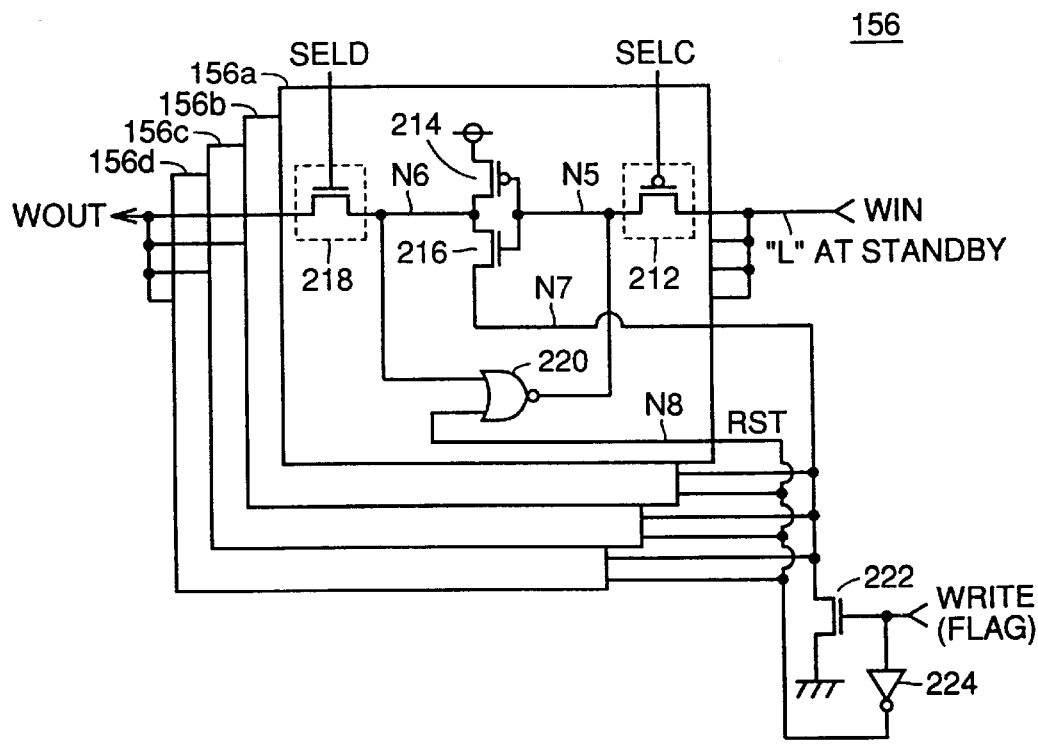
FIG. 12 is a circuit diagram showing a structure of a latch circuit 156 holding data at the time of date writing shown in FIG. 10.

FIG. 12 is a circuit diagram showing a structure of a latch circuit 156 holding data at the time of data writing, shown in FIG. 10.

Referring to FIG. 12, latch circuit 156 includes four latches 156a to 156d receiving and holding data signal WIN input to the data terminal and outputting the signal as output signal WOUT to the memory array.

Latch 156a includes; a P channel MOS transistor 212 for applying the input signal WIN to a node N5 in response to activation of a selection signal SELC; a P channel MOS transistor 214 having its gate connected to node N5, its source coupled to a power supply potential and its drain connected to a node N6; an N channel MOS transistor 216 having its gate connected to node N5 and its drain and source connected to nodes N6 and N7, respectively; and an N channel MOB transistor 218 for applying the potential at node N6 as the output signal WOUT in response to activation of a selection signal SELD. Latch 156a further includes an NOR circuit 220 having its input connected to nodes N6 and N8 and its output connected to node N5.

Latches 156b, 156c and 156d have the same structure as latch 156a, and therefore description thereof is not repeated.

latch 156 further includes an N channel MOS transistor 222 provided commonly to latches 156a to 156d and coupling node N7 to the ground potential in response to activation of a write flag WRITE (FLAG), and an inverter 224 for inverting the write flag WRITE (FLAG) when it is inactive and applying it as a reset signal to node N8.

Transistors having low threshold voltages are used as transistors 214 and 216 used in the latch, as the transistors are operated at high speed with low voltage, while a transistor having high threshold voltage is used as N channel MOS transistor 222 in order to suppress subthreshold current flowing through transistors 214 and 216 when writing operation is not performed.

Latch 154 shown in FIG. 10 has the same structure as latch 156, and therefore description is not repeated.

Referring to FIGS. 11 and 12, when latches 148 and 156 are not operated by the reset signal, the input side of the latch is reset to the L level and the output side is reset to the H level. Therefore, MOS transistors used as the transfer gates are adapted to have different conductivity types.

A transistor having low threshold value is used as the MOS transistor for the transfer gate, in order to increase the speed of operation. As the input node is set to the L level, a P channel transistor is used on the input side of the latch, while an N channel transistor is used for the output side as the output node is set to the H level. At this time, the gate potential with respect to the node potential of the latch at the time of standby, that is, gate-to-source voltage attains negative, and therefore generation of a leakage current is suppressed, though the transistors have low threshold values (though not shown, the input node and the output node at the time tie of reset are controlled by the preceding and succeeding circuit portions).

As described above, as the latch is reset at the end of burst operation in reading and writing of data, and by the N channel MOS transistor having high threshold voltage provided commonly on the ground side of the inverter portion separating the inverter from the ground potential, subthreshold current in the standby state can be suppressed.

Though an example in which the input node of the inverter is reset to the L (low) level by the NOR circuit has been described with reference to FIGS. 11 and 12, it may be reset to the H (high) level. In that case, a P channel MOS transistor having large absolute value of the threshold voltage is provided on the power supply node side of the inverter, and conductivity type of MOS transistors in the transfer gates for inputting/output data to and from the latch are selected in accordance with the reset logic.

Figure 13:
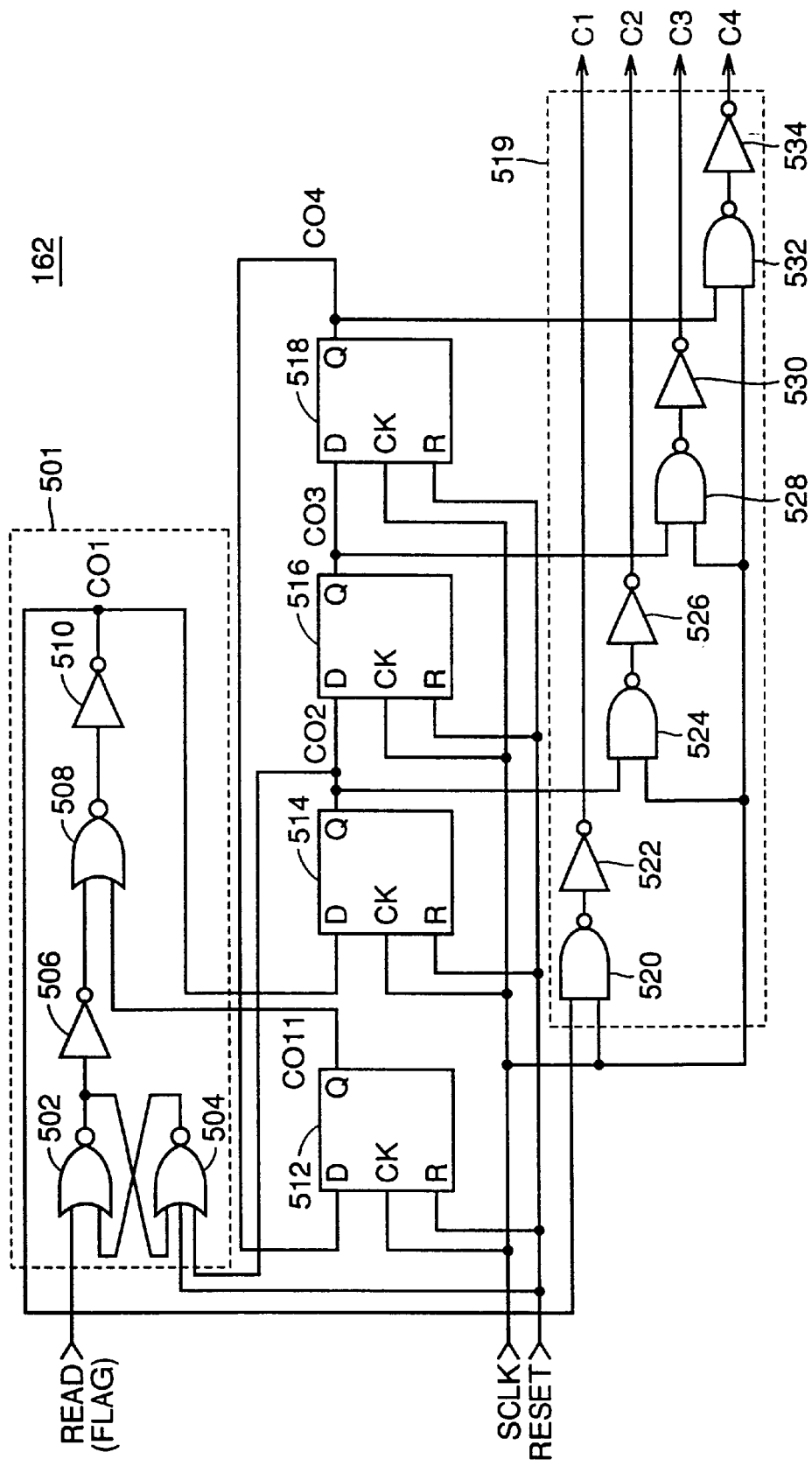
FIG. 13 is a circuit diagram showing a structure of a shift register 162 shown in FIG. 10.

FIG. 13 is a circuit diagram showing a structure of shift register 162 shown in FIG. 10.

Referring to FIG. 13, shift register 162 includes: a pulse generating circuit 501 receiving a read flag READ (FLAG), reset signal RESET, an internal signal CO2 and an internal signal CO11 and generating an internal signal CO1; a flip-flop 514 receiving internal signal CO1 at an input node D and outputting internal signal CO2 from an output node Q; a flip-flop 516 receiving internal signal CO2 at an input node D and outputting an internal signal CO3 from an output node Q; a flip-flop 518 receiving internal signal CO3 at an input node D and outputting an internal signal CO4 from an output node Q; a flip-flop 512 receiving internal signal CO4 at an input node D and outputting internal signal CO11 from an output node Q; and an output circuit 519 receiving internal signals CO1, CO2, CO3 and CO4 as well as a clock signal SCLK and outputting select signals C1, C2, C3 and C4.

Clock signal SCLK is input as a shift clock to clock nodes CK and the reset signal RESET is input to reset input nodes R, of flip-flops 512, 514, 516 and 518.

Pulse generating circuit 501 includes: an NOR circuit 502 receiving at one input the read flag READ (TLAG); a 3-input NOR circuit 504 receiving at inputs an output from NOR circuit 502, the reset signal RESET and the internal signal CO2 and outputting an NOR to the other input node of NOR circuit 502; an inverter 506 receiving and inverting an output of NOR circuit 502; an NOR circuit 508 receiving an output of inverter 506 and the internal signal CO11; and an inverter 510 receiving and inverting an output of NOR circuit 508 to provide internal signal CO1.

Output circuit 519 includes: an NAND circuit 520 receiving internal signal CO1 and clock signal SCLK; an inverter 522 receiving and inverting an output of NAND circuit 520 and providing select signal C1; an NAND circuit 524 receiving internal signal CO2 and clock signal SCLK; an inverter 526 receiving and inverting an output of NAND circuit 524 and providing select signal C2; an NAND circuit 528 receiving internal signal CO3 and clock signal SCLK; an inverter 530 receiving and inverting an output of NAND circuit 528 and providing select signal C3; an NAND circuit 532 receiving internal signal CO4 and clock signal SCLK; and an inverter 534 receiving and inverting an output of NAND circuit 532 and providing select signal C4.

Figure 14:
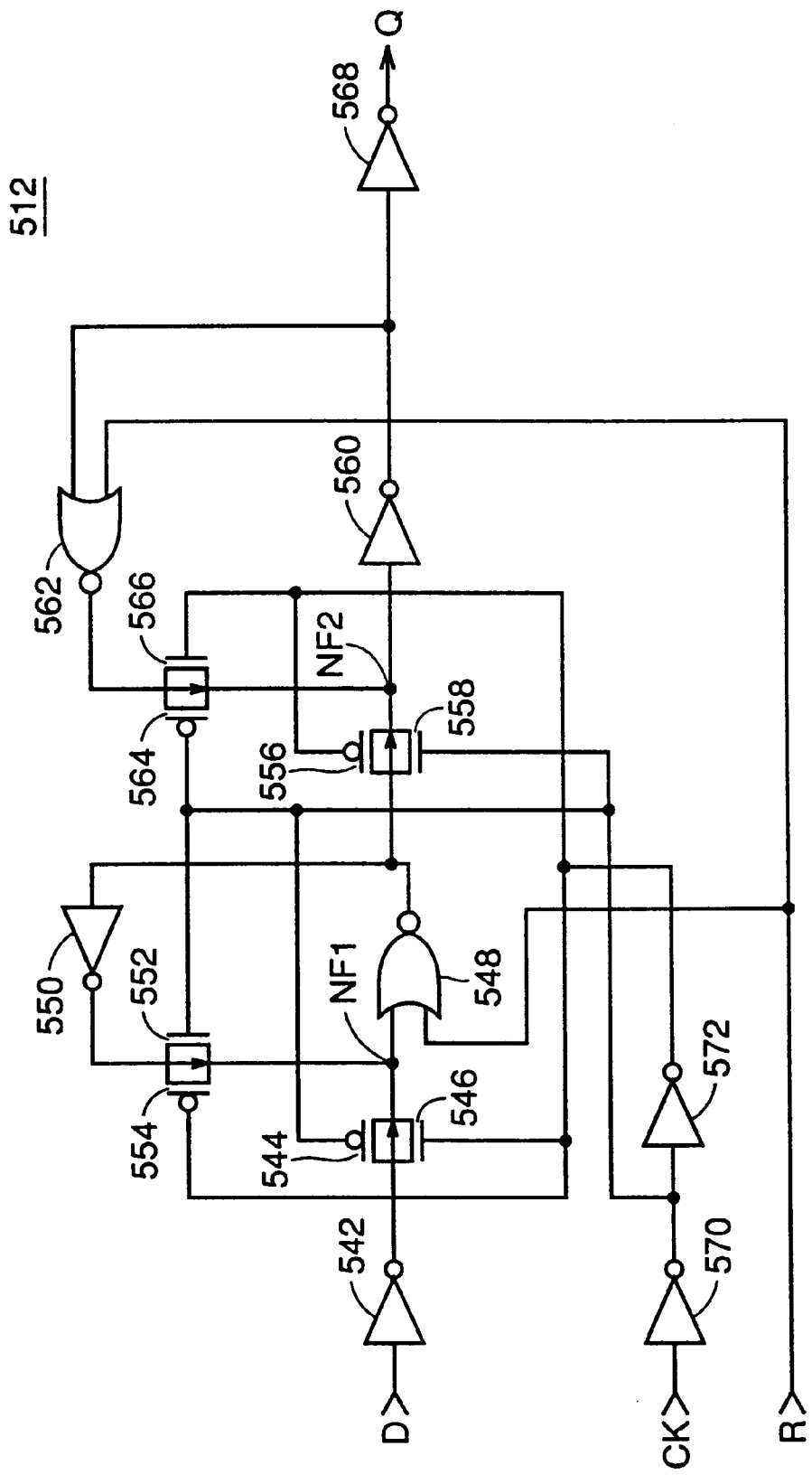
FIG. 14 is a circuit diagram showing a structure of a flip-flop 512 shown in FIG. 13.

FIG. 14 is a circuit diagram showing a structure of flip-flop 512 shown in FIG. 13.

Referring to FIG. 14, flip-flop 512 includes: an inverter 570 having its input connected to a clock node CK; an inverter 572 receiving and inverting an output of inverter 570; an inverter 542 having its input connected to an input node D; a P channel MOS transistor 544 and an N channel MOS transistor 546 connected in parallel between an output node of inverter 542 and a node NF1; an NOR circuit 548 having its inputs connected to node NF1 and to a reset input node R; an inverter 550 receiving and inverting an output of NOR circuit 548; and a P channel MOS transistor 554 and an N channel MOS transistor 552 connected in parallel between an output node of inverter 550 and node NF1.

The gates of P channel MOS transistor 544 and N channel MOS transistor 552 receive an output of inverter 570. The gates of N channel MOS transistor 546 and P channel MOS transistor 554 receive an output of inverter 572.

Flip-flop 512 further includes: a P channel MOS transistor 556 and an N channel MOS transistor 558 connected in parallel between an output node of NOR circuit 548 and node NF2; an inverter 560 having its input connected to node NF2; an NOR circuit 562 having its inputs connected to an output node of inverter 560 and reset input node R; a P channel MOS transistor 564 and an N channel MOS transistor 566 connected in parallel between an output node of NOR circuit 562 and node NF2; and an inverter 568 receiving and inverting an output of inverter 560 and providing result of inversion to output node Q.

The gates of P channel MOS transistor 556 and N channel MOS transistor 566 receive an output of inverter 572. The gates of N channel MOS transistor 558 and P channel MOS transistor 564 both receive an output of inverter 570.

Flip-flops 514, 516 and 518 shown in FIG. 13 have the similar structure as flip-flop 512. Therefore, description thereof is not repeated.

The operation of shift register 162 will be described briefly in the following.

First, in the initial state, by reset signal RESET, data held by flip-flops 512 to 518 are cleared. When the read flag READ (FLAG) is input, internal signal CO1 rises to the H level.

When the clock signal SCLK is input, the internal signal CO1 is taken in flip-flop 514, and internal signal CO2 rises to the H level. At the same time, pulse generating circuit 501 is reset by internal signal CO2, and internal signal CO1 falls to the L level. Thereafter, the internal signal CO2 which is at the H level is successively transmitted through Slip-flops 516, 518, 512 and 514. More specifically, one of internal signals CO1, CO2, CO3 and CO4 is at the H level, and the signal which is at the H level is successively shifted in synchronization with the edge of clock signal SCLK.

Internal signals CO1, CO2, CO3 and CO4 are pulses having the width of 1 clock period. Therefore, when ANDed with the clock signal by output circuit 519, a signal having the pulse width of clock signal SCLK is output as select signals C1, C2, C3 and C4. This signal is shifted successively.

Shift registers 164, 172, 174, 182 and 180 shown in FIG. 10 have the similar structure as shift register 162. Therefore, description is not repeated.

Figure 15:
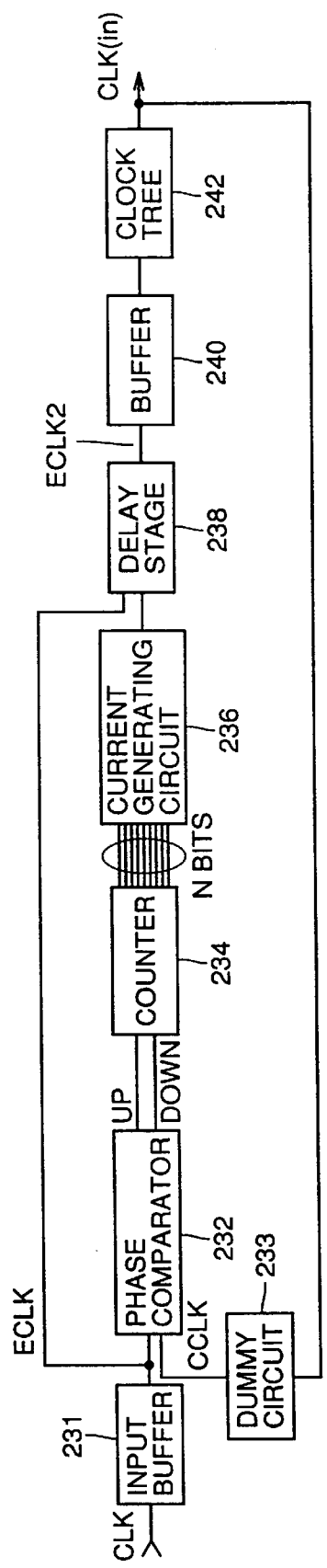
FIG. 15 is a block diagram showing a structure of a DLL circuit 30 shown in FIG. 1.

FIG. 15 is a block diagram showing a structure of DLL circuit 30 shown in FIG. 1.

Referring to FIG. 15, DLL circuit 30 includes: an input buffer 231 receiving an external clock CLK and outputting a clock ECLK; a dummy circuit 233 receiving an internal clock CLK (in) and outputting a clock CCLK; a phase comparator 232 comparing phases of clocks CCLK and ECLK; a counter 234 receiving and counting up/down the control signal UP/DOWN from phase comparator 232; a current generating circuit 236 for generating current in accordance with a count value output from counter 234; a delay stage 238 delaying clock ECLK by an amount of delay corresponding to an amount of current generated by current generating circuit 236 and outputting the resulting signal as clock ECLK2; a buffer 240 amplifying clock ECLK2; and a clock tree 242 for distributing an output of buffer 240 as internal clock CLK (in) to circuits inside the synchronous semiconductor memory device.

Though not shown, clock tree 242 supplies the clock to address terminal group taking data from the outside to the synchronous semiconductor memory device, external control input terminal group, data input/output terminal group and so on. The clock tree has its branches adapted such that the clocks supplied to various circuits have the same amount of delay.

Figure 16:
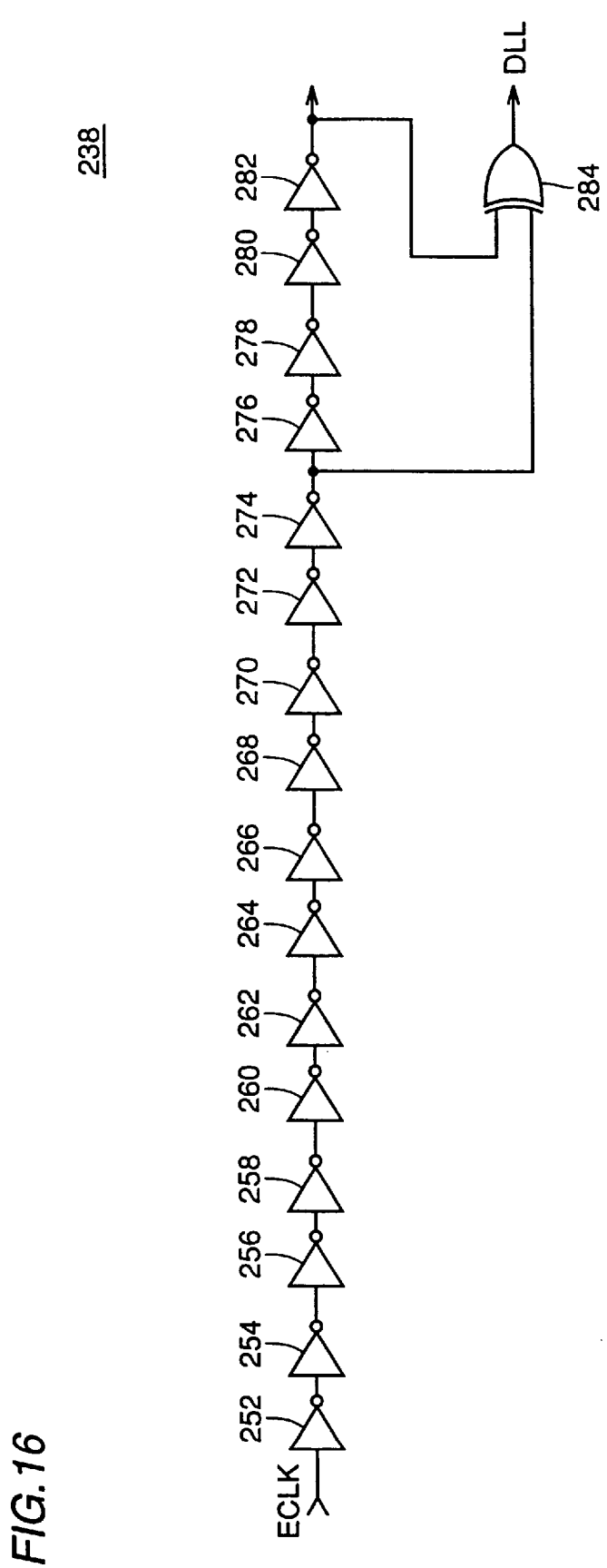
FIG. 16 is a circuit diagram showing the structure of a delay stage 298 shown in FIG. 15.

FIG. 16 is a circuit diagram showing a structure of delay stage 238 shown in FIG. 15.

Referring to FIG. 16, delay stage 238 includes inverters 252 to 274 connected in series and receiving clock ECLK, inverters 276 to 282 connected in series for receiving an output from inverter 274, and an EXOR circuit 284 receiving outputs from inverters 274 and 282. The output from inverter 282 is applied to buffer 240 of FIG. 15, and an output from EXOR circuit 284 is the clock DLL of which frequency is twice that of the external clock CLK.

Though a total of 16 inverters are shown in FIG. 16, the number of inverters may be increased/decreased as needed. These inverters are supplied with current from current generating circuit 236 of FIG. 15, and the amount of delay changes dependent on the supplied current value. For example, if the current value is small, the amount of delay is increased. EXOR circuit 284 compares clocks having the amounts of delay corresponding to one fourth that of the delay stage 238, and generates the clock DLL having the frequency twice that of the clock.

Figure 17:
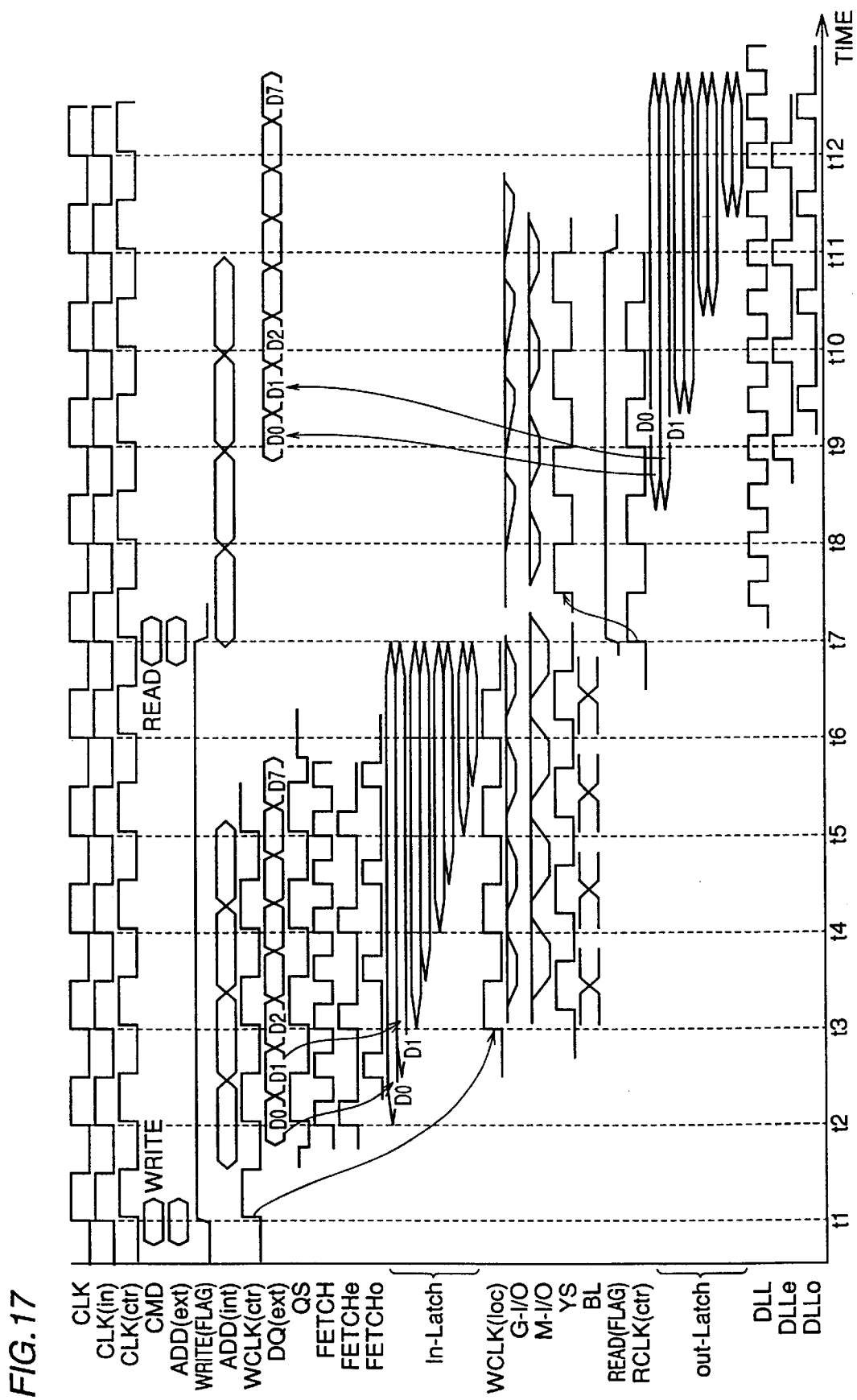
FIG. 17 is a diagram of operational waveforms illustrating detailed timings of operation of input/output circuit 64.

FIG. 17 is a diagram of operational waveforms related to detailed operational timings of the input/output circuit 64.

Referring to FIGS. 10 and 17, clock signal CLK is input from the outside of the chip, internal clock signal CLK (in) is a clock signal in phase with the external clock signal CLK, generated in the DLL circuit, and clock signal CLK (ctr) is a clock signal used as a reference for reading/writing from and to the internal memory array generated based on the external clock signal CLK.

At time t1, a write command is input. At the same time, write flag WRITE (LAG) rises from the L level to the H level.

At time t2, input of data DQ starts at a frequency twice the clock frequency, from the outside to the data terminal. At the same time, a strobe signal QS for taking in the data is also input. Based on the strobe signal QS, a signal FETCH is generated, and from this signal FETCH, selection signals FETCHe and FEYCHo for taking data to input latches 156 and 154 in FIG. 10 are generated.

Data DO and D1 taken in latched 156 and 154 at the input portion in the time period between t2 to t3 are, by 2 bits simultaneously, written to the memory cell through internal global I/O line G-I/O and master I/O line M-I/O on the memory array, in response to a clock signal WCLK (loc) for writing. Similarly, data D2 to D7 taken in latches 156 and 154 are also written to internal memory cells, 2 bits at a time, in the period between t4 to t7.

When a read command is input at time t7, read flag READ (FLAG) rises from the L level to the R level, and at the same time, data is read from the memory cell in response to a clock RCLK (ctr) for reading.

The data read in the period from t8 to t9 are written to data latches 148 and 146 for output, of the input/output circuit.

From t9 to t10, data is output to the outside at a frequency twice the clock frequency. The clock used at this time as a reference for output is the clock DLL generated in the chip based on the external clock CLK. Actually, the data are lead to the outside from data latches 148 and 146 of the input/output circuit 64 based on the clocks DLLe and DLLo generated based on the clock DLL.

In the similar manner, after the time point t10, data D2 to D7 are read to the latches of the input/output circuit portion from the internal memory cells successively and read to the outside of the chip.

AS described above, when data of one bank are to be read, data from an even-numbered address area and data from an odd-numbered address area are transmitted simultaneously to the input/output circuit portion. The data are transmitted to prescribed latches dependent on whether the bank is an upper or lower bank (whether the data is from a bank on an upper area or lower area of DQ terminal), and dependent on whether the data to be output first is from an even-numbered address or the odd-numbered address.

More specifically, of two data arriving simultaneously, the data to be output first is stored in that latch which outputs data first, and the data to be output next is stored in that latch which outputs the data later. With the data stored in this manner, the latches are accessed alternately, and thus continuous data corresponding to the burst length a output.

Because of this structure, before latching, the memory array and the like may be operated in synchronization with the internal clock, while the portion for outputting data may be operated based on the external clock. In other words, the inside operate independently to put the data into the latch based on the internal clock, while the outside can pick the data up based on the external clock. Therefore, even when the operational frequency is increased and the latency of external pickup increases with respect to internal data transfer, erroneous data pickup can be avoided. Further, even if the device is used with small latency and high frequency, the data input to the latch is output as it is, and erroneous data pickup is avoided.

Further, the data at the latch portion is reset after the end of operation, and therefore, by the present structure, sub-threshold current can be suppressed.

Second Embodiment

Figure 18:
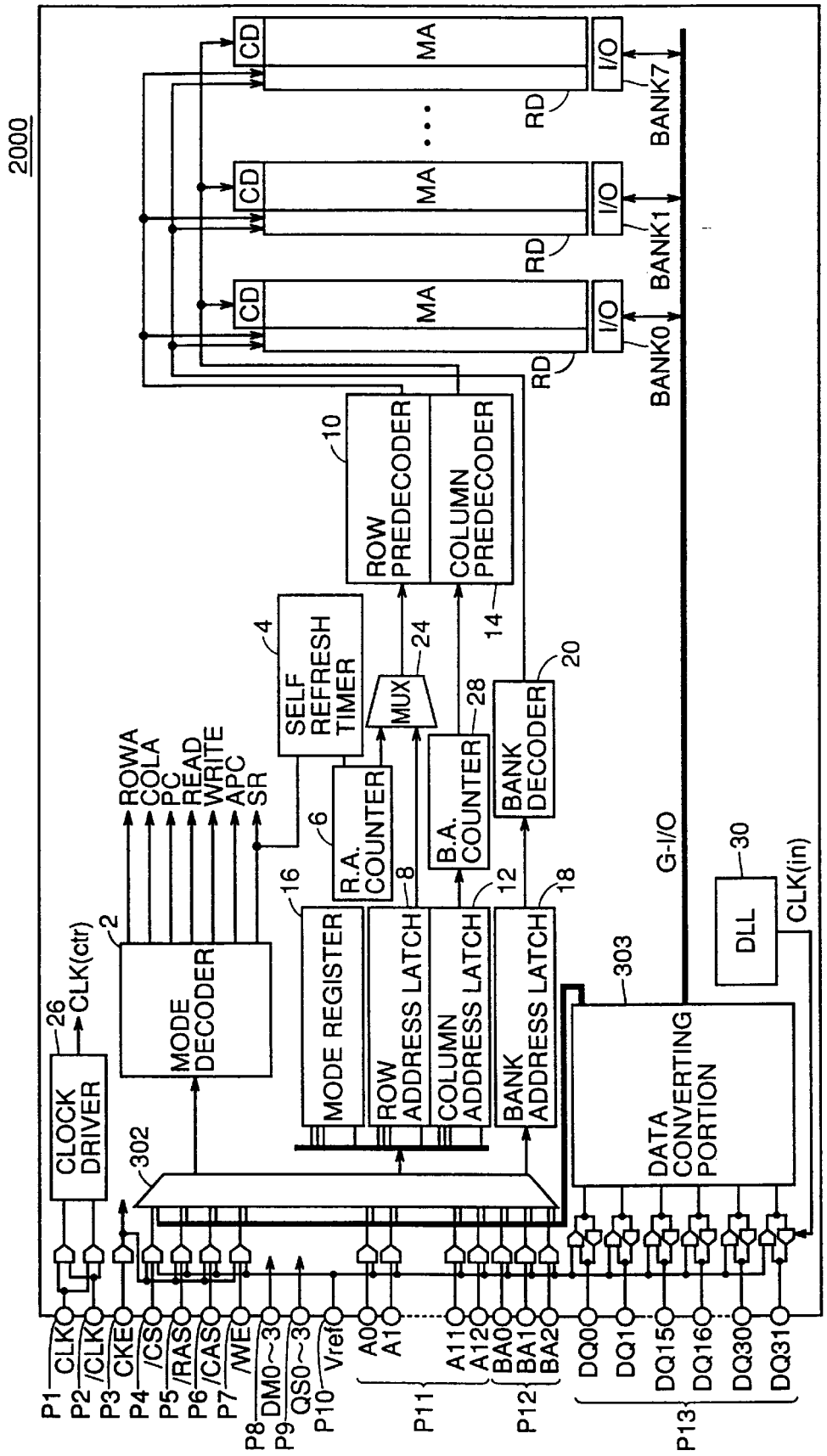
FIG. 18 is a block diagram showing a structure of a synchronous semiconductor memory device 2000 in accordance with a second embodiment.

FIG. 18 is a block diagram showing configuration of a synchronous semiconductor memory device 2000 in accordance with the second embodiment.

Referring to FIG. 18, synchronous semiconductor memory device 2000 differs from synchronous semiconductor memory device 1000 described in the fist embodiment in that a multiplexer 302 is newly provided, which multiplexes data input from data converting portion 303 where data from data input/output terminal P13 is latched with the data input from terminals P4 to P7 related to control and address terminal groups P11 and P12, and transmitting the result of multiplexing to an internal block.

Except this point, the structure is the same as synchronous semiconductor memory device 1000 described with reference to FIG. 1, and therefore, description thereof is not repeated.

19 is an illustration showing the structure of the input/output circuit at the data input/output terminal.

Figure 19:
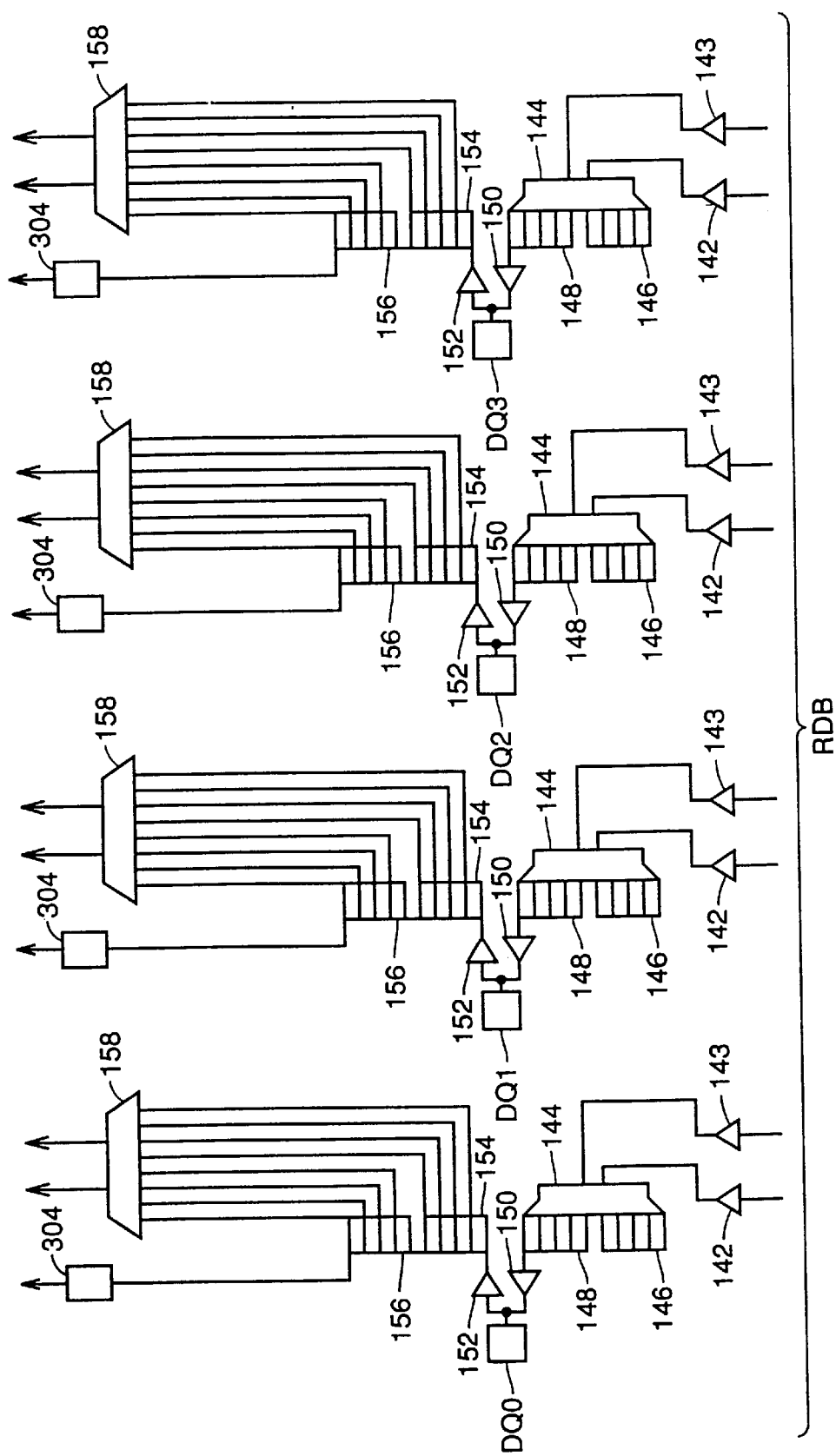
FIG. 19 is an illustration showing a structure of an input/output circuit of a data input/output terminal portion.

Referring to FIG. 19, the input/output circuit in accordance with the second embodiment includes, in addition to the structure of the input/output circuit in accordance with the first embodiment described with reference to FIG. 8, a port 304 for taking commands and addresses, receiving and taking data from input buffer 152 and transmitting the data as a command or an address data to multiplexer 302 of FIG. 18. Except this point, the structure is the same as that of the input/output circuit in accordance with the first embodiment described with reference to FIG. 8. Therefore, description thereof is not repeated.

Figure 20:
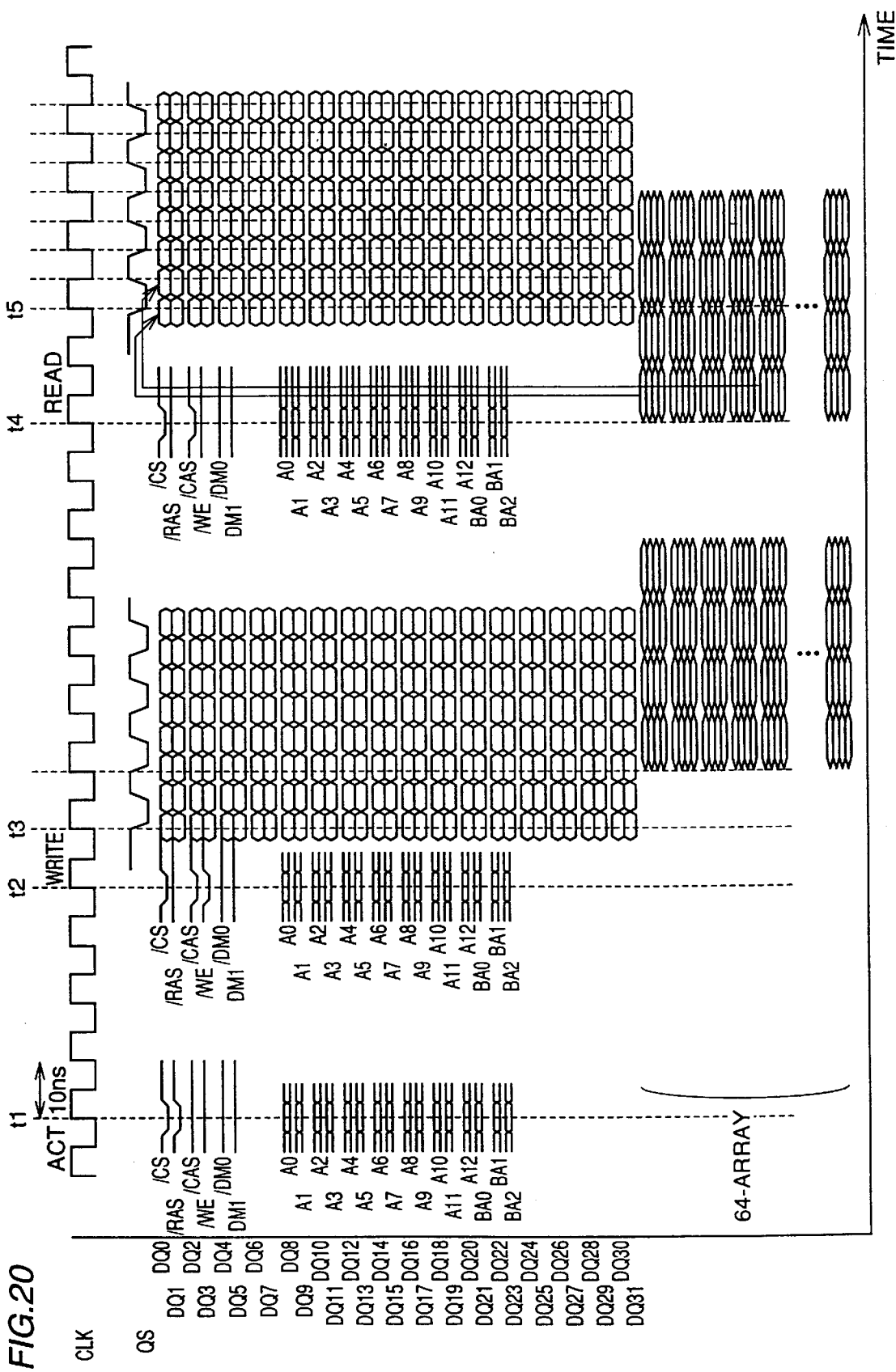
FIG. 20 is a diagram of waveforms representing operation of synchronous semiconductor memory device 2000 in accordance with the second embodiment at the time of a test.

FIG. 20 is a diagram of operational waveforms at the time of testing synchronous semiconductor memory device 2000 in accordance with the second embodiment.

Referring to FIG. 20, an active command is input to the chip at time t1. In normal operation, data corresponding to the command are input using control signal input terminals /CS, /RAS, /CAS, /WE, /DM0 and DM1 as well as address input terminals A0 to A12 and BA0 to BA2. In the synchronous semiconductor memory device 2000 in accordance with the second embodiment, data corresponding to the command are input using some of the data terminals DQ0 to DQ31 at the time of testing.

This is possible from the following reason. Data exchange is not performed at the data input/output terminals at the timing when the command is input in normal operation, and therefore the data input/output terminals are not used.

At time t2, address and data corresponding to a write command are input through the data terminals. From t3, data for writing are externally input at a double data rate from the data terminal. Data are taken at the falling and rising edges of the strobe signal QS and transferred to the internal memory alray.

At time t4, address and data corresponding to a read command are input through the data terminals, in response, data are read from the memory array, and after t5, read data are output to the outside at double data rate.

In this manner, the number of pins used at the time of testing can be reduced.

More specifically, except the terminals related to clocks and Vref terminal, other pins related to control are not used, and control command can be input time sequentially with the data through the data pins. Further, all addresses can be input through the data pins.

First Modification of the Second Embodiment

Figure 21:
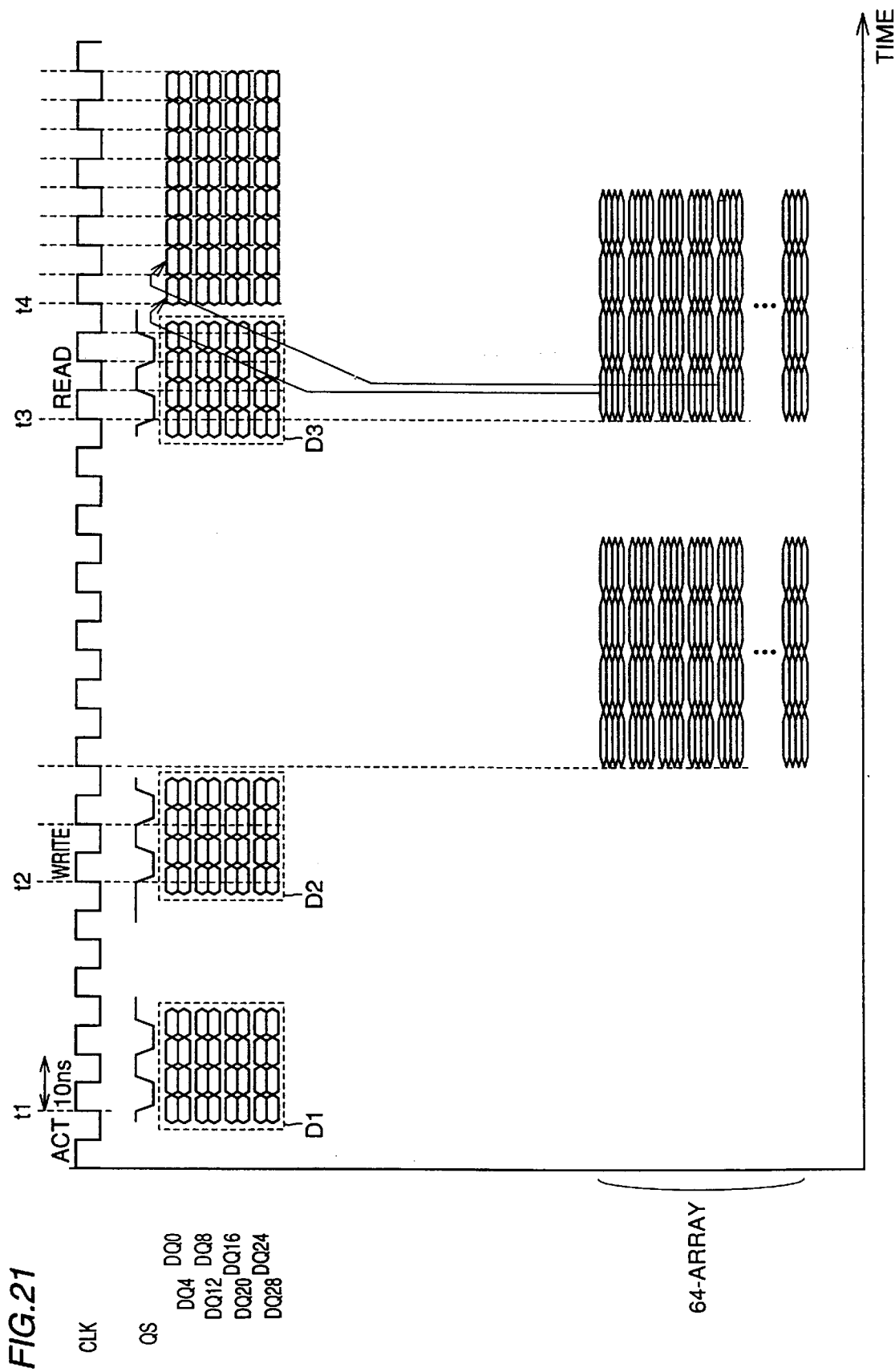
FIG. 21 is a diagram of waveforms representing an operation when the number of pins used for testing is further reduced.

FIG. 21 is a diagram of waveforms representing an operation when the number of pins used for testing is further reduced.

In the first modification of the second embodiment, only 8 pins of data input/output terminals are used for inputting commands, addresses and data. The data input/output terminals, control input/output terminals and address terminals which are not used are not connected to the test apparatus and kept open. Therefore, input buffers for the terminals not used at the time of testing are inactivated.

Generally, in the self refresh mode or in the power down mode, the data input/output terminal is inactivated as well. Different from such operation modes, when a test is performed, some of the data input/output terminals are kept active.

Referring to FIG. 21, at time t1, a data train D1 including an active command ACT is input from input/output terminals DQ0, DQ4, DQ8, DQ12, DQ16, DQ20, DQ24 and DQ28, and at the same time, a strobe signal QS for taking the data train is input.

At time t2, input of data train D2 representing a write command, an address and data is started, and data is written to internal memory array.

At time t3, a data train D3 including a read command and an address is input and, in response, data is read from the internal memory array. At time t4, output corresponding to the data read from the internal array is output from the input/output terminal.

When data trains D1, D2 and D3 are input, signals necessary for test operation are input by repeatedly taking 8 bits input in one cycle from 8 data terminals for several cycles. The timing of taking the data trains is recognized by using strobe signal QS. In FIG. 21, timing of taking is recognized by detecting an edge of strobe signal QS which makes a transition at every half clock of the external clock.

It should be noted, however, that there are many possible modifications. For example, the strobe signal QS may be maintained at the L level while the data trains are input, and the clock edge for that period may be recognized. In place of the strobe signal QS, an external clock may be used.

FIG. 22 is an illustration related to the contents of data trains D1, D2, and D3 of FIG. 21.

Referring to FIG. 22, in the first cycle #1, commands necessary for recognizing the operation are input.

More specifically, to data terminals DQ0, DQ4, DQ8, DQ12, DQ16, DQ20 and DQ24, command signals CKE, /CS, /RAS, /CAS, WE, DM0 and DM1 are input in the first cycle, respectively. Data input to data terminal DQ28 in the first cycle is neglected.

By decoding a series of bits input in the first cycle, the synchronous semiconductor memory device recognizes an operation.

In the second cycle #2, bank addresses and addresses are input. More specifically, in the second cycle, bank addresses BA0, BA1 and BA2 and address signals A12 to A8 are input. In the third cycle, address signals A7 to A0 are input. The address at this time corresponds to a row address if the commands are row related commands, and corresponds to the column address if the commands are column related commands.

In the fourth cycle #4, data DT0 to DT7 are input to data terminals. From the data of 8 bits, data corresponding to a burst length are generated. More specifically, when the burst length is 8, 8 (burst length)×32 (number of pins)=256 bits of data are generated. Generation of data is realized by decoding the input 8 bits. The signal CKE is held until the input state is reset next, as the state input in the previous input cycle is also used for command decoding as the command signal.

Figure 23:
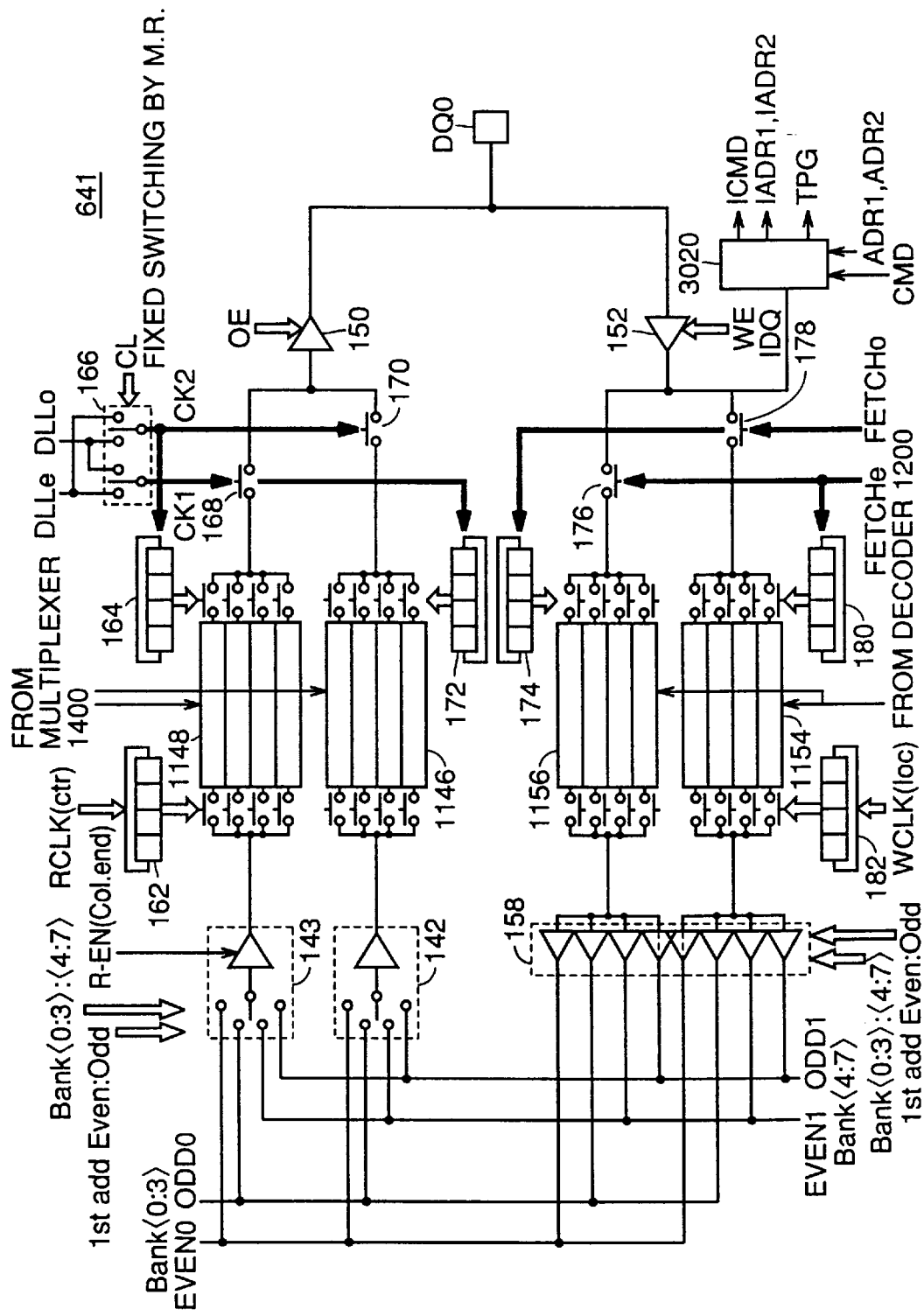
FIG. 23 is an illustration of an input/output circuit configuration at the data input/output terminal portion used for testing.

FIG. 23 is an illustration showing a structure of an input/output circuit at a data input/output terminal portion used at the time of testing.

Referring to FIG. 23, different from input/output circuit 64 described with reference to FIG. 10, an input circuit 641 includes a multiplexer 3020 receiving an output signal IDQ of buffer 152, a command signal CMD and address signals ADR1 and ADR2, and latches 1146, 1148, 1154 and 1156 in place of latches 146, 148, 194 and 156.

Multiplexer 3020 outputs a command signal ICMD to a mode register, address signals IADR1 and IADR2 to an address latch, and a signal TPG which is a base of a test pattern to decoder 1200. Latches 1146 and 1148 further include an input bus to which test results from multiplexer 1400 are written in a group, as will be described later, and further includes an input bus to which test patterns generated from a decoder 1200 are written in group, as will be described later.

Except these points, the structure is the same as that of input/output circuit 64 shown in FIG. 10. Therefore, description thereof is not repeated.

Figure 24:
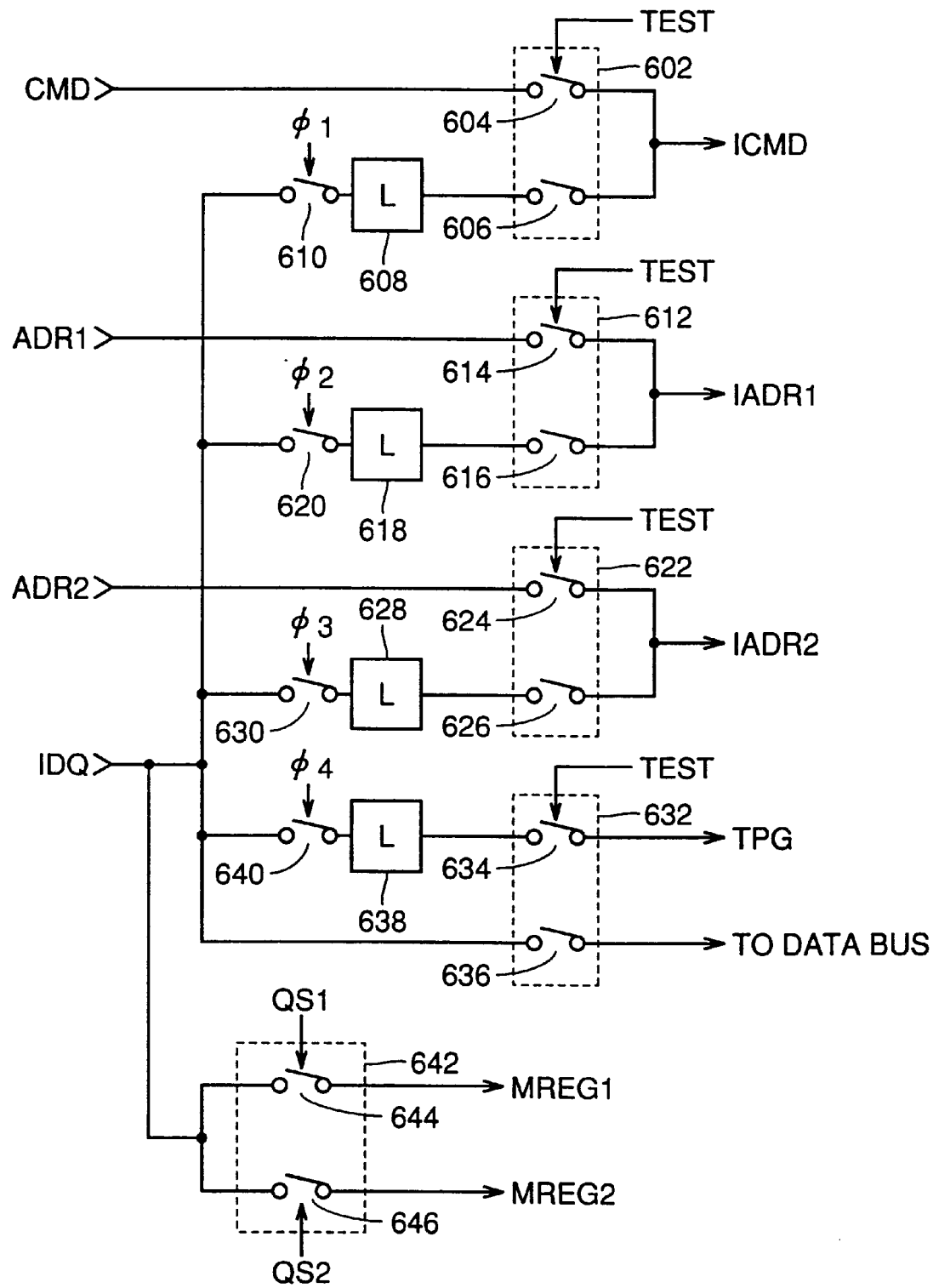
FIG. 24 is a circuit diagram showing a structure of multiplexer 3020 shown in FIG. 23.

FIG. 24 is a circuit diagram showing a structure of multiplexer 3020 shown in FIG. 23.

Referring to FIG. 24, multiplexer 3020 includes latches 608, 618, 628 and 638 taking data from signal IDQ. Multiplexer 3020 further includes switch circuits 610, 620, 630 and 640 which are rendered conductive in response to clock signals $\phi 1$, $\phi 2$, $\phi 3$ and $\phi 4$, and applying signal IDQ to latches 608, 618, 628 and 638, respectively.

Latch 3020 further includes: a selector 602 outputting the signal CMD as the signal ICMD in the normal operation and outputting an output of latch 608 as the signal ICMD in the test mode; a selector 612 outputting the signal ADR1 as the signal IADR1 in the normal mode and outputting an output of latch 618 as the signal IADR1 in the test mode; a selector 622 outputting the signal ADR2 as the signal IADR2 in the normal mode and outputting an output of latch 628 as the signal IADR2 in the test mode; and a switch circuit 632 outputting the signal IDQ to a common data bus in the normal mode, and outputting an output of latch 638 as a signal TPG in the test mode.

Selector 602 includes a switch 604 which is rendered conductive in the normal mode for applying the signal CMD to a node outputting the signal ICMD, and a switch 606 which is rendered conductive in the test mode for applying an output of latch 608 to a node outputting the signal ICMD. Selector 612 includes a switch 614 which is rendered conductive in the normal mode for applying the signal ADR1 to a node outputting the signal IADR1, and a switch 616 which is rendered conductive in the test mode for applying an output of latch 618 to a node outputting the signal IADR1. Selector 622 includes a switch circuit 624 which is rendered conductive in the normal mode for applying the signal ADR2 to a node outputting the signal IADR2, and a switch circuit 626 which is rendered conductive in the test mode for applying an output of latch 628 to a node outputting the signal IADR2. Switch circuit 632 includes a switch circuit 634 which is rendered conductive in the test mode for applying an output of latch 638 to a node outputting the signal TPG and a switch circuit 636 which is rendered conductive in the normal mode for applying the signal IDQ to the data bus.

Multiplexer 3020 further includes a switch circuit 642 which allocates the signal IDQ to signals MREG1 and MRECG2 in accordance with strobe signals QS1 and QS2. Switch circuit 642 includes a switch circuit 644 which is rendered conductive in response to strobe signal QS1 and applying the signal IDQ to a node outputting the signal MREG1, and a switch circuit 646 which is rendered conductive in response to strobe signal QS2 for applying the signal IDQ to a node outputting the signal MREG2.

Here, clock signals $\phi 1$ to $\phi 4$ are clock signals generated from strobe signal QS and of which activation starts at times t1, t2 and t3 of FIG. 21. Clock signal $\phi 1$ corresponds to cycle #1 of FIG. 22. Clock signal $\phi 2$ corresponds to cycle #2 of FIG. 22. Clock signal $\phi 3$ corresponds to cycle #4 of FIG. 22. Clock signal $\phi 4$ corresponds to cycle #4 of FIG. 22.

Switch circuit 642 is for transmitting data to the mode register when entering the test mode. The signals QS1 and QS2 are signals generated in response to the strobe signal QS and the level of data terminal DQO.

The switch circuit 642 is provided at data terminals DQ4, DQ8, DQ12, DQ16, DQ20, DQ24 and DQ28 which are used for testing, and not provided at an input/output circuit portion of data terminal DQ0.

Figure 25:
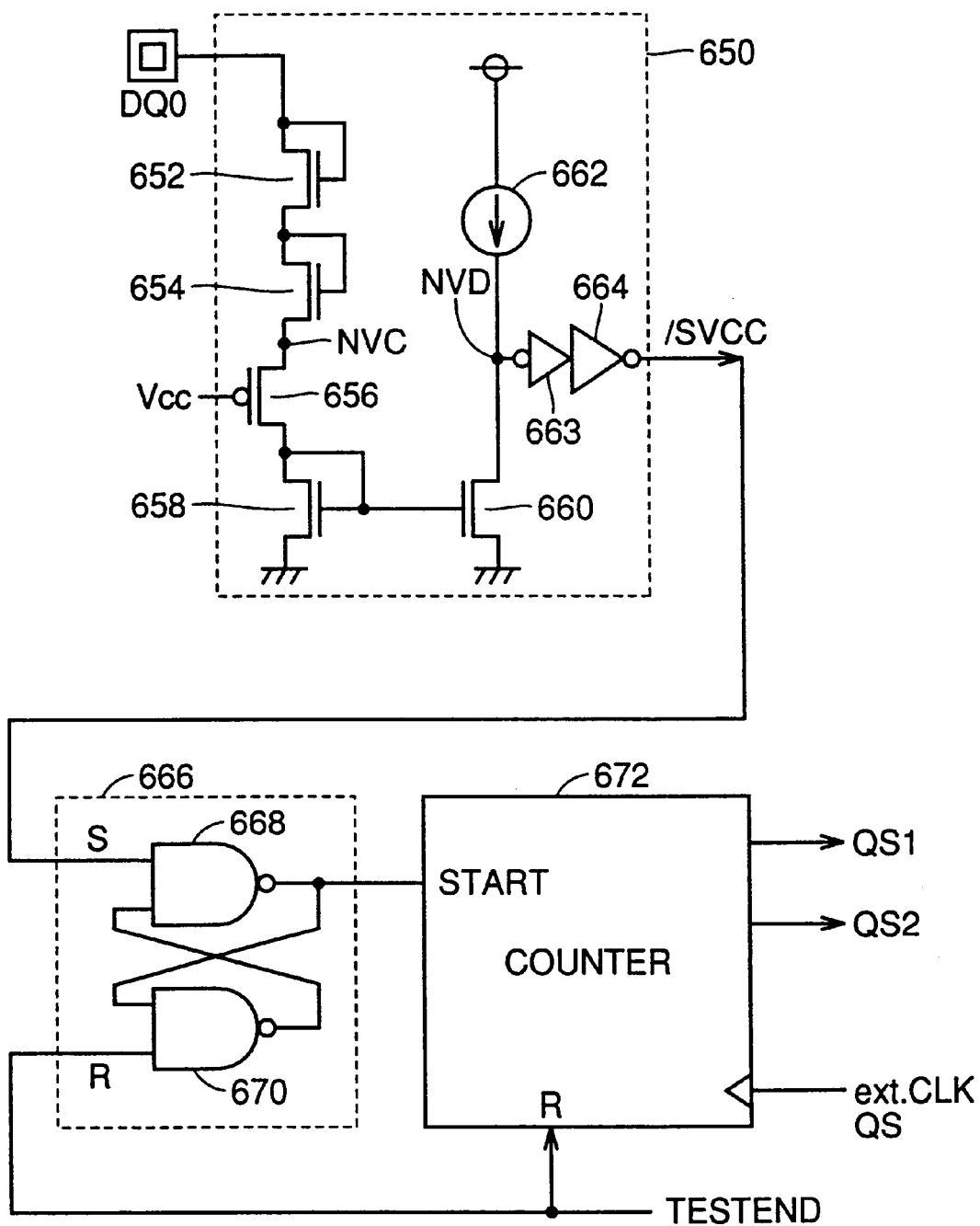
FIG. 25 is a circuit diagram showing a structure related to test mode setting of data terminal DQ0.

FIG. 25 is a circuit diagram showing a structure related to setting of test mode of data terminal DQ0.

At the input/output circuit portion of data terminal DQ0, in addition to the structure shown in FIG. 23, a structure for determining start of test mode shown in FIG. 25 is provided.

More specifically, referring to FIG. 25, there are provided a high voltage detecting circuit 650 detecting that the level of data terminal DQO attained a prescribed voltage value or higher, a latch circuit 660 set by an output of high voltage detecting circuit 650 and reset by a signal TESTEND indicating end of test, and a counter 672 starting counting in response to an output of latch circuit 666 for outputting signals QS1 and QS2

High voltage detecting circuit 650 includes: N channel MOS transistors 652 and 654 diode connected in series between data terminal DQ0 and a node NVC; an N channel MOS transistor 658 having its source connected to the ground node and its gate and drain connected to each other; a P channel MOS transistor 656 connected between the drains of N channel MOS transistor 658 and node NVC and receiving at its gate the power supply potential Vcc; a constant current source 662 connected between a power supply node and node NVD; an N channel MOS transistor 660 connected between node NVD and the ground node and having its gate connected to the drain of N channel MOS transistor 658; an inverter 663 having its input connected to node NVD; and an inverter 664 receiving and inverting an output of inverter 663 to output a high voltage detecting signal /SVCC.

Latch circuit 666 includes an NAND circuit 668 receiving at one input node the signal /SVCC, and an NAND circuit 670 receiving an output of NAND circuit 668 and the signal TESTEND. The output of NAND circuit 670 is connected to the other input of NAND circuit 668.

Figure 26:
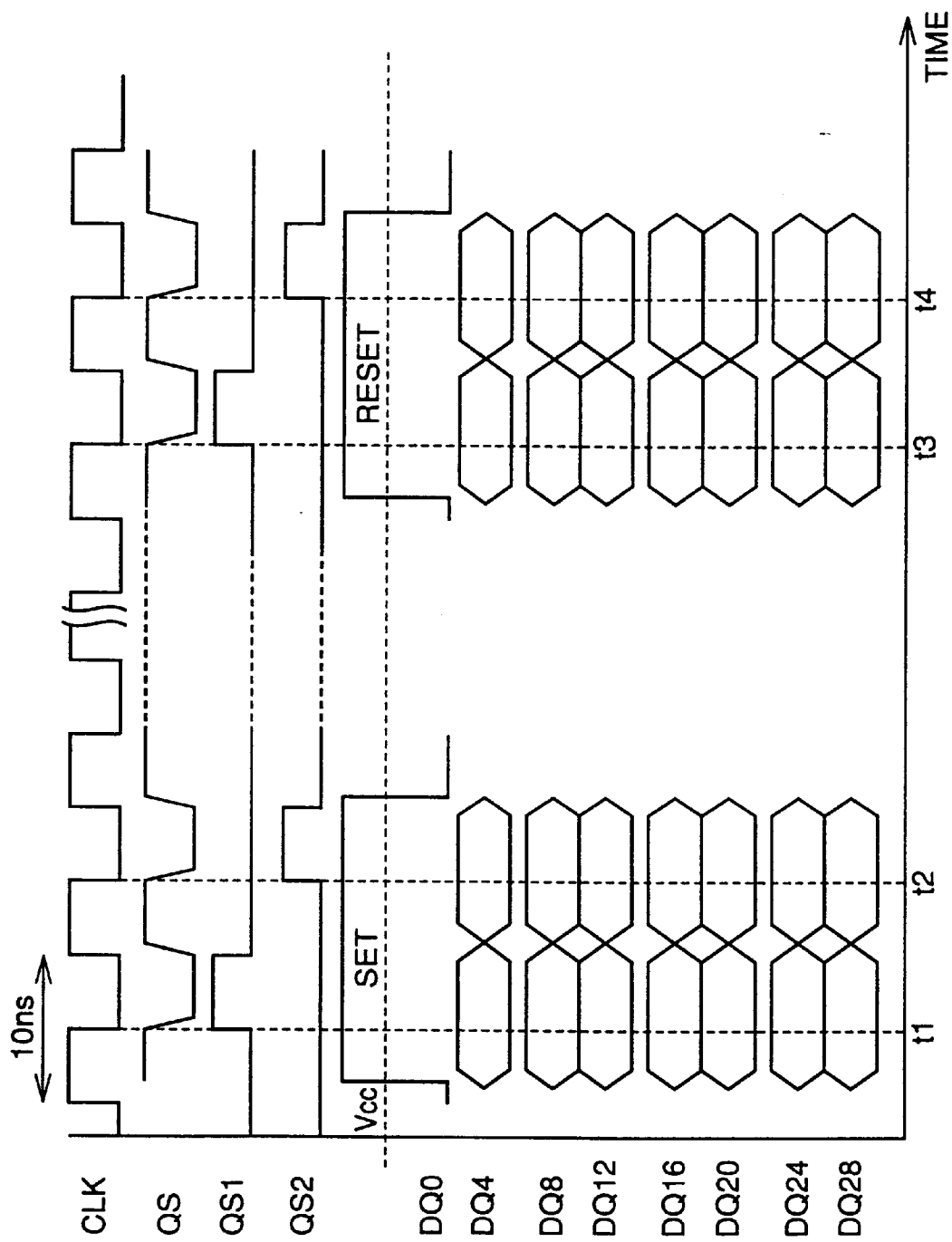
FIG. 26 is a diagram of waveforms representing an operation to enter test mode and an operation to exit from the test mode.

FIG. 26 is a diagram of waveforms representing an operation of entering the test mode and exiting from the test mode.

Referring to FIG. 26, when the strobe signal QS is input while the potential of data terminal DQ0 is at a prescribed level not lower than the power supply potential Vcc, the data input to data terminals DQ4, DQ8, DQ12, DQ16, DQ20, DQ24 and DQ28 are written to the mode register of the synchronous semiconductor memory device. The signals QS1 and QS2 for writing to the mode register are generated by counter 672 shown in FIG. 25, and input to switch circuit 642 shown in FIG. 24.

At time points t1 and t2, test mode corresponding to the data input to data terminals DQ4, DQ8, DQ12, DQ16, DQ20, DQ24 and DQ28 is executed.

Similar operation is performed for the exit from the test mode.

More specifically, at time points t3 and t4, data terminal DQ0 is set at a prescribed level not lower than the power supply potential Vcc and when the strobe signal QS is input at the time, the data input to the data terminal used for testing are taken in the internal mode register. By providing the data corresponding to exit from the test mode, the operation exits from the test mode.

Figure 27:
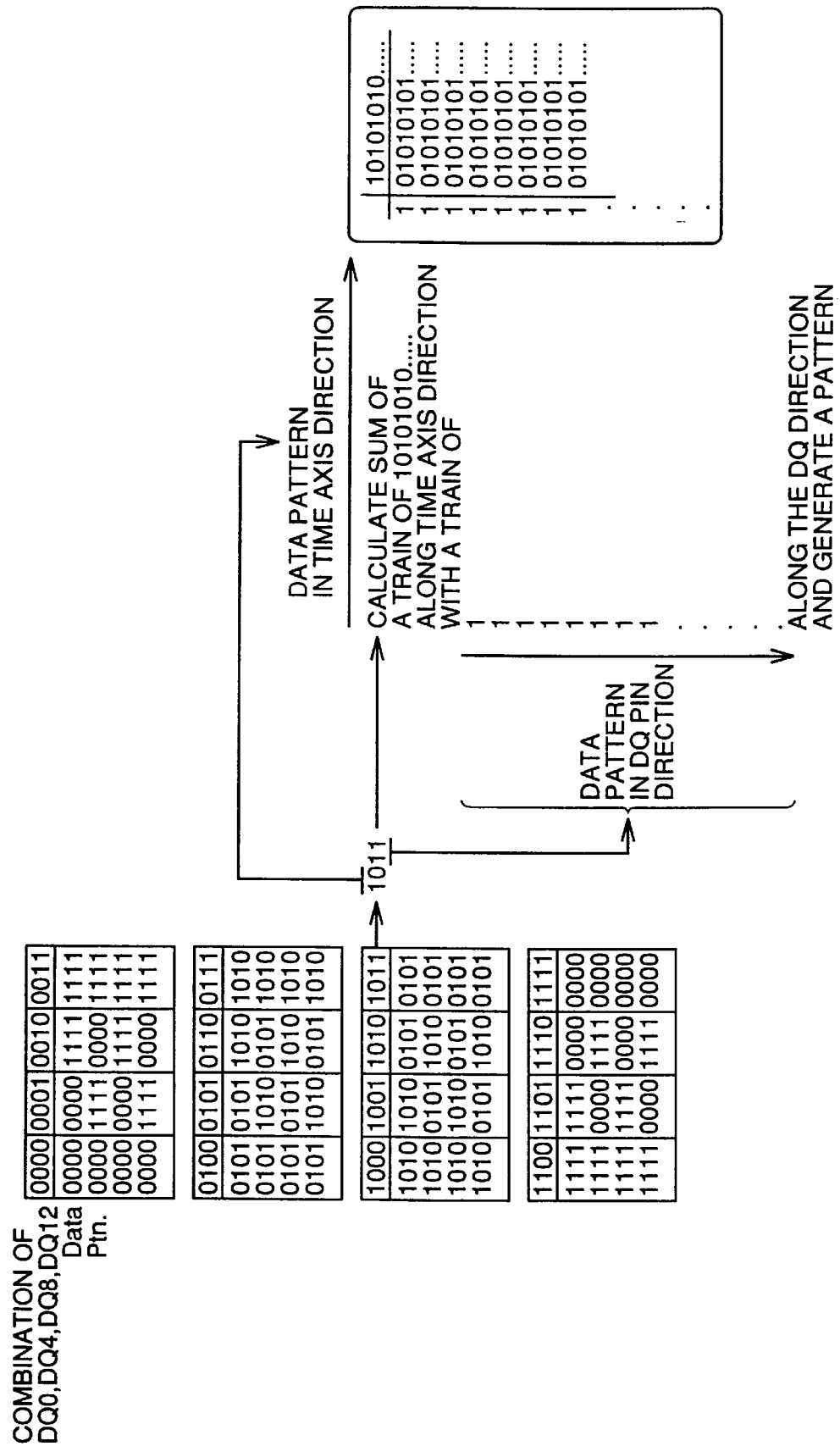
FIG. 27 is a schematic illustration showing the manner of generating data pattern input in cycle #4 shown in FIG. 22.

FIG. 27 is a schematic illustration representing the manner low data patterns are generated from the data input in cycle #4 of FIG. 22.

Referring to FIG. 27, write data is generated using 16 data input/output terminals DQ0 to DQ15 and 16 data input/output terminals DQ16 to DQ31 each as one group.

In the following, the internal write data generated in the test operation mode corresponding to data input/output terminals DQ0 to DQ15 will be described.

The internal write data is generated in the test operation mode corresponding to data input/output terminals DQ 16 to DQ31 in the same manner.

Among data input/output terminals DQ0 to DQ15, 4 bits of data are applied to data input/output terminals DQ0, DQ4, DQ8 and DQ12 in the test operation mode. There are 16 possible combinations of 4 bits of data, as shown in FIG. 27. In the test operation mode, of the 4 bits of data, higher 2 bits, that is, data applied to data input/output terminals DQ 12 and DQ8 determine data pattern in the direction of the time axis, while lower 2 bits of the 4 bits of data, that is, data applied to data input/output terminals DQ4 and DQ0 generate data pattern of the write data corresponding to the data input/output terminals DQ0 to DQ15.

More specifically, when 4 bits of data are "1011", data repeating the data "10" is used as a reference in the direction of the time axis and for data input/output terminals DQ0 to DQ15, data repeating the data "11" of lower 2 bits of the 4 bits of data are used as reference.

More specifically, by obtaining exclusive OR of data "1010 . . . " extending in the direction of the time axis and the data "1111 . . . " extending in the direction of data input/output terminals respectively, write data in the test operation mode is generated.

More specifically, when 4 bits of data are "1011", the data written to respective data input/output terminals DQ0 to DQ15 are "0101 . . . " along the time axis.

Figure 28:
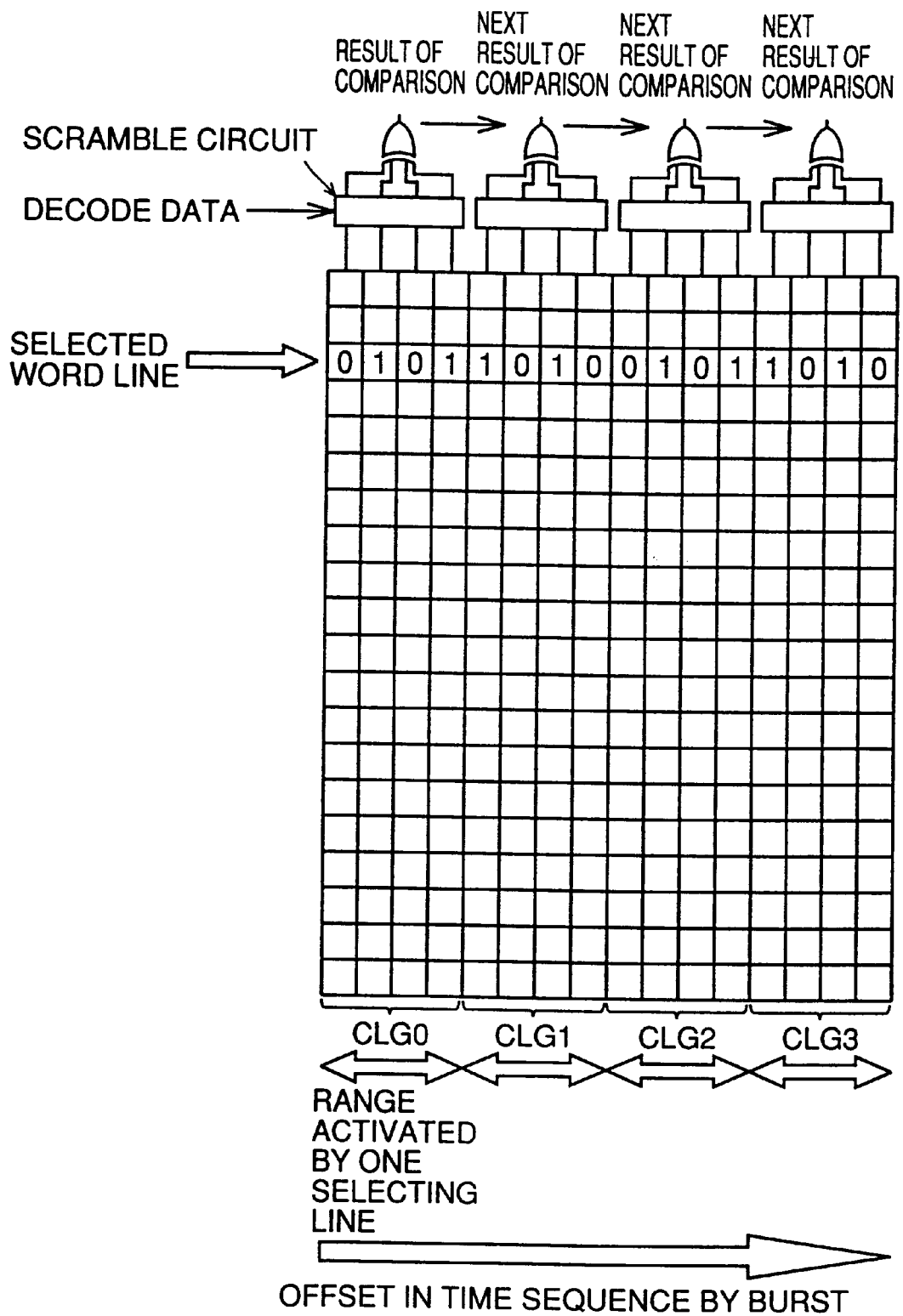
FIG. 28 is an illustration representing an operation in which a result of comparison between the data written to the memory cell in the test operation mode with the expected value is output in a reading operation.

FIG. 28 is an illustration representing an operation in which results of comparison between the data written to the memory cell in the test operation mode with the expected values are output in reading operation.

Referring to FIG. 28, in a first read period in the read operation, a column group CLG0, which is selected in response to activation of a column selecting line SCL0, is selected and if there is no defect in the selected memory cells, the written data pattern "0101" is read in parallel.

In a cycle in which a read command is applied in the read operation, based on the data applied to data input/output terminals DQ0 to DQ12, expected value data generated by the same decoding operation as performed in the writing operation are compared with the read data 4 bits by 4 bits, and the result of comparison is output to data input/output terminal DQ0.

In the next cycle of the reading operation, memory cell column group CLG1 is selected, and the read data and expected data are compared. The data of the result of comparison is output in the similar manner to data input/output terminal DQ0. The comparison of 4 bits of data is realized by exclusive OR.

Therefore, when the road data and expected value data are perfectly matching, data at "0" level is output from the corresponding data input/output terminal, and if any of the read data is different from the expected value data, data "1" is output from the corresponding data input/output terminal.

The same applies to other data input/output terminals DQ4, DQ8 and DQ12.

Further, similar operation is performed with respect to data input/output terminals DQ16, DQ20, DQ24 and DQ29.

By such an operation, even when the external clock signal does not have high frequency, the internal operation of the synchronous semiconductor memory device is performed in accordance with the internal clock signal int.CLK having sufficiently short period, and in addition, the result of comparison between the data written in the writing operation with the expected value in the test operation mode is output collectively 4 bits by 4 bits. Therefore, it is possible to reduce the number of data input/output terminals through which data must be exchanged with the testing apparatus in the test operation mode.

Figure 29:
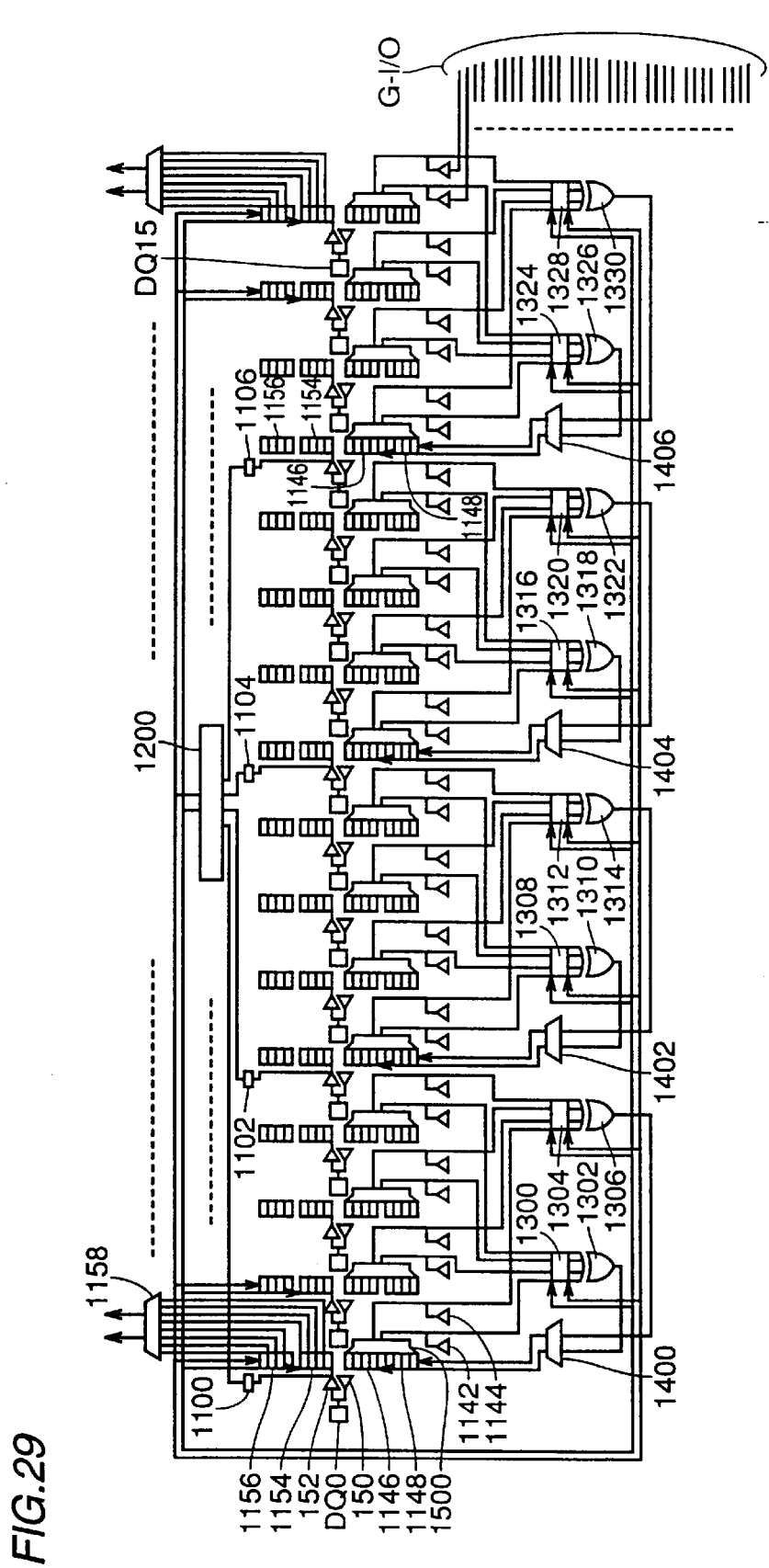
FIG. 29 is a schematic block diagram showing a structure of data input/output circuit for data input/output terminals DQ0 to DQ15.

FIG. 29 is an schematic block diagram representing a structure of data input/output circuit for the data input/output terminals DQ0 to DQ15.

The structure corresponding to data input/output terminals DQ0 to DQ15 includes a structure of a terminal to which data is applied both in the test operation mode and the normal operation mode (for example, data input/output terminal DQ0) and a structure of a terminal to which data is not applied in the test operation mode and data is applied in the normal operation mode (for example, data input/output terminals DQ1 to DQ3) repeated respectively. In the following, the structure corresponding to data input/output terminal DQ0 will be described first.

Referring to FIG. 29, corresponding to data input/output terminal DQ0, data input buffer 152 is provided, of which output is held by a latch circuit 1100. In the normal operation mode, the data output from input buffer 152 are taken in latch circuit 1156 successively holding data in response to the rising edge of a signal FETCHe controlling data input and in latch circuit 1154 successively holding data in response to holding edge of the signal FETCHe, that is, in response to the rising edges of a signal FETCHo in opposite phase to the signal FETCHe, in the normal operation mode. The data held in latch circuits 1156 and 1154 are transmitted to a multiplexer circuit 1158 for switching an address area to which the data is transmitted dependent on whether the externally applied address signal is an even-numbered address or an odd-numbered address, in the normal operation mode.

Here, the signal FETCHe is a clock signal for controlling timing of taking external write data, and the signal QS applied externally may be used or a clock signal generated from the internal clock generating circuit may be used.

In the test operation mode, based on the data from latch circuit 1100 provided corresponding to data input/output terminal DQ0, latch circuit 1102 provided corresponding to data input/output terminal DQ4, latch circuit 1104 provided corresponding to data input/output terminal DQ8 and latch circuit 1106 provided corresponding to data input/output terminal DQ12, a decode circuit 1200 generates write data and applies the write data to latch circuits 1156 and 1154.

In the reading operation, the read data transmitted from global I/O line pair G-I/O is passed to buffer circuits (data receiver amplifier circuits) 1142 and 1144 and stored in latch circuits 1146 and 1148, respectively. In the normal operation mode, the data stored in latch circuits 1146 and 1148 are applied serially to an output buffer 150 and output from data input/output terminal DQ0.

In the test operation mode, for example, there are provided: a scramble circuit 1300 receiving, among read data corresponding to data input/output terminals DQ0 to DQ3, 4 bits of read data from even-numbered address area and a decode signal from a decoder 1200 for data scrambling; an exclusive OR gate 1302 for performing exclusive OR operation on the data output from scramble circuit 1300; ha scramble circuit 1304 for scrambling data in accordance with the data read from odd-numbered address area from the read data corresponding to data input/output terminals DQ0 to DQ3 and to expected value data from decoder 1200; an exclusive OR gate 1306 for outputting data of result of comparison in accordance with the data output from scramble circuit 1304; and a multiplexer circuit 1400 receiving outputs from exclusive OR gate circuit 1302 and 1306 for selectively providing an output to a latch circuit 1148 for an odd-numbered address area and a latch circuit 1146 for even-numbered address, respectively.

The structure corresponding to data input/output terminal DQ1 is basically similar to the structure corresponding to data input/output terminal DQ0 except that latch circuit 1100 is not provided and that scramble circuits 1300 and 1304, exclusive OR gate circuits 1302 and 1306 and multiplexer circuit 1400 which are necessary to output data in the test operation mode are not provided.

The structure corresponding to other data input/output terminals DQ4 to DQ7, DQ8 to DQ11 and DQ12 to DQ15 is also basically the same as the structure corresponding to data input/output terminal DQ0 to DQ3.

The structure of data input/output terminal DQ12 will be described. As already described, latch circuit 1106 is for decoding data for generating data patterns. Latch circuit 1154 is a circuit for latch 4 bits of data continuously input at rising edges of the clock in normal operation. Latch circuit 1156 as a circuit for latching 4 bits of data continuously input at rising edges of the clock in the normal operation.

Latch circuit 1148 is a circuit for latching 4 bits of data continuously, which data are output at even-numbered clock edges after CAS latency in the normal operation, and latch circuit 1146 is a circuit for latching 4 bits of data continuously, which data are output at odd-numbered clock edges after CAS latency in the normal operation.

Multiplexer circuit 1158 is for distributing, when data from input data latches 1156 and 1154 are to be transmitted internally, the data dependent on whether the address is even-numbered address or odd-numbered address. Multiplexer 1500 provided corresponding to output latches 1146 and 1148 is for providing the data from receivers 1142 and 1144 to a latch preceding an output buffer, dependent on the definition as to whether the data is to be output first or later. Scramble circuit 1324 is a circuit for setting scrambling of data input to the comparator in accordance with input data in a test read cycle, at the time of test read. Multiplexer circuit 1406 is for selectively writing the result of comparison to a latch preceding an output buffer, dependent on whether the result data is to be output first or later.

Figure 30:
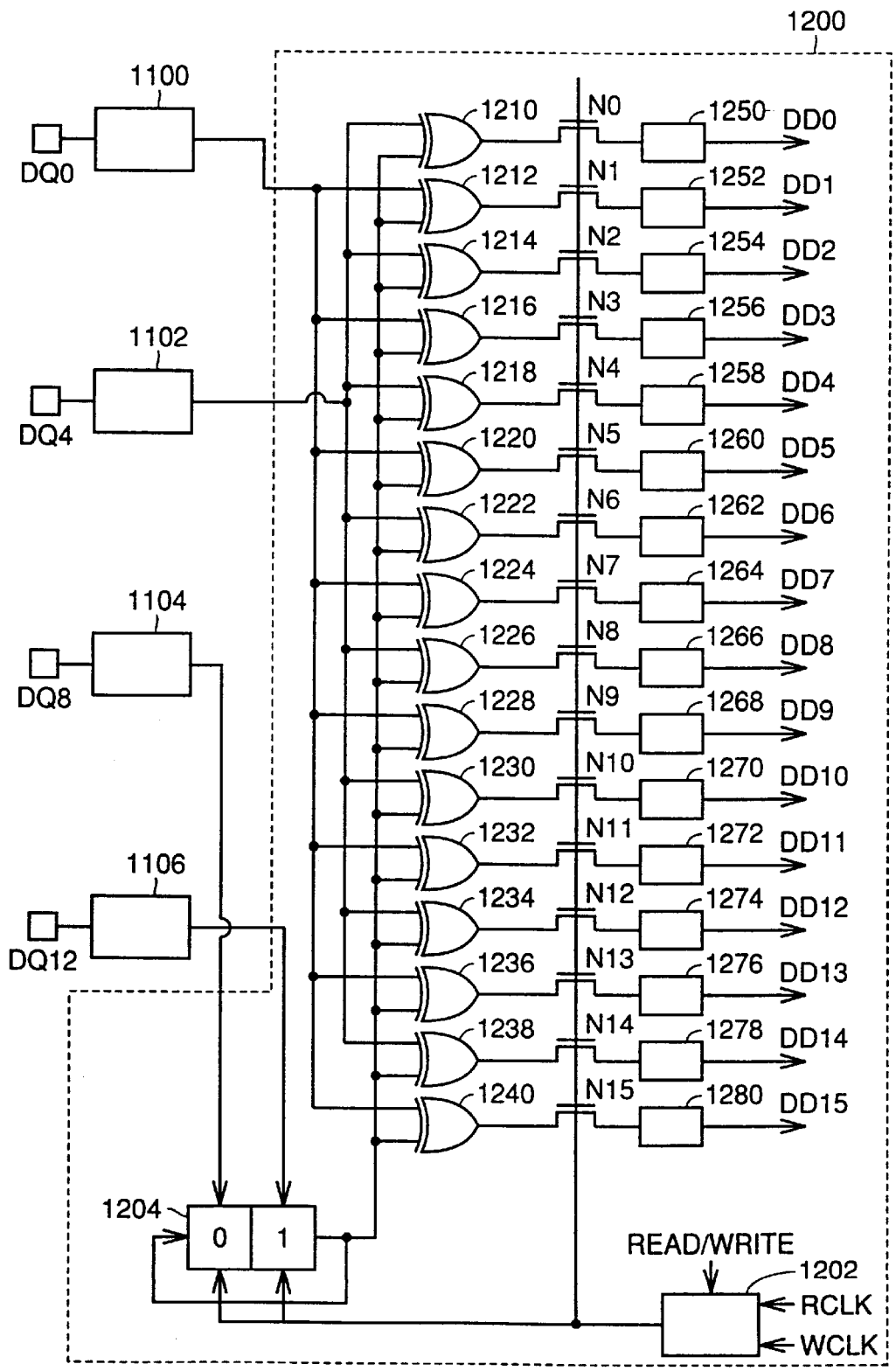
FIG. 30 is a schematic block diagram of the structure of decoder circuit 1200 shown in FIG. 29.

FIG. 30 is a schematic block diagram of the structure of decoder circuit 1200 shown in FIG. 29.

Referring to FIG. 30, decoder circuit 1200 includes: a multiplexer 1202 receiving a read clock signal RCLK and a write clock signal WCLK for selectively outputting either of these dependent on whether a read operation mode is designated or a write operation mode is designated; a shift register 1204 receiving data applied to data input/output terminal DQ12 and held in latch circuit 1106 and data applied to input/output terminal DQ8 and held in latch circuit 1104, in the test operation mode, for shifting the input data in a circulating manner in accordance with a clock signal output from multiplexer 1202; exclusive OR gates 1212, 1216, 1220, 1224, 1228, 1232, 1236 and 1240 receiving at one input terminal an output from latch circuit 1100 latching the data applied to data input/output terminal DQ0; and exclusive OR gates 1210, 1214, 1218, 1222, 1226, 1230, 1234 and 1238 receiving at one input node the data applied to data input/output terminal DQ4 and held in latch circuit 1102.

Exclusive OR gates 1210 to 1240 receive, each at the other input node, data output from shift register 1204.

Decoder circuit 1200 further includes N channel MOS transistors N0 to N15 provided corresponding to exclusive OR gates 1210 to 1240 and opened/closed in response to a clock signal output from multiplexer 1202, respectively, and latch circuits 1250 to 1280 provided corresponding to N channel MOS transistors N6 to N15 for holding data output from these transistors, respectively.

Decode data DD0 to DD15 output from the decoder circuit in the test, operation mode are provided from latch circuit 1250 to 1280, respectively.

Figure 31:
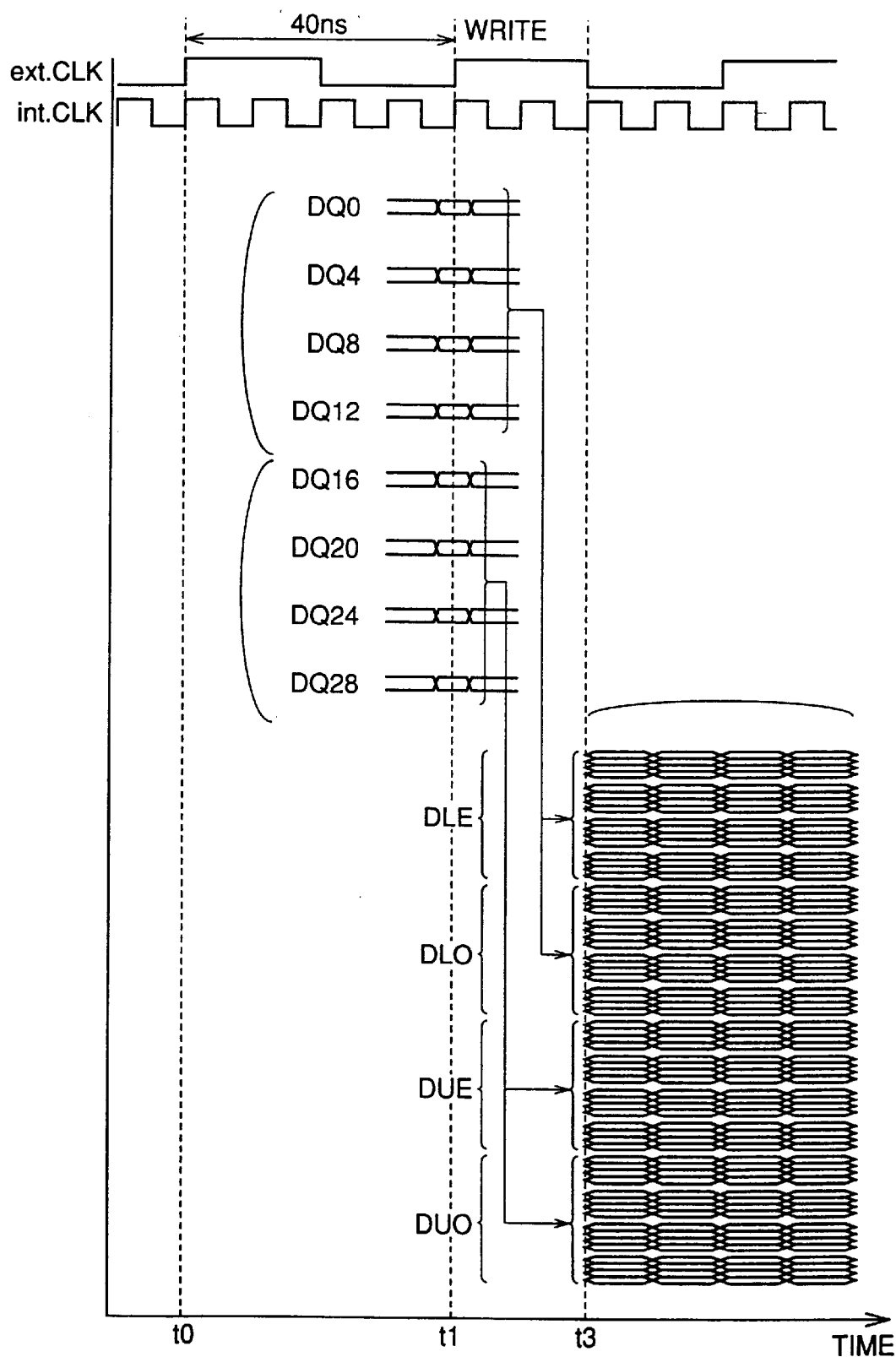
FIG. 31 is a timing chart representing, in greater detail, a test data writing operation described with reference to the operation waveform of FIG. 21.

FIG. 31 is a timing chart showing in detail the operation of test data writing, of the waveform diagram of FIG. 21.

The test mode operation differs mainly in the following to points, from the normal mode operation.

First, the period of the external clock signal ext. CLK is, for example, 40 ns, which means that it changes in a period larger than the operable frequency of the internal circuits of the synchronous semiconductor memory device.

In the synchronous semiconductor memory device, based on the external clock signal ext. CLK, an internal clock signal int. CLK which is synchronous with and having higher fequency than the external clock is generated, and circuit operation is performed based on the internal clock signal.

In the example shown in FIG. 31, internal write data for test operation is generated based on the data applied to 8 data input/output pins, that is, data input/output terminals DQ0, DQ4, DQ8, DQ12, DQ16, DQ20, DQ24 and DQ28, among data input/output terminals DQ0 to DQ31.

Assume that an ACT command is applied to the synchronous semiconductor memory device at a rising edge of the external clock signal ext. CLK before time point t0.

After a WRITE command is applied to the synchronous semiconductor memory device, write data are applied to the aforementioned 8 data input/output terminals DQ0 to DQ28, at the time point t1.

In the following, data written to areas corresponding to even-numbered addresses of bank0 to bank7 will be referred to as data DLE, while data written to the odd-numbered address areas will be referred to as DLO. Similarly, the data written to the even-numbered address areas of bank8 to bank15 will be referred to as DUE, and the data written to the odd-numbered address areas will be referred to as data DUO.

Based on 4 bits of data applied to data input/output terminals DQ0, DQ4, DQ8 and DQ12, 32 ×4 bits of data are generated which are written to corresponding banks as data DLE and DLO. Based on 4 bits of data applied to data input/output terminals DQ16, DQ20, DQ24 m& DQ29, 32 ×4 bits of data written to the bank corresponding banks as data DUE and DUO) are generated.

More specifically, at time t3, 4×4 bits of data are generated as data DLE, and 4×4 bits of data are generated as data DLO. These are written to the even-numbered address areas and odd-numbered address areas of the corresponding banks, respectively. Similarly, at time t3, 4×4 bits of data are generated as data DUE and 4×4 bits of data are generated as data DUO, and these data are written to the even-numbered address areas and odd-numbered address areas of the corresponding banks.

More specifically, 8 bits of data are applied externally at time t1, while 64 bits of data to be simultaneously written collectively to the memory array are generated therefrom. In accordance with the period of the internal clock signal, data are generated 64 bits by 64 bits, and successively written to the even-numbered address areas and odd-numbered address areas of the corresponding banks.

Figure 32:
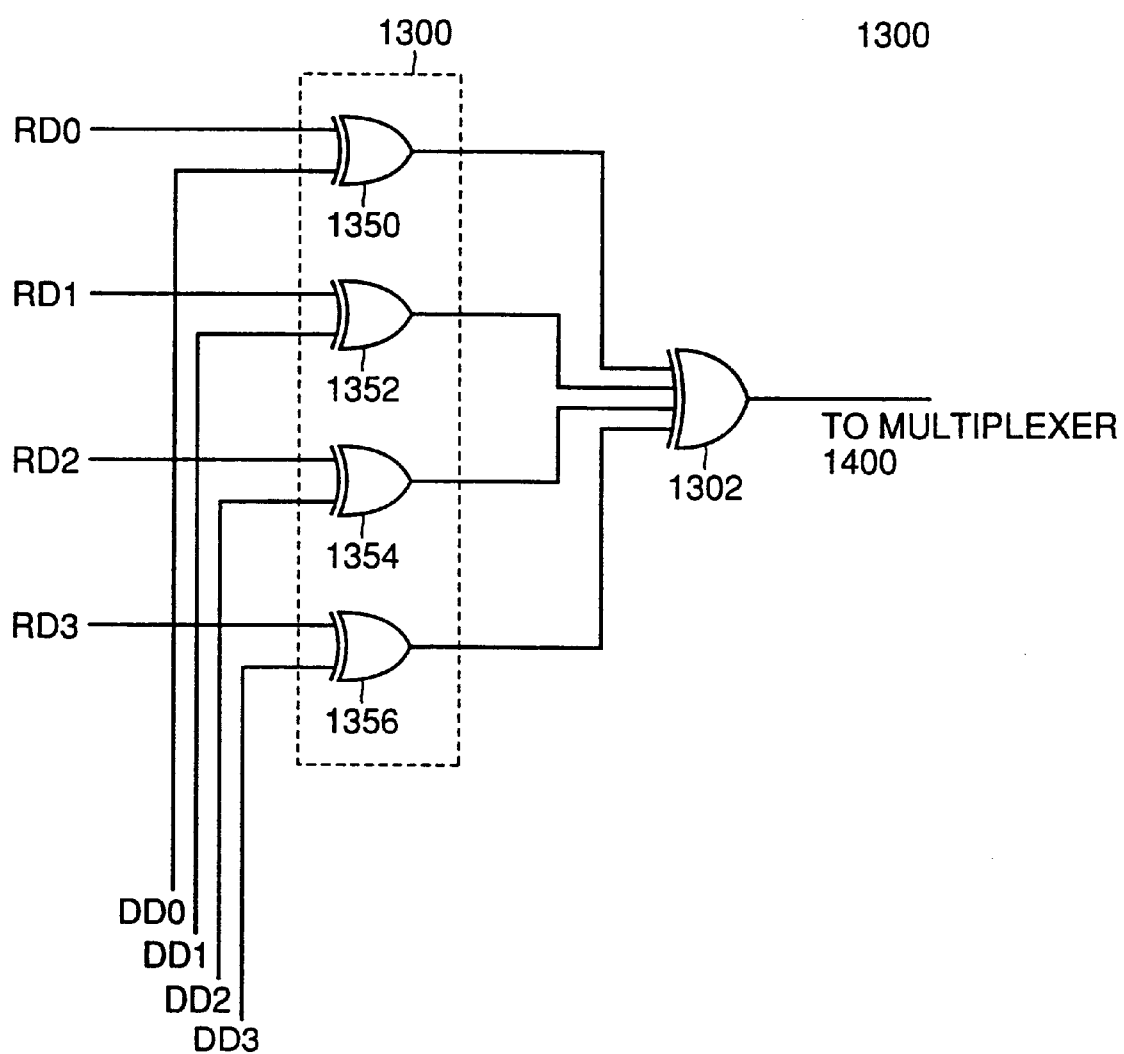
FIG. 32 is a schematic block diagram of a structure of scramble Circuit 1300 shown in FIG. 29.

FIG. 32 is a schematic block diagram showing a structure of scramble circuit 1300 of FIG. 29.

Referring to FIG. 32, scramble circuit 1300 includes exclusive OR gates 1350 to 1356 respectively receiving at one input node, read data RDO to RD3 from those latch circuits which hold data output at the even-numbered clock edges after CAS latency, among the latch circuits for read data provided corresponding to data input/output terminals DQ0 to DQ3. Exclusive OR gates 1350 to 1356 receive, respectively at the other input gate, decode data DD0 to DD3 output from decoder circuit 1200, respectively.

Output signals of exclusive OR gates 1350 to 1356 are applied to an exclusive OR gate 1302, and result of operation of exclusive OR gate 1302 is applied to multiplexer circuit 1400.

By the above described structure, based on the data applied to data input/output terminals DQ0 to DQ12 in the test operation mode, decode data DD0 to DD15 having such data patterns a described with reference to FIG. 30 are generated. The decode data provides an expected value pattern of read data expected in the read operation. In the read operation of the test operation mode, data of the result of comparison between the read data corresponding to four data input/output terminals DQ0 to DQ3 with the expected values is output from data input/output terminal DQ0.

More specifically, as described with reference to FIGS. 31 and 33, in the test operation mode, only 8 data input/output terminals among 32 pins of data input/output terminals are used, and test data indicative of the result of comparison between the write data and the expected value is externally output.

Figure 33:
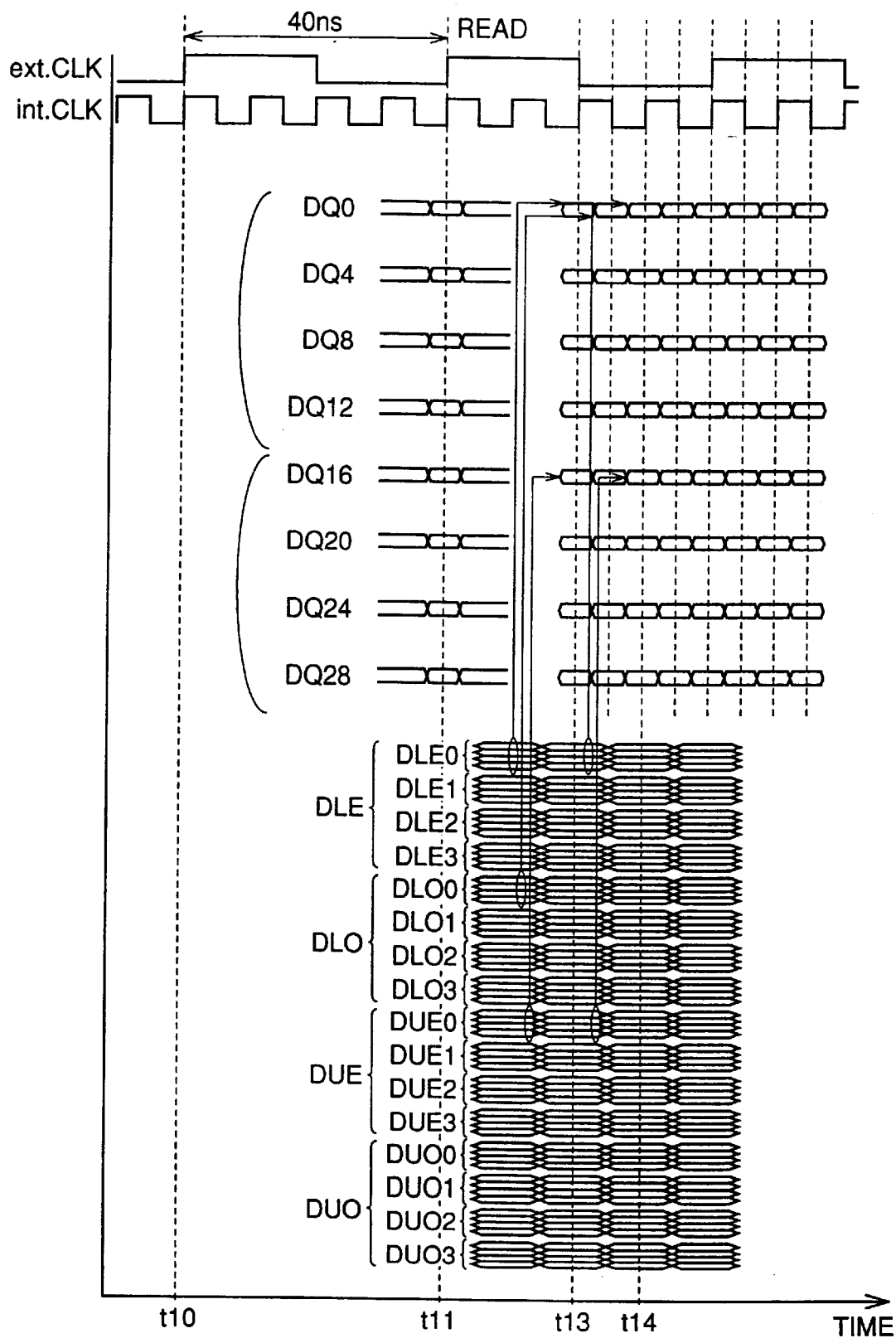
FIG. 33 is a timing chart representing a data read operation in the test mode operation.

FIG. 33 is a timing chart related to the data reading of in the test mode operation.

Referring to FIG. 33, at time t11, simultaneously with the application of a READ command (command designating a read operation) to the synchronous semiconductor memory device, data similar to those applied at the time of data write shown in FIG. 31 are applied to 8 data input/output terminals DQ0 to DQ28 which are used for data writing.

The synchronous semiconductor memory device provides data of result of comparison between the expected value data generated based on the data applied at time t11 with the read data read from respective banks.

More specifically, first, expected value data for the READ command at time t11 are provided, and thereafter, 64 bits of data are read in parallel from the even-numbered address areas and odd-numbered address areas of respective banks.

Of these, 4 bits of data read from memory cells activated simultaneously by one column selecting line of data DLE, (for example, 4 bits of data DLE0 which are to be applied corresponding to data input/output terminals DQ0 to DQ3 in the normal read mode) are compared with expected value to be read, based on the data applied at time t11 to data input/output trials DQ0, DQ4, DQ6 and DQ12, and at time t13, 1bit of data indicative of the result of comparison between the expected value and 4 bits of data is output to data input/output terminal DQ0.

In the similar manner, at a rising edge of internal clock signal int. CLK starting from time point t13, of the data DLO, 4 bits of data output to data input/output terminals DQ0 to DQ3 in the normal operation mode are compared with expected values generated in the synchronous semiconductor memory device based on the data applied to data input/output terminals DQ0 to DQ12 at time t11, and 1 bit of data indicative of the result of comparison is applied to data input/output terminal DQ0.

At time t14, of data DLE, 4 bits of data read in response to the period of the next internal clock signal int. CLK are compared with the expected value generated based on the data applied to data input/output terminals DQ0 to DQl2 at time till, and data indicative of the result of comparison is applied to data input/output terminal DQ0.

Thereafter, the result of comparison between 4 bits of data DLE0 corresponding to the data output to data input/output terminals DQ0 to DQ3 in the normal operation among the data DLE with the aforementioned expected values, and the result of comparison between 4 bits of read data DLO0 which are to be applied to input/output terminals DQ0 to DQ3 in the normal operation mode, of data DLO with the aforementioned expected values are output from data input/output terminal DQ0 in response to the rising edge and the failing edge of the internal clock signal int. CLK, respectively.

The same applies to other data input/output terminals DQ4, DQ8 and DQ12.

As to data input/output terminal DQ16, the data of the result of comparison between 4 bits of read data which are to be output to data input/output terminals DQ16 to DQ19 in the normal operation mode with the above described expected value is output successively from data input/output terminal DQ16.

The same applies to other data input/output terminals DQ20, DQ24, and DQ28.

In the description above, it is assumed that scramble circuit 1300 performs scrambling based on the data applied to 8 data input/output terminals DQ0 to DQ28 at time t11 of FIG. 33. When a structure in which, the data applied at time t1 of FIG. 31 is held in latch circuit or the like is used, it is unnecessary to externally apply data at time point t11.

By the above described operation, in the test mode, even when the externally applied external clock signal ext. CLK has long period, the internal clock signal int. CLK changes at a higher rate. As the internal circuits of the synchronous semiconductor memory device operate in synchronization with the internal clock signal int. CLK, load on the test apparatus testing the synchronous semiconductor memory device can be reduced.

Further, among 32 pins of data input/output terminals, only 8 pins of data input/output terminals have to be used in the test operation mode. Therefore, it is possible to reduce the total number of input pins and data input/output pins to be controlled by the tester per 1 chip. Therefore, the number of chips which can be tested in parallel simultaneously by the tester apparatus can be increased.

The semiconductor tester for testing the semiconductor devices is expensive, and the cost of testing increases when the number of channels used increases. By utilizing the test mode of the synchronous semiconductor memory device in accordance with the second embodiment, the number of pins to be used by the semiconductor tester can be reduced. Therefore, for example, it becomes possible to measure two devices simultaneously by one tester, and hence test cost can be reduced.

Third Embodiment

Figure 34:
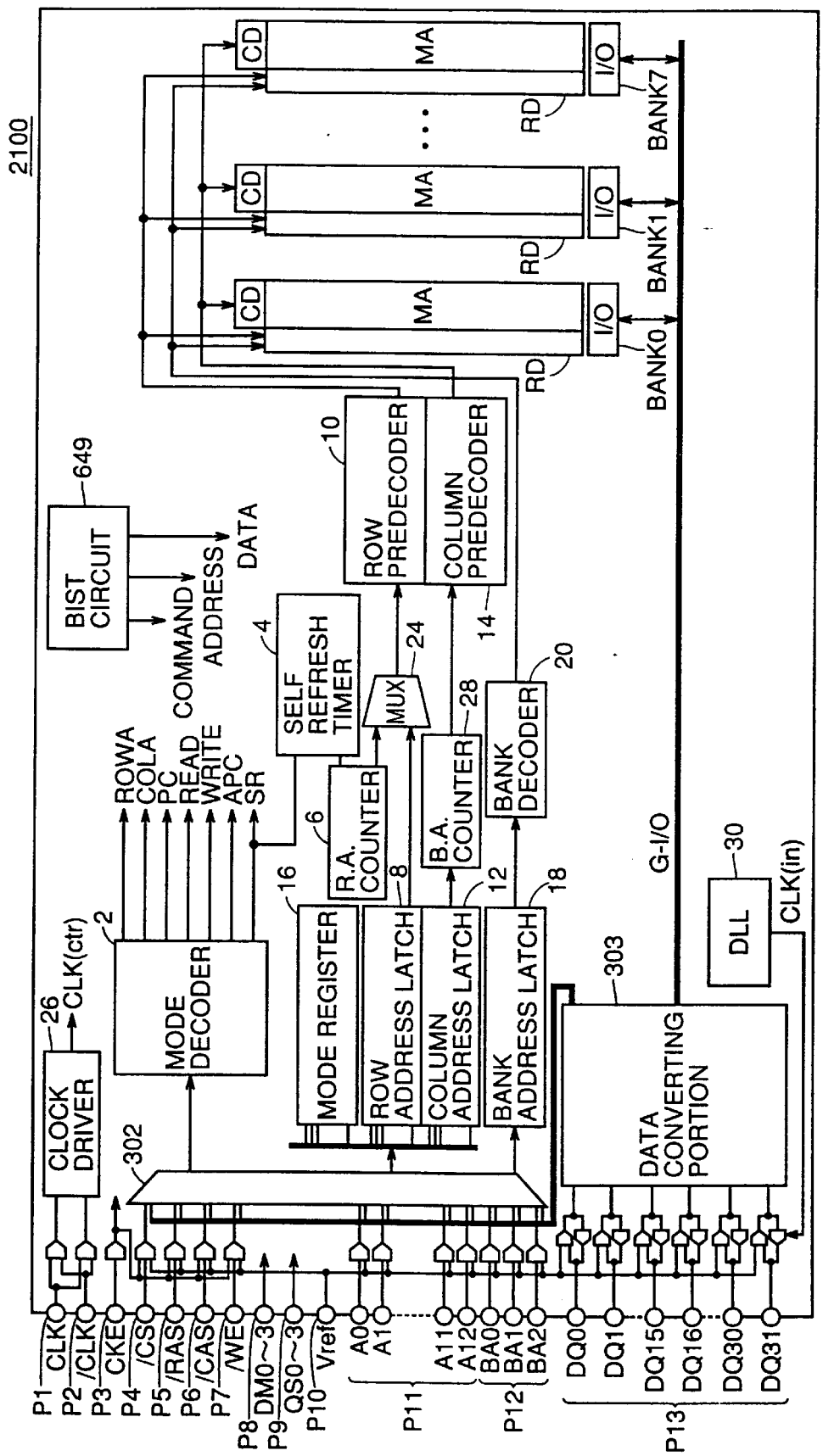
FIG. 34 is a schematic block diagram showing an overall structure of a synchronous semiconductor memory device 2100 in accordance with the third embodiment.

FIG. 34 is a schematic block diagram showing an overall structure of the synchronous semiconductor memory device 2100 in accordance with the third embodiment.

The third embodiment shows an example of a synchronous semiconductor memory device containing a BIST (built in self test) circuit.

Referring to FIG. 34, synchronous semiconductor memory device 2100 differs from synchronous semiconductor memory device 2000 shown in FIG. 18 in that it includes a BIST circuit 649. Except this point, the structure is the same as that of synchronous semiconductor memory device 2000. Therefore, description thereof is not repeated.

BIST circuit 649 generates, upon reception of an input of a test start command from the outside, signals such as commands necessary for testing, addresses and data automatically, performs operation test of the synchronous semiconductor memory device, determines whether the test is successful or not from output result such as read data, and outputs the determination to a prescribed output terminal.

Therefore, pins necessary for operation test of the synchronous semiconductor memory device containing BIST circuit are only a clock terminal for ensuring synchronization with the test apparatus and a data terminal used for the output of the result of determination. Namely, the minimum terminals used at the time of testing are a total of 2 pins, that is, one pin for the clock terminal and one pin for the data terminal.

Figure 35:
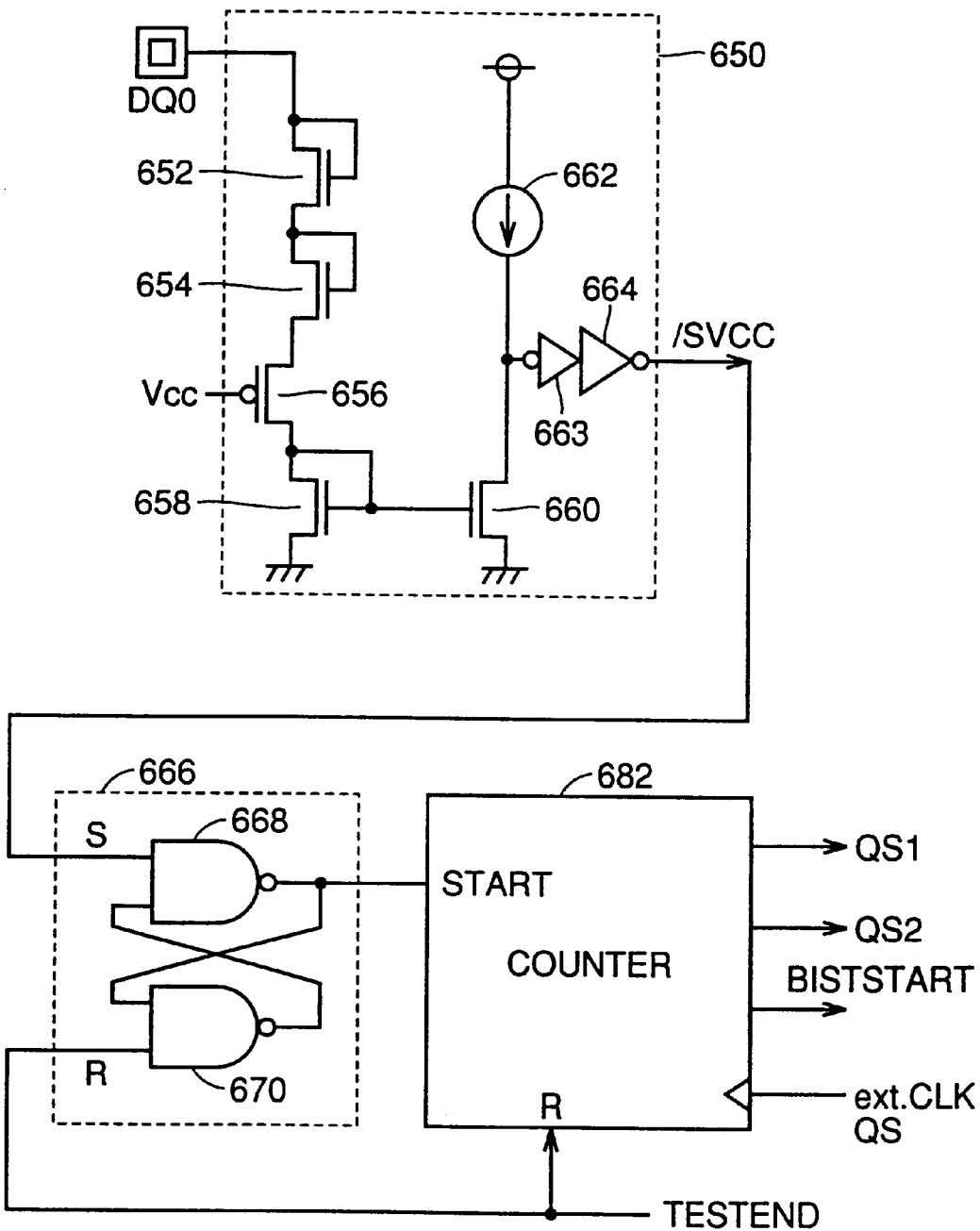
FIG. 35 is a circuit diagram showing a structure of a circuit related to setting of test mode provided at data terminal DQ0 in the third embodiment.

FIG. 35 is a schematic diagram showing a structure of a circuit related to setting of the test mode provided at data terminal DQ0 in the third embodiment.

Referring to FIG. 35, the circuit structure differs from the structure shown in FIG. 25 in that counter 682 is provided in place of counter 672. Counter 682 detects the potential of data terminal DQ0 attaining a prescribed high potential, and outputs a test start signal BISTSTART after a prescribed time period, and in this point, it Mfers from counter 672 shown in FIG. 25. Except this point, the structure is the same as that of FIG. 25. Therefore, description thereof is not repeated.

Figure 36:
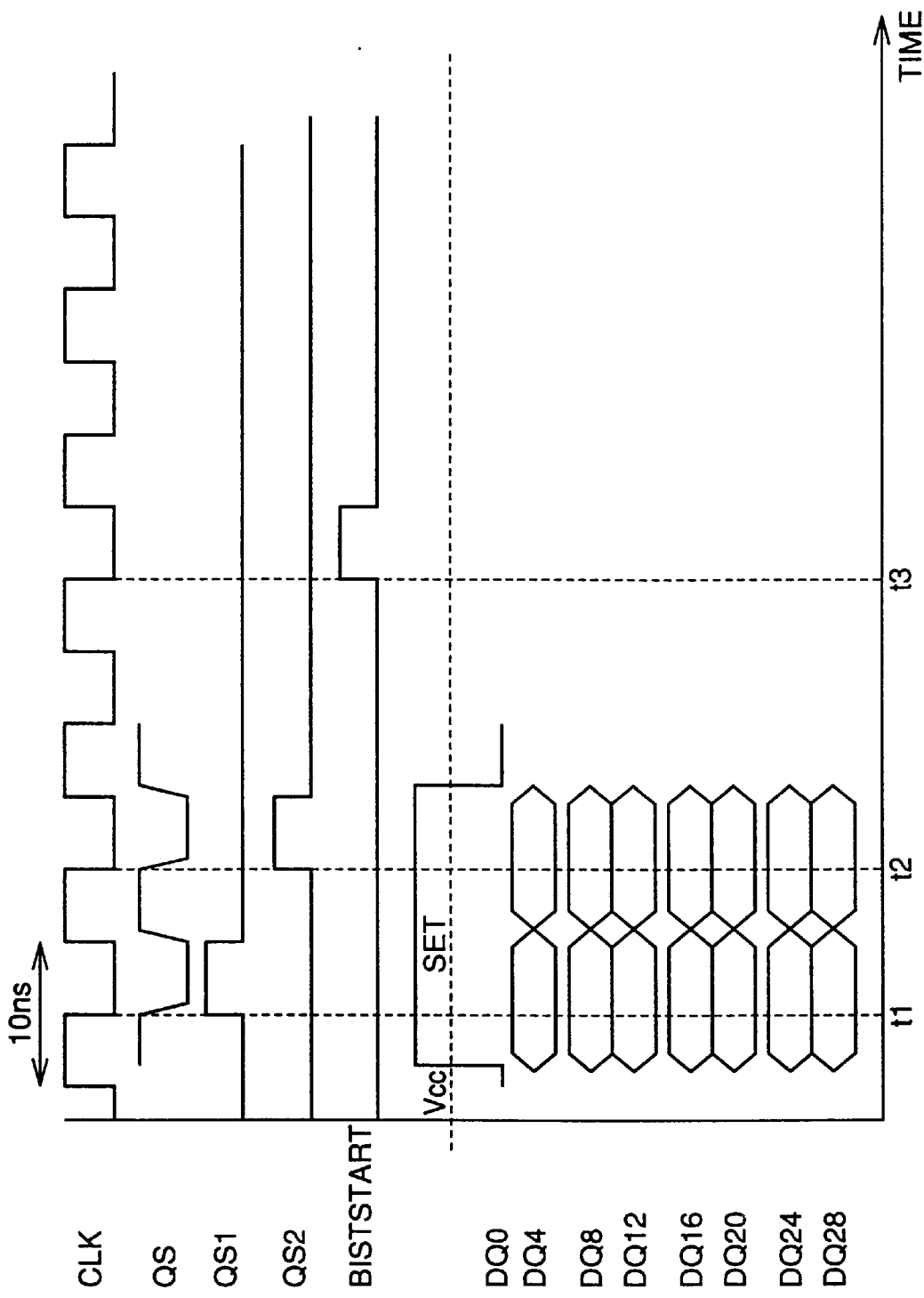
FIG. 36 is a diagram of waveforms representing setting of test mode for BIST.

FIG. 36 is a diagram of signal waveforms related to the setting of test mode to the BIST.

Referring to FIG. 36, when a strobe signal QS is input while the potential of data terminal DQ0 is at a prescribed level not lower than the power supply potential Vcc, the data input to data terminals DQ4, DQ8, DQ12, DQ16, DQ20, DQ24 and DQ28 are written to the mode register of the synchronous semiconductor memory device. Signals QS1 and QS2 for writing to the mode register are generated by counter 682 shown in FIG. 35 and input to switch circuit 642 shown in FIG. 24.

At time points t1 and t2, data input to data terminals DQ4, DQ8, DQ12, DQ16, DQ20 DQ24 and DQ28 are written to the mode register.

By the setting of the mode register taken at time points t1 and t2, pattern selection or pattern change of BIST is performed.

In the fourth cycle after the detection of the high potential applied to data terminal DQ0, a start signal for starting the operation of PIST is output.

It is not clear, however, whether the test is accurately performed inside or not merely by monitoring the terminal outputting the result of testing while BIST is in operation. Therefore, it is necessarily to see the state of execution of BIST from the outside to some extent.

Therefore, there is provided an operation mode for providing the internal state to the outside when BIST is being executed, utilizing a data terminal.

Figure 37:
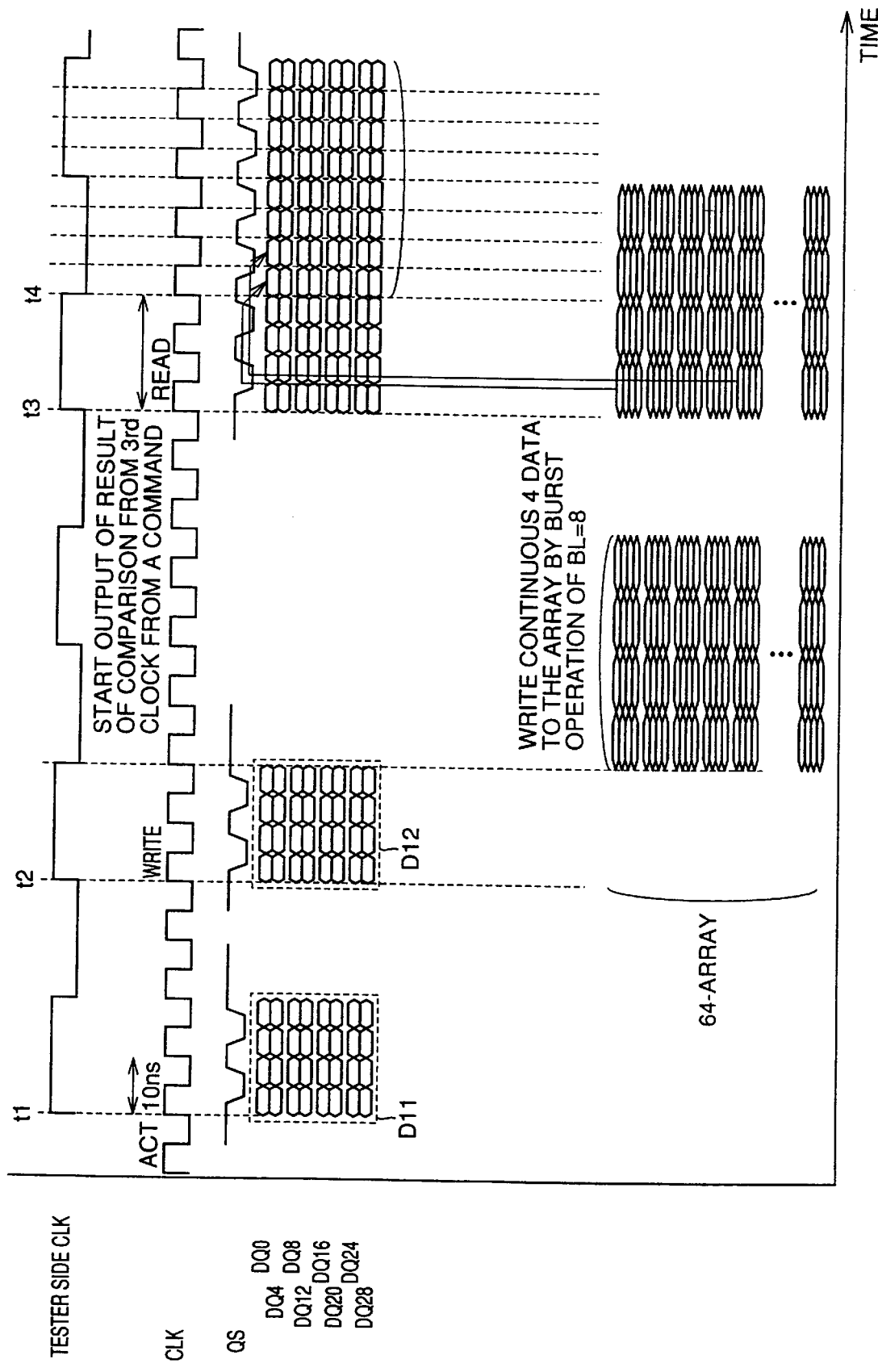
FIG. 37 is a diagram of waveforms representing the manner of output of test execution condition to the outside by increasing the number of data terminals used.

FIG. 37 is a diagram of signal waveforms illustrating the manner how the state of test execution is output to the outside, by increasing the number of data terminal used.

Referring to FIG. 37, assume that setting for starting the operation of BIST is done before the time point t1. When an active command ACT is executed inside of BIST at time t1, data of commands and address internally set correspondingly are output as data train D11 from respective data terminals.

At time t2, the write command is executed inside. In responses, the data of command which is being executed and data of the address used are output as data train D12.

At time t3, when the read command is executed internally, the data corresponding to the command and address used inside are output from the data terminals.

The data read from internal memory array are output from respective data terminals in the similar manner as in the operation described with reference to FIG. 33 after time point t4.

The arrangement of data in data trains D11 and D12 are the same as the arrangement described with reference to FIG. 22. Therefore, description thereof is not repeated.

In this manner, it becomes possible to monitor the internal state without increasing the number of data terminals used, even in the case of BIST. More specifically, it is possible to output not only the result of determination, that is, pass or fail but also to output tie result of comparison by the unit of repairment using redundant memory array, in order to confirm whether the repairing by the spare memory cell is collectively done or not.

When the data indicative of the internal state is provided from the synchronous semiconductor memory device, the strobe signal QS is also provided, so that it is possible for the test apparatus to recognize the data output period.

Accordingly, when BIST is executed, internal state can also be monitored by the test apparatus, and therefore the result of operation can be confirmed with higher reliability, and when there is any trouble, it is easier to find the cause.

First Modification of the Third Embodiment

Figure 38:
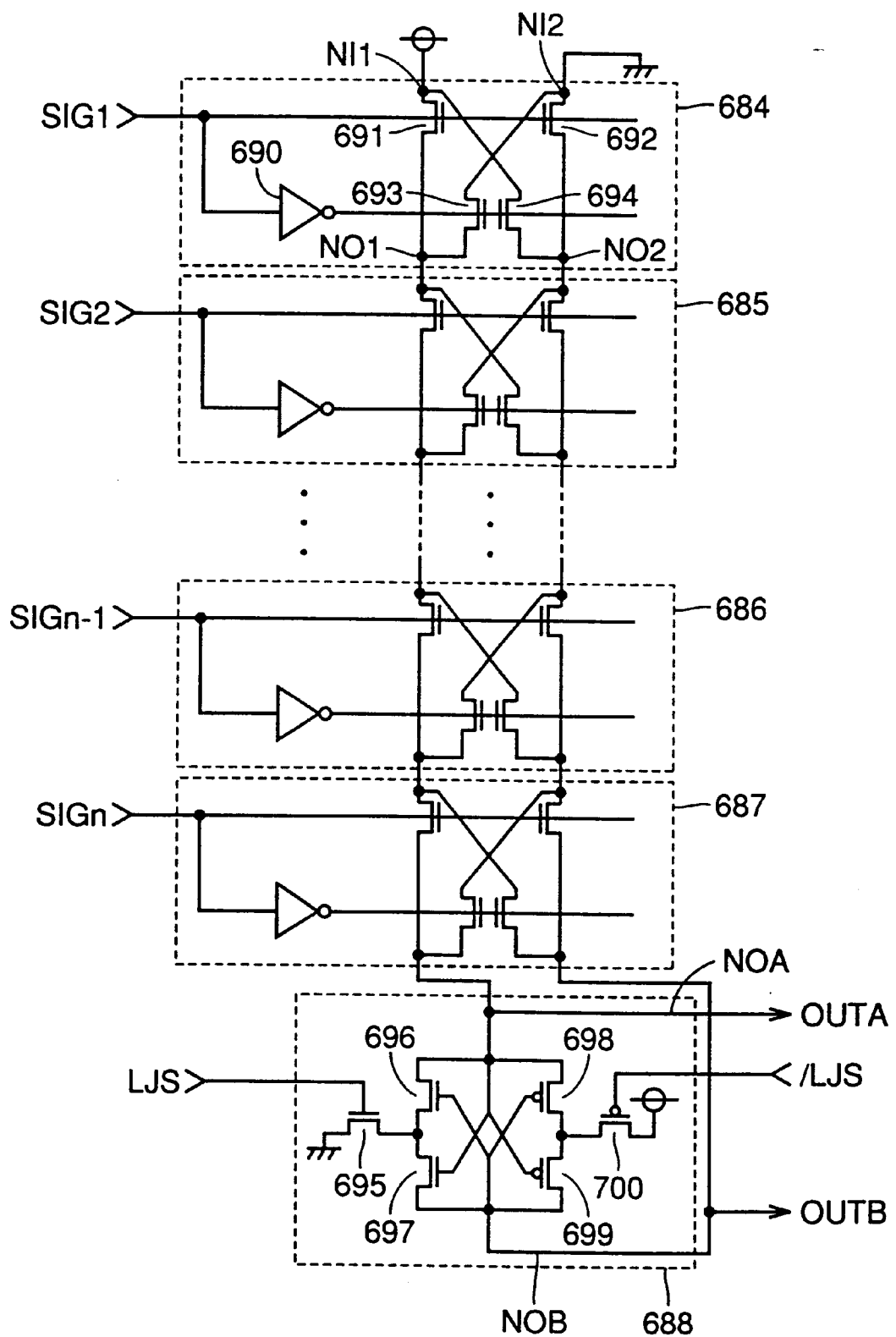
FIG. 38 is a circuit diagram showing a structure of a data reduction circuit used in a first modification of the third embodiment.

FIG. 38 is a circuit diagram showing a structure of a data reduction circuit used in a first modification of the third embodiment.

The data reduction circuit is used for lowering the period of output data or to reduce the number of pins, when the internal state is output during execution of BIST in the third embodiment.

Referring to FIG. 38, signals representing internal commands, address data and so on are applied as signals SIG1 to SIGn. The data reduction circuit includes switch circuits 684, 685, . . . , 686, 687 provided corresponding to signals SIG1, SIG2, . . . , SIGn−1 and SIGn, respectively, and a sense amplifier 688 receiving and amplifying an output from switch circuit 687.

The power supply potential and the ground potential are respectively applied to input node NI1 and NI2 of switch circuit 684.

Output nodes NO1 and NO2 of switch circuit 684 are connected to input nodes NI1 and NI2 of switch circuit 685, respectively. Similarly, output nodes NO1 and NO2 of switch circuit 686 are mutually connected to input nodes NI1 ad NI2 of switch circuit 687. Switch circuits are connected in series between switch circuits 685 and 686, and to input nodes NI1 and NI2 of m (natural number) th input signal SIGm, output nodes NO1 and NO2 of the switch circuit provided corresponding to m-1th input signal are connected.

Output nodes NO1 and NO2 of nth switch circuit 687 which is the last stage are connected to input/output nodes NOA and NOB of sense amplifier 688.

Switch circuit 684 includes: an inverter 690 receiving and inverting the signal SIG1; an N channel MOS transistor 691 connected between input node NI1 and output node NO1 and receiving at its gate the signal SIG1; an N channel MOS transistor 692 connected between input node NI2 and output node NO2 and receiving at its gate the signal SIG1; an N channel MOS transistor 694 connected between input node NI1 and output node NO2 and receiving at its gate an output from inverter 690; and an N channel MOS transistor 693 connected between input node NI2 and output node NO1 and receiving at its gate an output of inverter 690.

Switch circuits 685 to 687 have the similar structure as switch circuit 684. Therefore, description is not repeated.

Sense amplifier 688 includes: N channel MOS transistors 696 and 697 connected in series between input/output nodes NOA and NOB; P channel MOS transistors 698 and 699 connected in series between input/output nodes NOA and NOB; an N channel MOS transistor 695 connected between ground node and a connection node of N channel MOS transistors 696 and 697 and receiving at its gate a logic determination signal LJS; and a P channel MOS transistor 700 connected between a connection node of P channel MOS transistors 698 and 699 and a power supply node and receiving at its gate a logic determination signal/LJS.

N channel MOS transistor 697 and F channel MOS transistor 699 have their gates both connected to input node NOA. N channel MOS transistor 696 and P channel MOS transistor 698 have their gate connected to input node NOB.

The operation of the data reduction circuit will be described briefly. When the number of signals having the logic level of H high) among input signals SIG1 to SIGn is an even number, the output signal OUTA attains to the H level and the output signal OUTB attains to the L level. If the number of signals having the logic level of H among input signals SIG1 to SIGn is an odd number, the output signal OUTA attains to the L level and the output signal OUTB attains to the H level. More specifically, data of H and L levels respectively are applied to input nodes NI1 and NI2 of the first switch circuit 94, and when the input signal SIGi is at the H level, the data are transmitted as they are to corresponding output nodes NO1 and NO2. When the input signal SIG1 is at the L level, the data applied to input node NI1 is output to output node NO2, while the data applied to input node NI2 is output to output node NO1.

More specifically, when the input signal SIGn is at the H level, switch circuits 684 to 687 provide the input data as they are to the corresponding output nodes, and when the input signal SIGn is at the L level, the switch circuits switches the data applied to input nodes NI1 and NI2 and provides the switched data to output nodes NO1 and NO2. Therefore, it is possible to determine whether the number of signals which are at the H level among input signals SIG1 to SIGn is an even number or odd number.

Signals representing commands, address signals and so on may be input as signals SIG1 to SIGn.

Therefore, it is possible to output data which have been output in 4 cycles as in the case of data train D11 of FIG. 37 in 1 cycle.

Figure 39:
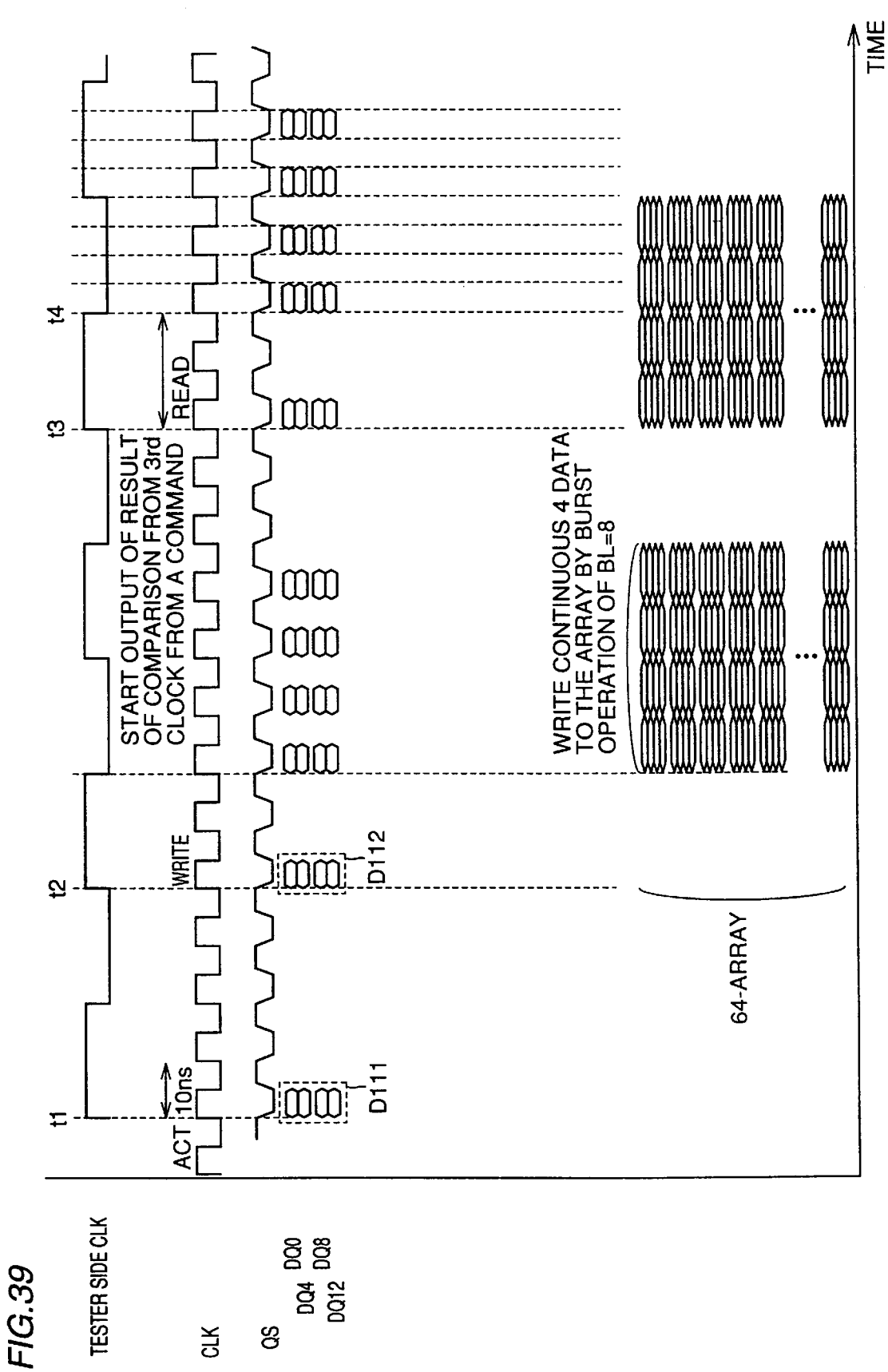
FIG. 39 is a diagram of waveforms representing an operation in which command and address data are reduced and used.

FIG. 39 is a diagram of signal waveforms showing an operation where commands and address data are reduced to be used.

Referring to FIG. 39, at time t1, internal data information D111 corresponding to active command ACT is output. By using the circuit shown in FIG. 38, it becomes possible to compress and output the data train D11 of FIG. 37 in this manner. Similarly, at time points t2 and t3, data corresponding to commands or the like are compressed and output. After time point t4, data are also compressed and output in the similar manner, and therefore it is possible to check output data at a data rate one half that of FIG. 37.

As to the result of determination of data, 64 bits of data of each cycle are output allocated to 4DQ, the output of result is provided in a period in which the strobe signal QS is at the L level. In this manner, the number of data pins for the output data can be reduced, and the data rate of the output data can be reduced. Therefore, it becomes possible to monitor outputs by an inexpensive low power tester.

Fourth Embodiment

The latch configuration at the data input/output terminal portion may be utilized as an interface for testing a clock generating circuit such as a DLL (delayed locked loop) circuit mounted on the synchronous semiconductor memory device.

Various circuits are mounted on the semiconductor memory device. The DLL circuit is one of them, which circuit includes a closed loop for adjusting clocks internally. Therefore, it is difficult to confirm its operation.

The fourth embodiment proposes a method of externally confirming the operation of the clock generating circuit such as the DLL circuit.

There are 6 possible items to be tested in the DLL circuit. The first item is lock time and whether an external clock and an internally generated clock are locked within a prescribed clock cycle or not is determined.

The second item is offset of locking caused by noise, and for this item, the time for relocking is confirmed by a power supply noise test and a jitter is confirmed.

The third item is a unit delay of the delay stage, which is determined by inspecting all stages of the delay elements.

The fourth item is an operation of the phase comparator, and whether the operation is successful or not is determined by determination error of the phase comparator.

The fifth item is characteristics of the counter and the shift register, which are confirmed by examining counting operation of the counter and up/down counting operation of the shift register.

The sixth item is an offset (offset in dummy delay) at the time of locking, which is addressed by adjusting offset by tuning the amount of delay of the dummy delay circuit.

For the above described six items, 9 tests, that is, test A to test I, which will be described in the following, are performed appropriately combined.

In test A, an up/down pulse output from the phase comparator is output as H/L data. In this test, 2 pins of data terminals are used to output the signal UP from data terminal DQ0 and the signal DOWN from data terminal DQ1, and when these output signals are both at the L level, it is determined that the DLL clock has been locked.

In test B, control from the phase comparator is shut off, the DLL circuit is operated as a simple delay circuit, and an output delay relative to the external clock is monitored.

In test C, the externally applied complementary clock signals are input not as complementary clock inputs but as clock signals with phase difference, to two inputs of the phase comparator.

In test D, the dummy delay circuit provided in the DLL circuit is tuned.

In test E, H level and L level data are output alternately using a clock edge of the internal clock generated in the DLL as a reference, enabling monitoring of the edges of the internal clock.

In test F, an output value of the counter is forcedly set from the outside, so that the amount of delay of the delay stage is set externally, and the amount of delay is monitored externally.

In test G, the signals UP and DOWN output from the phase comparator are forcedly input from the outside, to operate the counter.

In test H, an output value of the counter is externally provided and monitored.

In test I, internal data is output at an external clock edge, and therefore it is possible to monitor the data of the internal circuits even when the internal clock is in an unstable state.

By combining tests A to I described above, the first to sixth test items are confirmed.

More specifically, the item 1 (lock time) is confirmed by test (A+I) and test (E+I).

Here, test (A+I) represents that the test A and I are performed combined with each other.

Item 2 (offset of locking caused by noise) is confirmed by performing test A while applying noise, or by performing test E while applying noise.

Item 3 (unit delay of the delay stage) is confirmed by test (F+B+E) and test (G+B+E).

Item 4 (phase comparator) is confirmed by test (C+E) and test (C+A).

Item 5 (counter, shift register characteristics) is confirmed by test (G+E) and test (G+H).

Item 6 (offset at the time of locking) is confirmed by performing test (D+E+A).

Configurations necessary for the tests A to I will be described in the following.

Configuration Necessary for Test A, Test H and Test I

Generally, DLL has a standard on the time from power on of the chip until stable oscillation is established. It is convenient if an output of the phase comparator contained in the DLL circuit can be monitored externally, to confirm the time until the stable oscillation is established.

Figure 40:
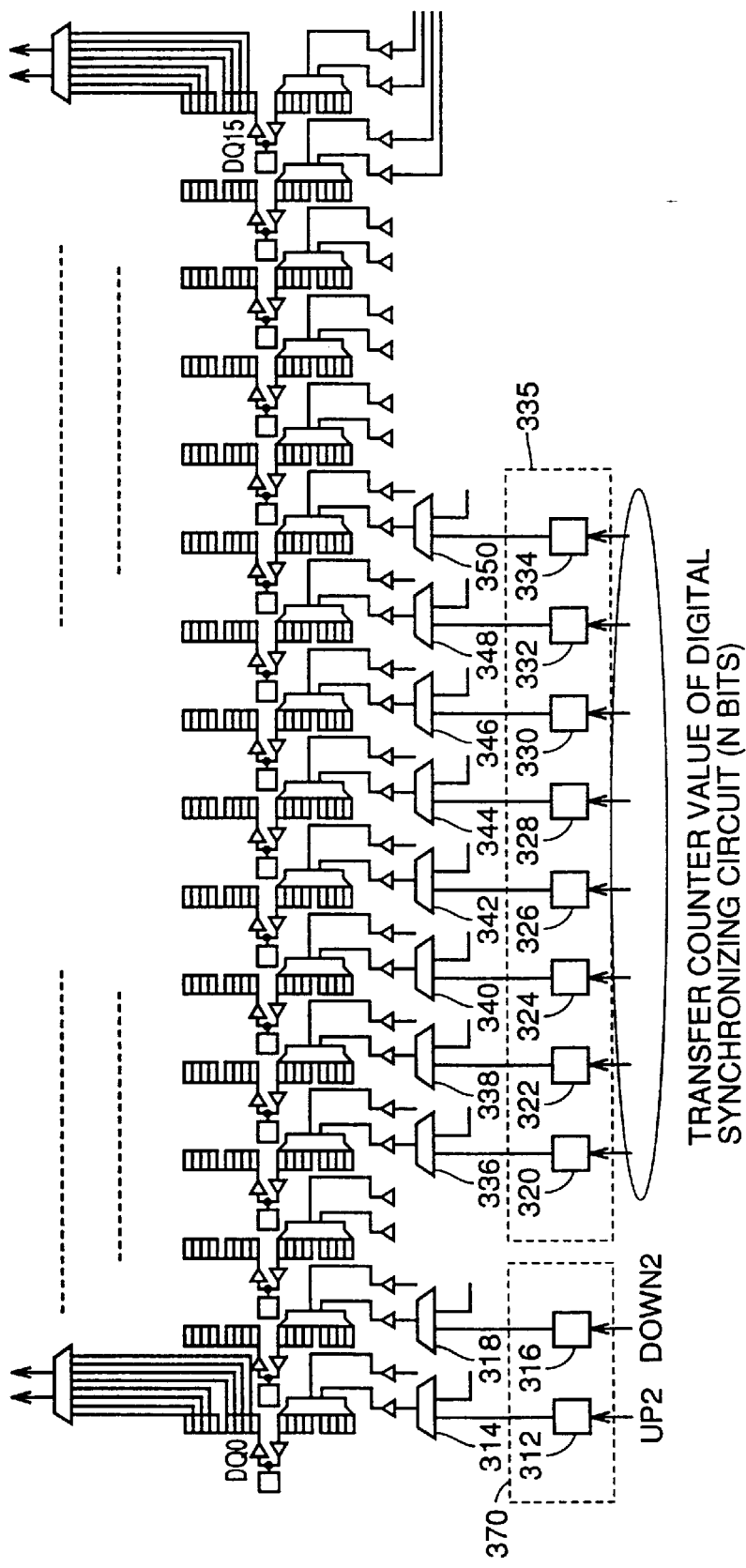
FIG. 40 shows a structure of a data input/output circuit in accordance with a fourth embodiment.

FIG. 40 shows a structure of the data input/output circuit in accordance with the fourth embodiment.

Referring to FIG. 40, the data input/output circuit portion includes: a check circuit 370 receiving signals UP2 and DOWN2 from the phase comparator in a test mode; a selector 314 for transmitting an output from. check circuit 370 to the input/output circuit in place of the signal on the lead data bus in the test mode; a selector 318 for transmitting an output signal from check circuit 370 to the input/output circuit portion in place of the signal on the lead data bus in the test mode; a check circuit 335 receiving a count value of a digital synchronizing circuit; and selecters 336 to 350 for transmitting an output from check circuit 335 to the input/output circuit portion in place of the signal on the lead data bus, in the test mode.

Check circuit 370 includes a check circuit 312 receiving the signal UP2 and outputting it to selector 314, and a check circuit 316 receiving the signal DOWN2 and outputting it to selector 318.

Check circuit 335 includes check circuits 320 to 334 receiving respective bits of an N bit counter included in the DLL circuit and outputting the received bits to selectors 336 to 350 in a check mode.

Except these differences, the structure is the same as that of the first embodiment. Therefore, description thereof is not repeated.

Figure 41:
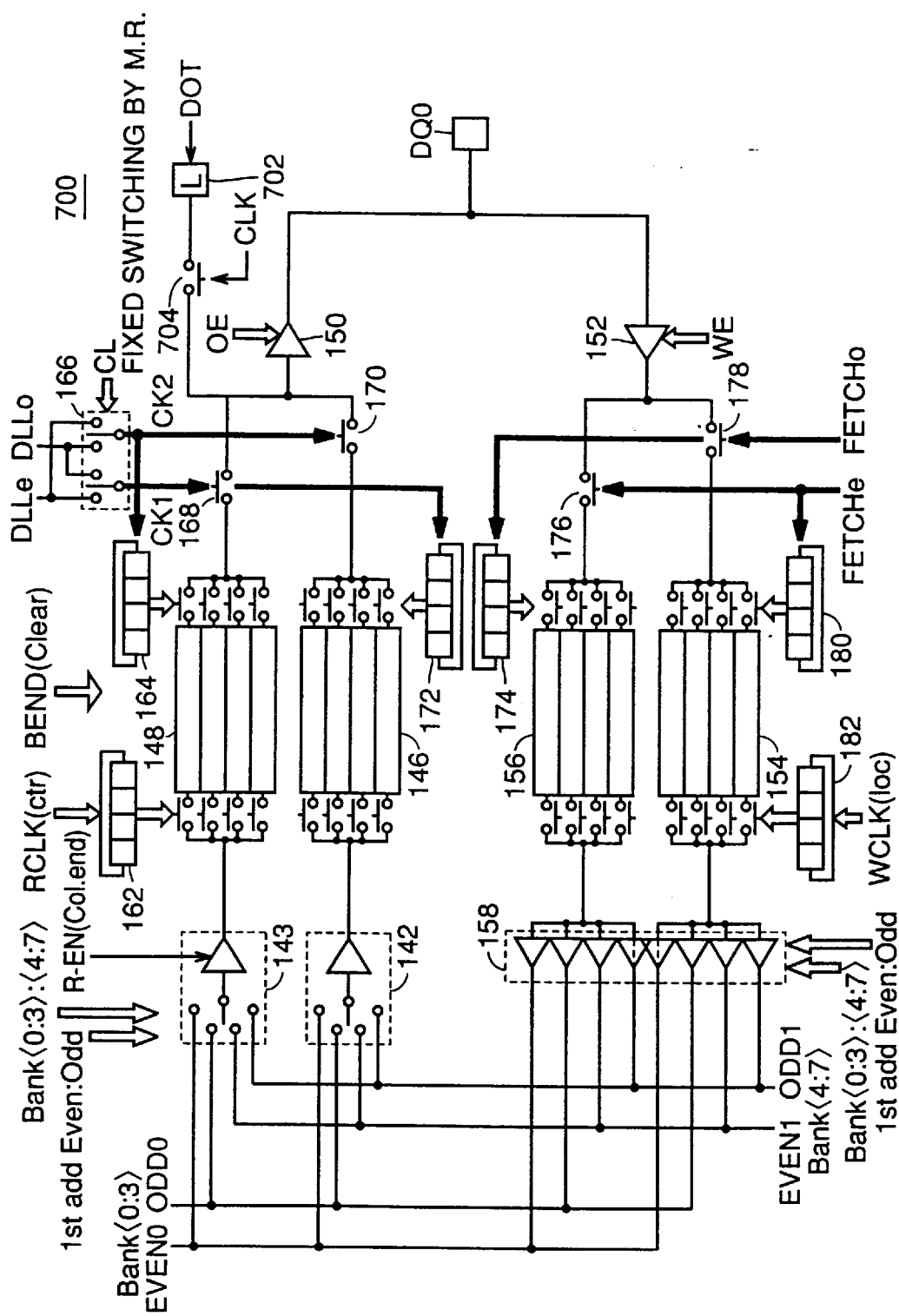
FIG. 41 is a circuit diagram showing a structure of an input/output circuit portion provided at each DQ terminal.

FIG. 41 is a circuit diagram showing a configuration of an input/output circuit portion provided at each DQ terminal.

Referring to FIG. 41, an input/output circuit 700 includes a latch 702 receiving counter output and data from the phase comparator, and a switch circuit 704 for applying an output of the latch to an input of an output buffer 150 in synchronization with the external clock signal CLK. The circuit differs from the input/output circuit 64 shown in FIG. 10 of the first embodiment in these points. Except these points, the configuration is the same as that of input/output circuit 64, and therefore, description thereof is not repeated.

The data of latch 702 is output to data terminal DQ in synchronization with the external clock. At this time, output clocks of switch circuits 18 and 170 are inactivated. Therefore, even when the internal clock is unstable, the data of latch 702 can be monitored in synchronization with the outside.

Figure 42:
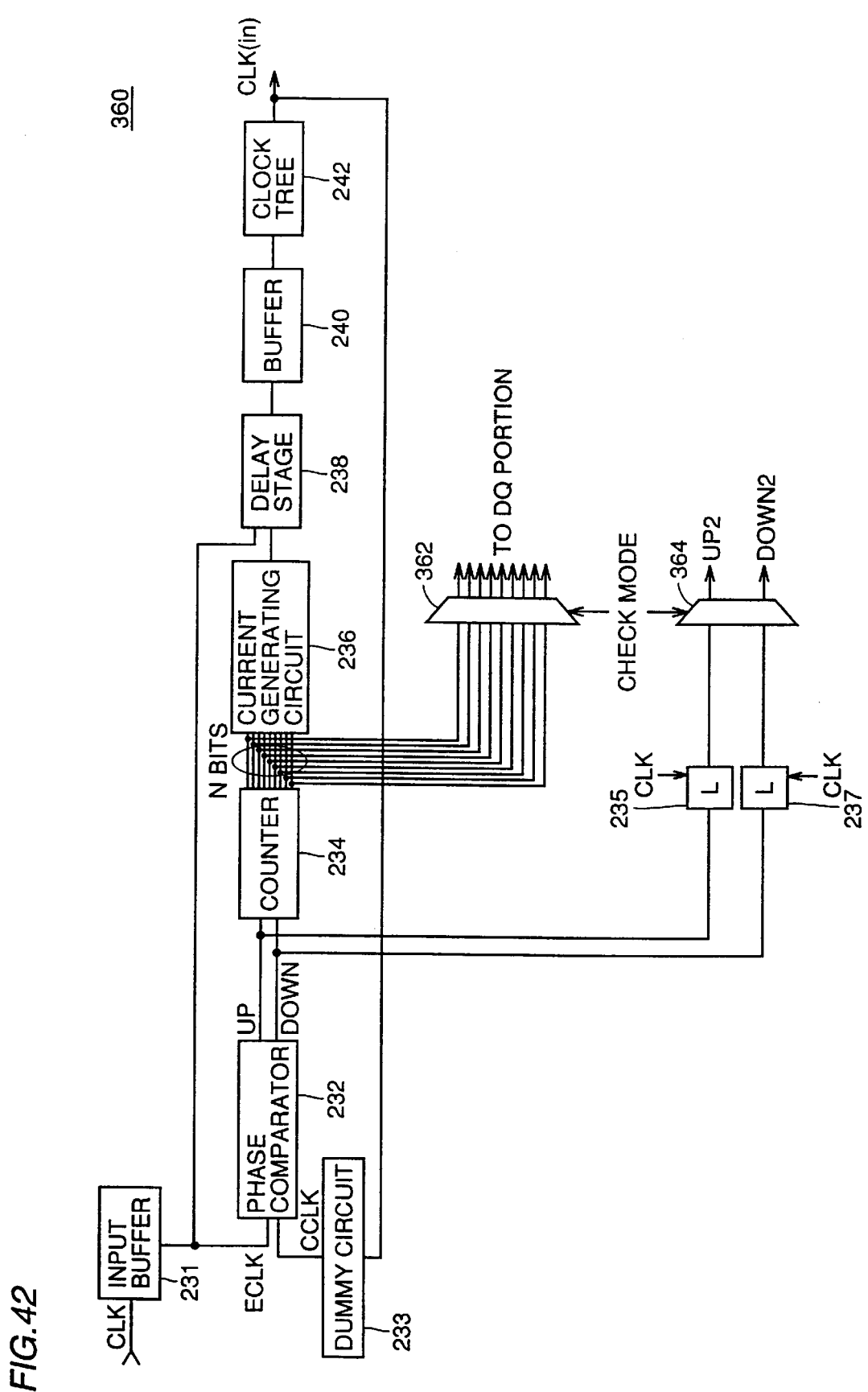
FIG. 42 is a block diagram representing a structure of a DLL circuit 360 with a check mode, used in the fourth embodiment.

FIG. 42 is a block diagram illustrating a structure of a DLL circuit 360 with the check mode, used in the fourth embodiment.

Referring to FIG. 42, DLL circuit 360 is different from DLL circuit 30 in accordance with the first embodiment in that it includes a latch circuit 235, 237 receiving output signals UP and DOWN from phase comparator 232, a check circuit 364 receiving the output of latch circuit 235, 237 and outputting these signals as signals UP2 and DOWN2 in the check mode, and a check circuit 362 receiving N bits output from counter 234 and outputting the same to check circuit 339 at the data terminal portion in the check mode. Except this point, the structure is the same as the DLL circuit 30 described with reference to FIG. 15. Therefore, description thereof is not repeated.

Figure 43:
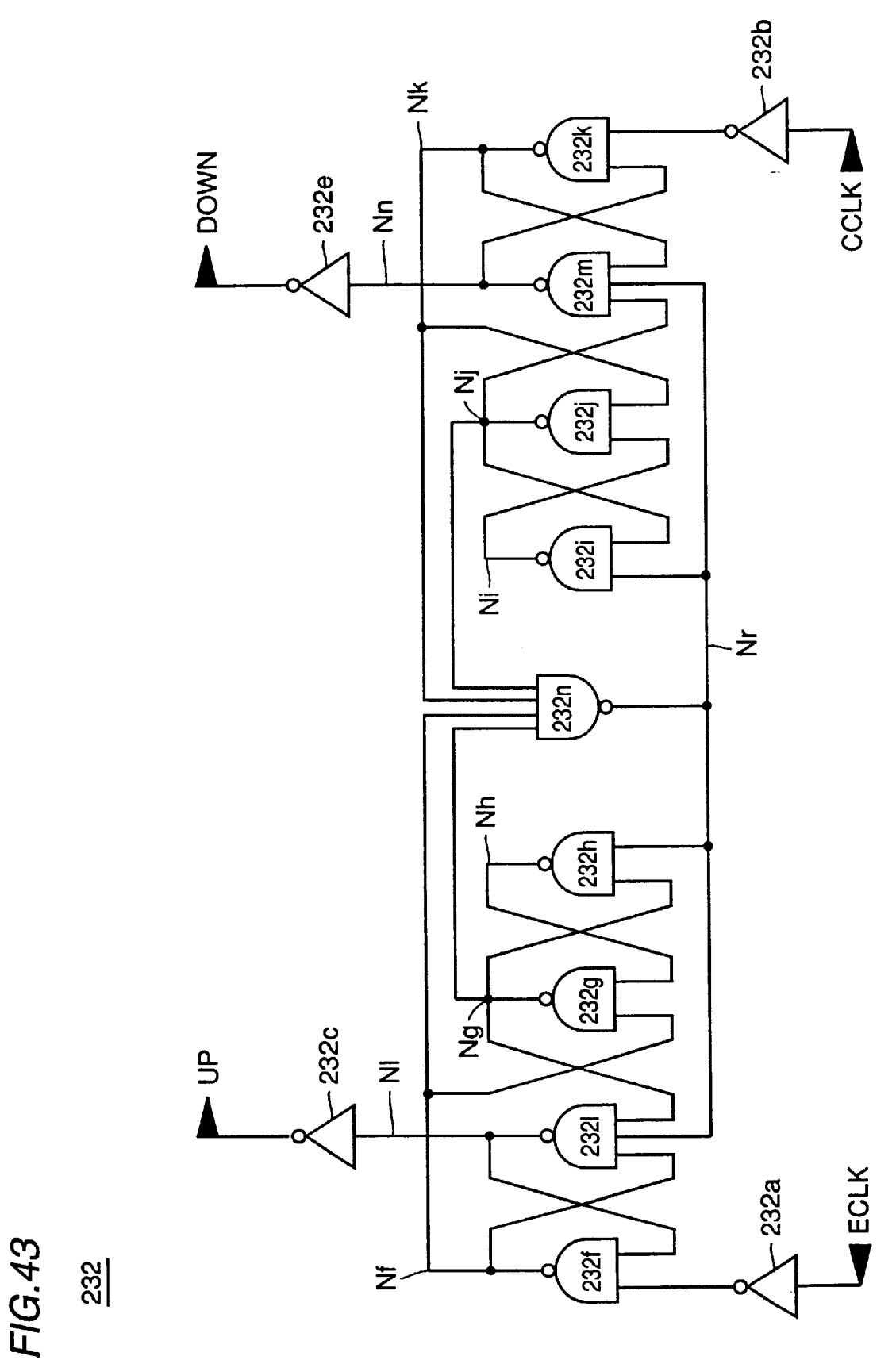
FIG. 43 is a circuit diagram showing a structure of a phase comparator 232.

FIG. 43 is a circuit diagram showing a configuration of a phase comparator 232.

Referring to FIG. 43, phase comparator 232 includes: an inverter 232a receiving and inverting a clock signal ECLK; an NAND circuit 232f receiving an output of inverter 232a and a potential at a node N1 and having an output connected to a node Nf; an NAND circuit 232l having inputs connected to nodes Nf, Nr and Ng and an output connected to node N1; an NAND circuit 232g having inputsS connected to nodes Nf and Nh and an output connected to node Ng; an NAND circuit 232h having inputs connected to node Ng and Nr and an output connected to node Nh; and an inverter 232c having an input connected to node N1 and outputting a control signal UP.

Phase comparator 232 further includes: an inverter 232b receiving a clock signal CCLK; an NAND circuit 232k receiving an output of inverter 232b and a potential at node N and having an output connected to a node Nk; an NAND circuit 232m having inputs connected to nodes Nj, Nr and NK: and an output connected to node Nn; an NAND circuit 232j having inputs connected to nodes Ni and Nk and an output connected to node Nj; an NAND circuit 232i having inputs connected to nodes Nr and Nj and an output connected to node N1; an NAND circuit 232n having inputs connected to nodes Ng, Nf, Nk and Nj and an output connected to Nr; and an inverter 232e having an input connected to node Nn and outputting a control signal DOWN.

Figure 44:
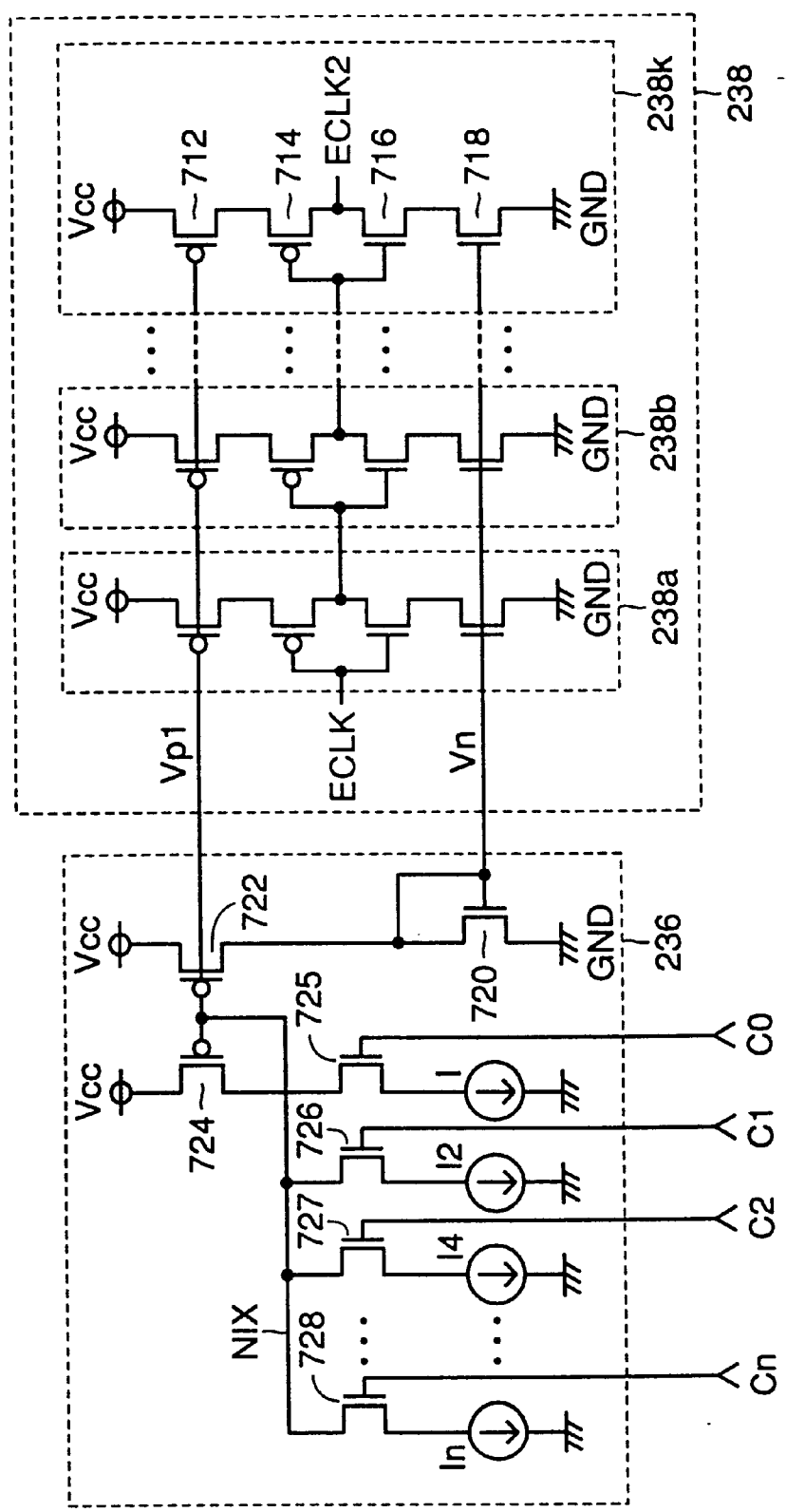
FIG. 44 is a circuit diagram showing structures of a current generating circuit 286 and a delay stage 228 shown in pig. 42.

FIG. 44 is a schematic diagram showing figurations of a current generating circuit 236 and a delay stage 238 shown in FIG. 42.

Referring to FIG. 44, current generating circuit 236 includes: a P channel MOS transistor 724 having its source coupled to power supply potential Vcc and its gate and dry connected to a node NIX; an MOS transistor 725 and a constant current source I connected in series between node NIX and the ground node; an N channel MOS transistor 726 and a constant current source I2 connected in series between node NIX and the ground node; an N channel MOS transistor 727 and constant current source I4 connected in series between node NIX and the ground node; and an N channel MOS transistor 728 and a constant current source In connected in series between node NIX and the ground node. Output signals C0, C1, C2 and Cn from the counter are applied to the gates of N channel MOS transistors 725, 726, 727 and 728, respectively. Current generating circuit 236 further includes a P channel MOS transistor 722 having its source coupled to the power supply potential Vcc and its gate connected to node NIX, and an N channel MOS transistor 720 connected between the drain of p channel MOS transistor 722 and the ground node and having its gate connected to the drain.

Between constant current source I4 and the constant current source In, a current source having the current amount of $2^m$ of the plurality of constant current sources I (m: natural number) is provided.

Delay stage 238 includes inverters 238a to 238k connected in series, receiving the clock signal ECLK as well as control signals Vp1 and Vn. An output from inverter 238k is the clock signal ECLK2.

Inverter 238k includes P channel MOS transistors 712 and 714 connected in series between a power supply node and an output node; and N channel MOS transistors 716 and 719 connected in series between the output node and the ground node. P channel MOS transistor 712 receives at its gate the control signal VP1. N channel MOS transistor 718 receives at its gate the control signal Vn. P channel MOS transistor 714 and N channel MOS transistor 716 have their gates connected to an input node.

Inverters 238a and 238b also have the similar structure as inverter 238k.

Figure 45:
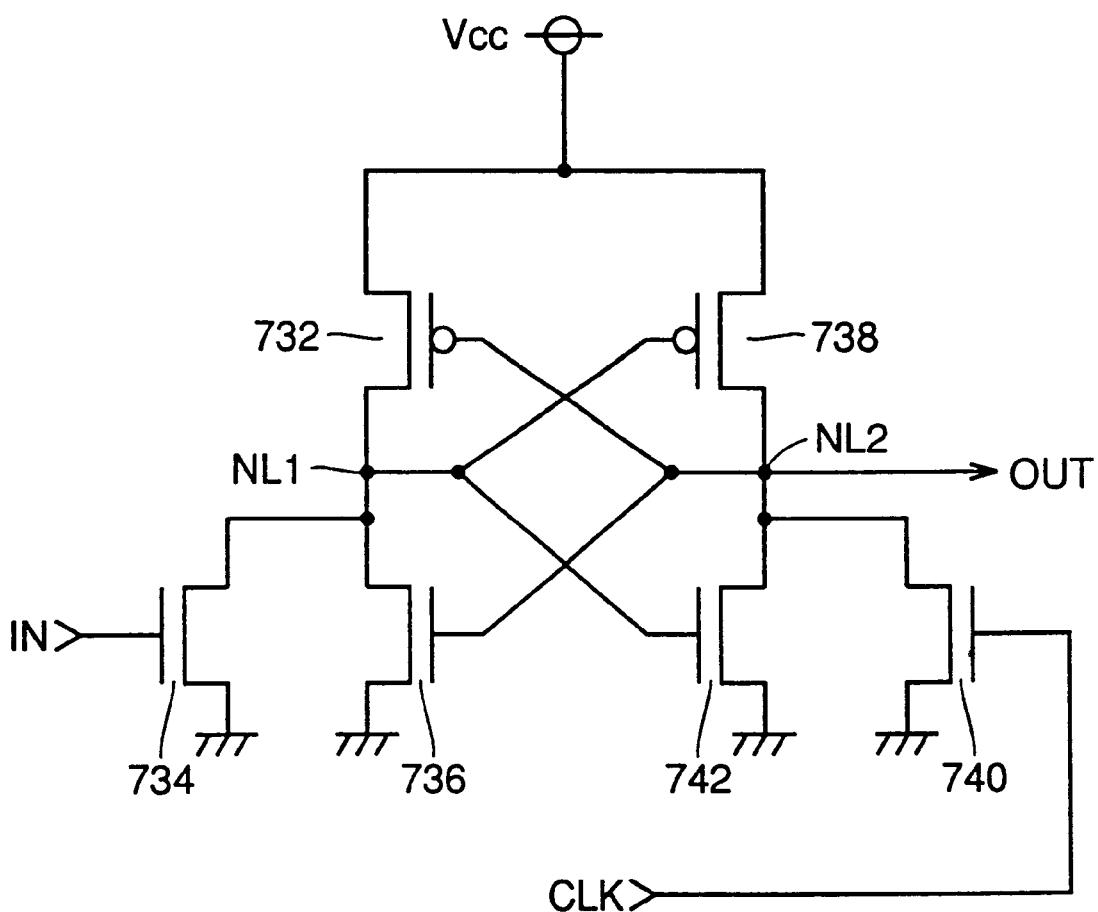
FIG. 45 is a circuit diagram showing a structure of latch circuit 235 shown in FIG. 42.

FIG. 45 is a circuit diagram showing a configuration of latch circuit 235 shown in FIG. 42.

Referring to FIG. 45, latch circuit 235 includes an N channel MOS transistor 734 connected between a node NL1 and the ground node and receiving at its gate an input signal IN, an N channel MOS transistor 736 connected between node NLI and the ground node and having its gate connected to a node NL2, and a P channel MOS transistor 732 connected between node NL1 and a power supply node and having its gate connected to node NL2. The output signal UP from phase comparator 232 is input as input signal IN.

Latch circuit 235 further includes an N channel MOS transistor 740 connected between node NL2 and the ground node and receiving at its gate the clock signal CLK, an N channel MOS transistor 742 connected between node NL2 and the ground node and having its gate connected to node NL1, and a P channel MOS transistor 738 connected between node NL2 and the power supply node and having its gate connected to node NL1.

An output signal OUT of the latch circuit is provided from node NL2.

Latch 237 of FIG. 42 has similar circuit configuration, and therefore, description thereof is not repeated.

As the phase comparison output is temporarily held by such a latch, even when the output signal of the phase comparator has narrow pulse width, the pulse is adjusted to have the clock width, and therefore monitoring when externally output is facilitated.

Figure 46:
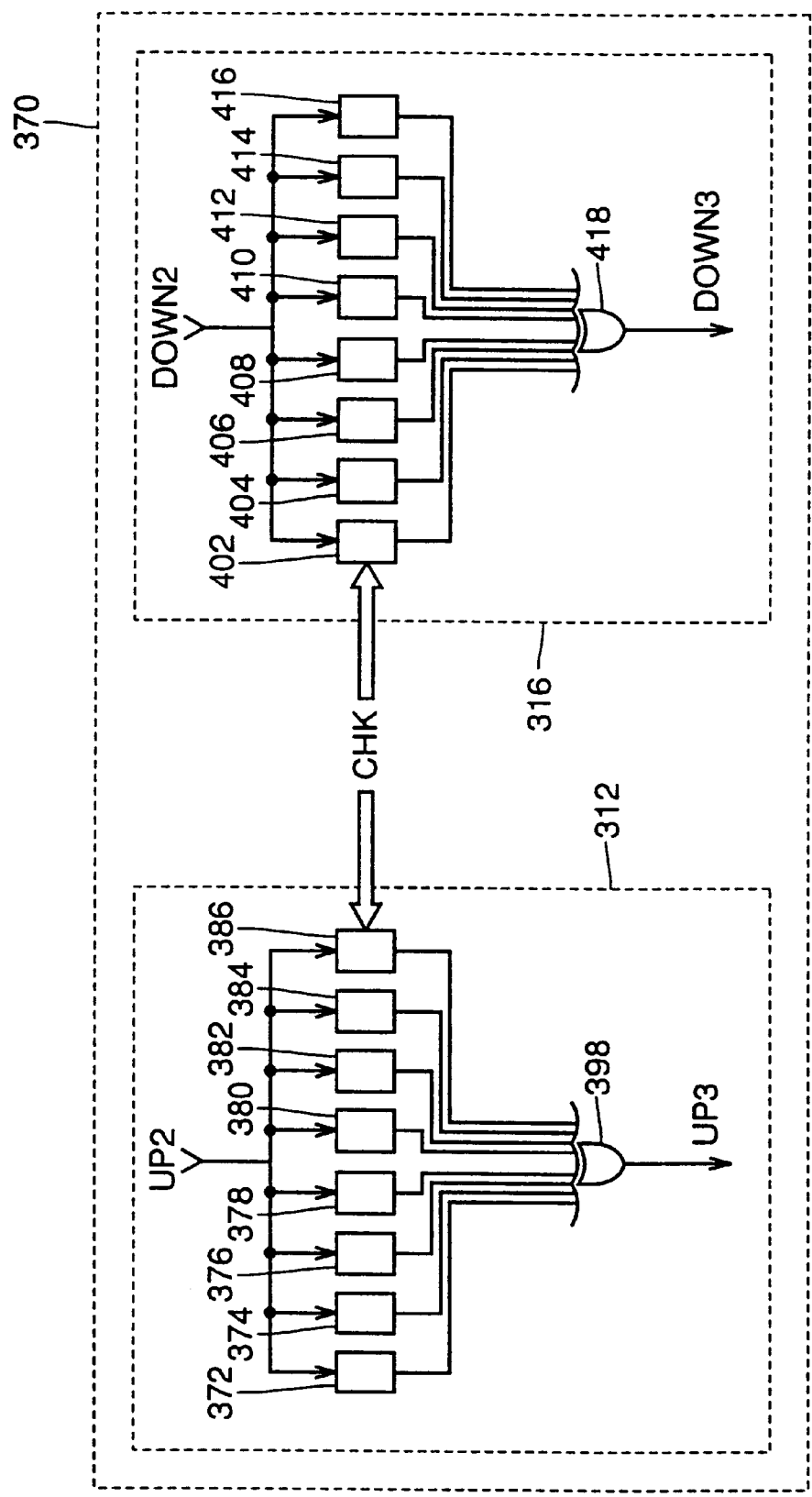
FIG. 46 is a circuit diagram showing a structure of a check circuit 970 transmitting result of checking phase comparator output to the input/output circuit portion.

FIG. 46 is a circuit diagram showing the structure of check circuit 370 which transmits the result of checking phase comparator output to the input/output circuit portion.

Referring to FIG. 46, check circuit 370 includes a check circuit 312 receiving the output signal UP2 of the phase comparator and a check circuit 316 receiving the output signal DOWN2 of the phase comparator. Check circuit 312 includes 8 latches 372 to 386 receiving the signal UP2, and an EXOR circuit 398 for checking matching, receiving outputs from latches 372 to 386.

Data is taken in any one of the latches 372 to 386 at every clock cycle. The latch to take the data in is shifted cycle by cycle. Therefore, in the example shown in FIG. 46, variation of output signals UP2 corresponding to 8 cycles can be determined by EXOR circuit 398 as there are 8 latches. As initial values, alternately inverted data are set in latches 372 to 386.

Check circuit 316 includes latches 402 to 416 taking the output signal DOWN2 of the phase comparator as data, and an EXOR circuit 418 receiving output data from latches 402 to 416 for checking matching. Data, is taken in any one of the latches 402 to 416 in every clock cycle. The latch to take in the data is shifted cycle by cycle. Therefore, variation of the output signal DOWN2 corresponding to 8 cycles can be determined by EXOR circuit 418, as there are 8 latches in the example f FIG. 46.

In the fourth embodiment, it is possible to perform test A, test H and test I by the configuration shown in FIGS. 40, 41, 42 and 46. Therefore, lock in of the DLL circuit (within 100 clocks after power on) can readily be confirmed.

Though 8 latches are used in FIG. 4G, stabilization for longer period of time can be determined if the number of latches is increased. Further, as additional 8 latches are provided in the input/output circuit portion, change in stability of the DLL circuit for a longer period can be monitored by reading data taken in these latches.

Configuration for Performing Test B

Figure 47:
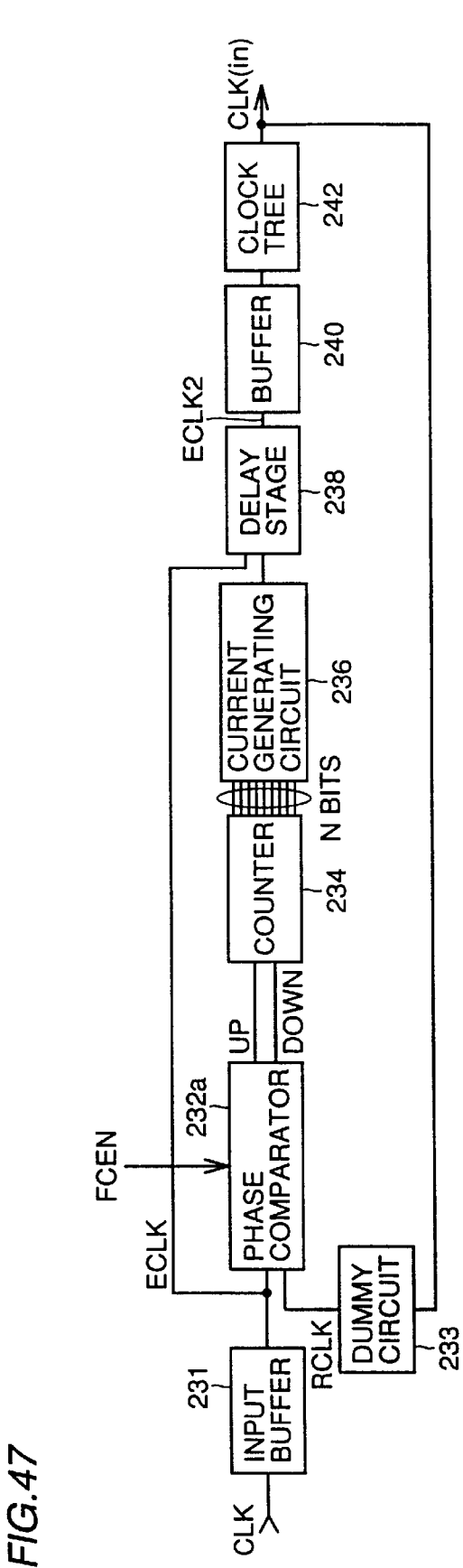
FIG. 47 is an illustration related to a structure for invalidating an output of the phase comparator.

FIG. 47 is an illustration related to a configuration for invalidating an output of the phase comparator.

Referring to FIG. 47, the DLL circuit differs from a common DLL circuit shown in FIG. 15 in that an inactivating signal FCEN is input to phase comparator 232a. When FCEN is set to the L level, signals UP and DOWN output from phase comparator 232a are both fixed at the L level.

As the phase comparator is inoperative, the value of counter 234 is not changed. Therefore, the external clock CLK is delayed by the delay time in accordance with the presently set output value of the counter, and distributed to the inside of the chip as an internal clock. By monitoring the internal clock, it is possible to confirm the function of delay stage 238.

Configuration for Performing Test C

Test C is performed mainly for confirming operation of the phase comparator.

By the configuration described in the following, sensitivity of the phase comparator of the DLL circuit can be monitored from the outside.

Figure 48:
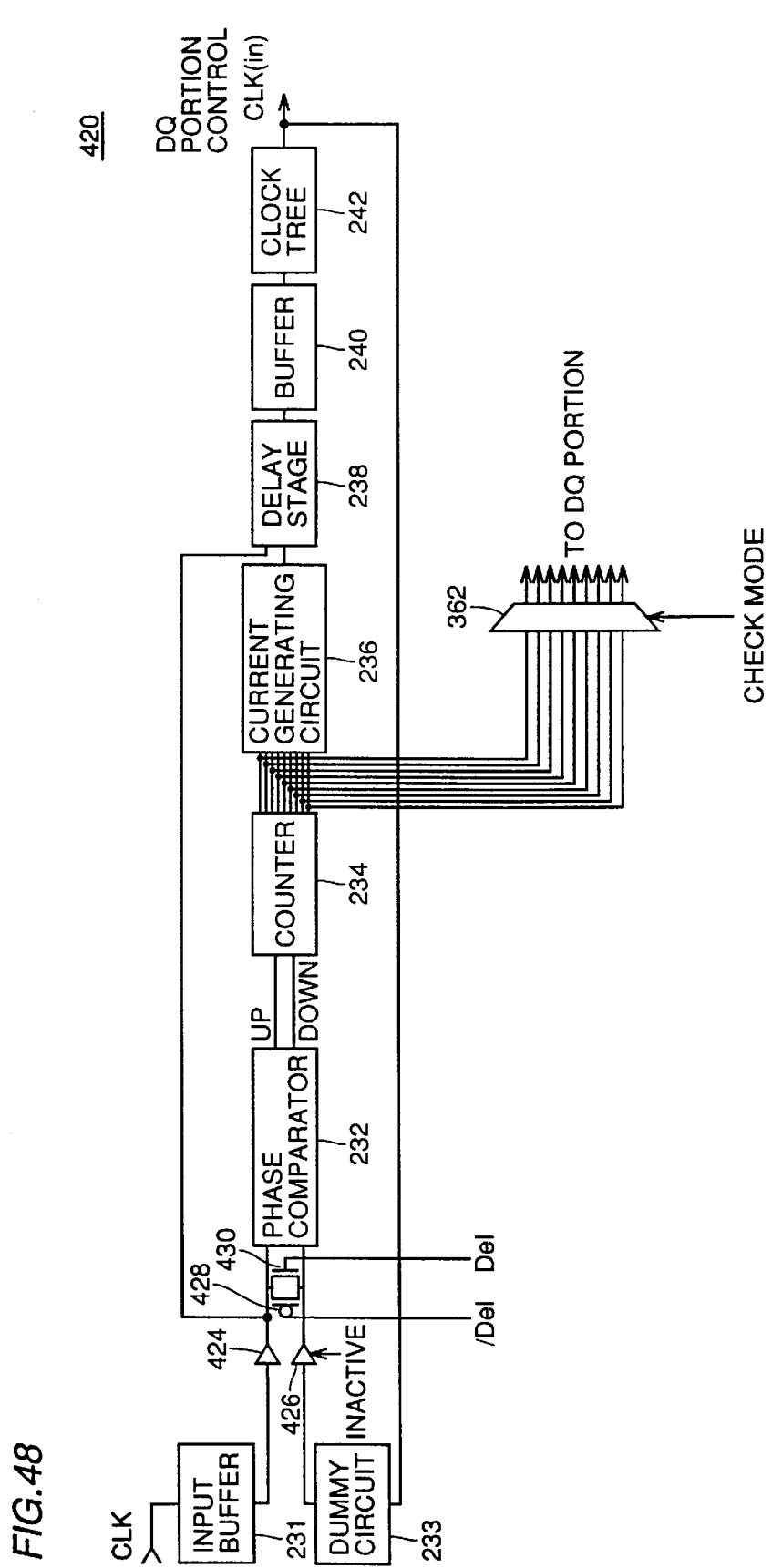
FIG. 48 is a circuit diagram showing a structure of DLL circuit 420.

FIG. 48 is a circuit diagram showing a structure of a L circuit 420.

Referring to FIG. 48, DLL circuit 420 differs from the DLL circuit shown in FIG. 20 in that it includes, in place of check circuit 364 and latches 235, 237, a buffer 424 receiving and transmitting to the phase comparator the external clock, a buyer 426 receiving and transmitting to the phase comparator the internal clock, an N channel MOS transistor 430 connected between two inputs of the phase comparator and receiving at its gate a signal Del, and a P channel MOS transistor 428 connected between two inputs of phase comparator 232 and receiving at its gate a signal /Del. Except this point, the structure is the same as DLL circuit 360 shown in FIG. 42. Therefore, description thereof is not repeated.

The operation of DLL circuit 420 at the time of testing will be described.

In the check mode, buffer 426 is set to an inactive state, and to the inputs of the phase comparator, an input signal from buffer 424 amplifying external clock VLK and the output signal from buffer 424 delayed by MOS transistors 428 and 430 are input.

Figure 49:
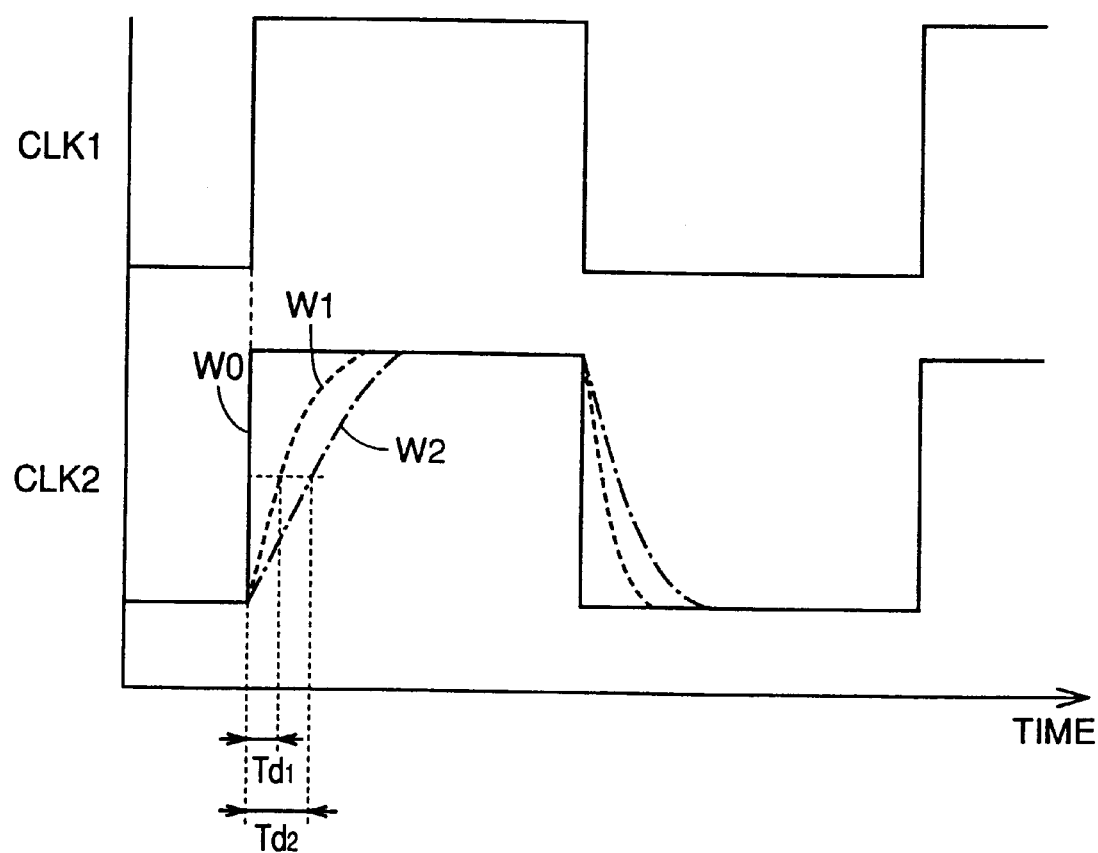
FIG. 49 is a diagram of waveforms representing testing of the phase comparator.

FIG. 49 is a diagram of waveforms illustrating the test of the phase comparator.

Referring to FIG. 49, a clock signal CLK1 which is the external clock amplified by the buffer is input to one input of the phase comparator, and a signal CLK2 which is the clock signal CLK1 delayed by MOS transistors 428 and 430 is input to the other input. Here, by changing potentials of control signals /Del and Del input to the gate of MOS transistors 428 and 430, resistance values of MOS transistors vary, and therefore the amount of delay changes. Therefore, when the potential is sufficient for activation and MOS transistors are sufficiently conductive, the waveform would be as shown by WO, and phase difference between two signals input to the phase comparator would be almost zero.

As the control signals /Del and Del are set closer to the inactive level, the waveform changes from W1 to W2, and phase difference between the signals input to the phase comparator changes as represented by Td1 and Td2. Therefore, by externally monitoring the output from counter 234, sensitivity of the phase comparator can be checked.

A configuration in which an input signal is directly applied to the phase comparator is also possible.

Figure 50:
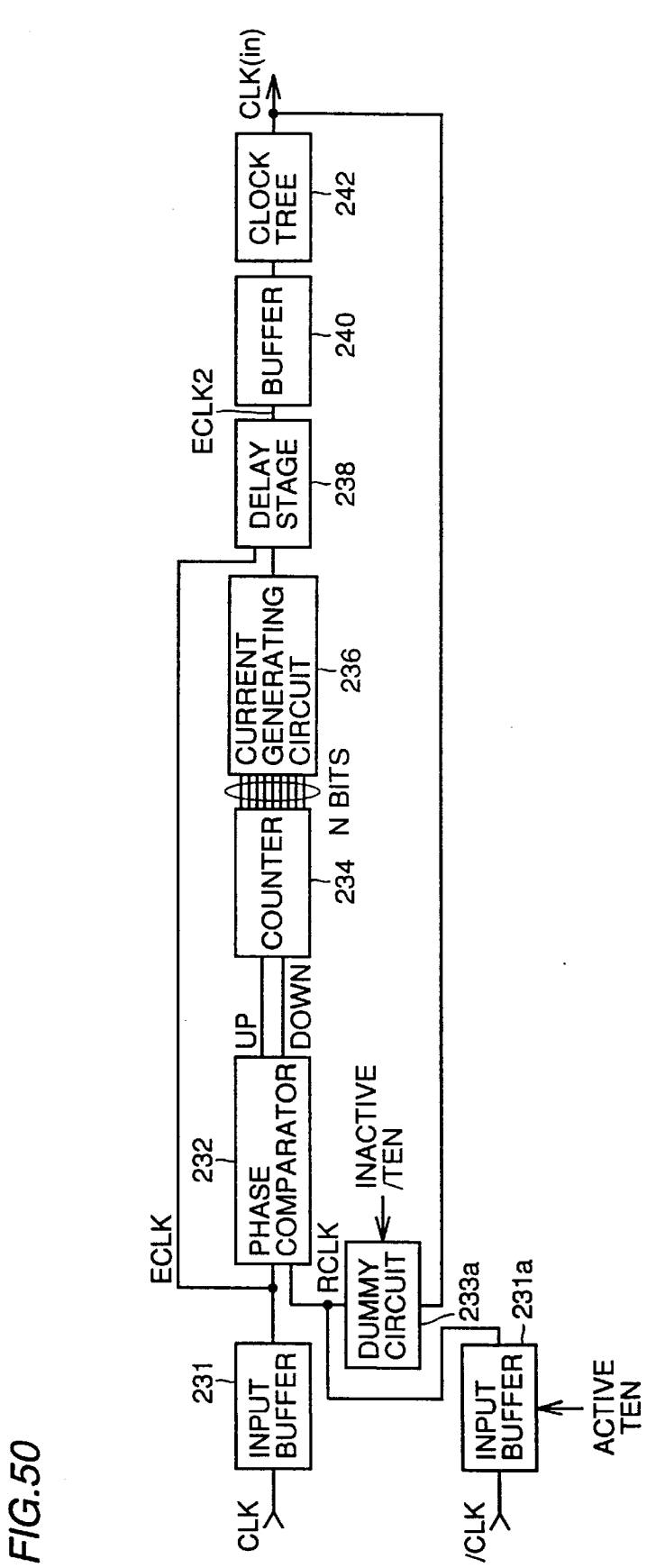
FIG. 50 is a block diagram showing a structure for providing an input to the phase comparator utilizing complementary external clocks.

FIG. 50 is a block diagram showing a configuration in which an input is applied to the phase comparator utilizing complementary external clocks.

Referring to FIG. 50, an input buffer 231a receiving complementary clock input signals /CLK is connected to an input node of the phase comparator. Input buffer 231a is activated when a signal TEN is set to H level in the test mode. A dummy circuit 233a is inactivated when the signal /TEN attains to the L level in the test mode.

Therefore, it becomes possible to directly input clock signals CLK and /CLK externally to the two input nodes of phase comparator 232. By externally inputting clock signal CLK and the complementary clock signal /CLK with a phase difference therebetween, it becomes possible to know the sensitivity of the phase comparator.

Configuration for Performing Test G

Test G is mainly for testing the counter included in the DLL circuit.

Figure 51:
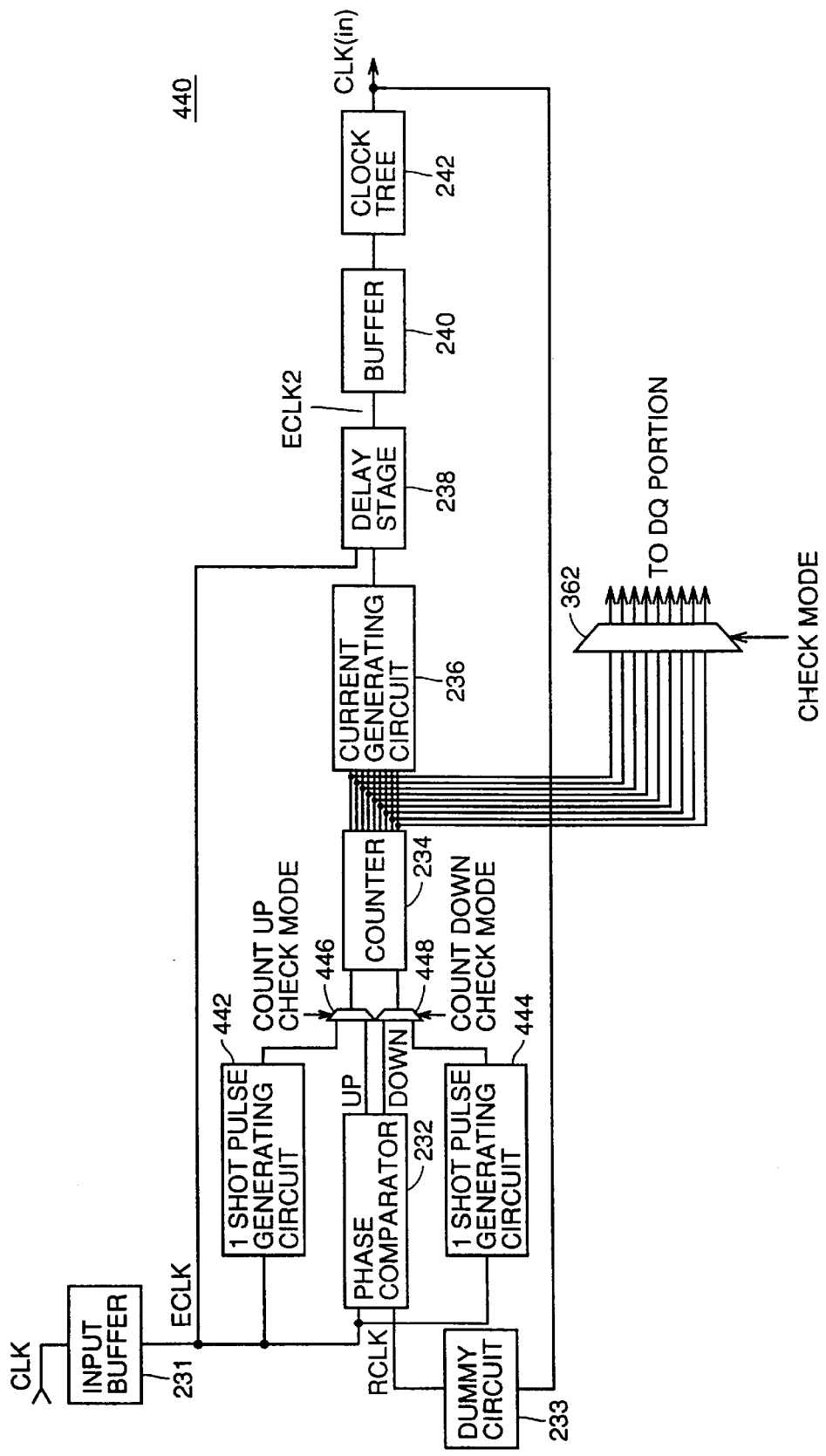
FIG. 51 is a block diagram showing a structure of DLL circuit 440 for performing test G.

FIG. 51 is a block diagram showing a structure of a DLL circuit 440 used for performing test G.

Referring to FIG. 51, DLL circuit 440 includes, in place of check circuit 364 and latches 299, 237 in the structure of DLL circuit 360 shown in FIG. 42, one shot pulse generating circuits 442 and 444 receiving the external clock signal CLK and generating a one shot pulse; a selector 446 for applying, in place of the output signal UP from the phase comparator, an output from one shot pulse generating circuit 442 to counter 234 in a counter up check mode; and a selector 448 for applying, in place of the output signal DOWN from the phase comparator 232, the output signal from one shot pulse generating circuit 444 to counter 234 in the count down. check mode. Except these points, the structure is the same as the DLL circuit 360 shown in FIG. 42. Therefore, description thereof is not repeated.

When DLL circuit 440 is used, in the count up check mode, a one shot pulse generated based on the external clock signal is input as a count up signal to counter 234, and therefore, the count value output to the data input/output terminal DQ in the check mode is counted up in response to the clock signal. By configuring this operation, the operation of counter 234 can readily be confirmed. In the count down check mode, the one shot pulse generated in response to the clock signal CLK is input as the count down pulse to counter 234. Therefore, the output value of the counter output to the data input/output terminal DQ changes ill response to the clock signal CLK. By confirming this, the operation of counter 234 can readily and surely be confirmed.

Configuration for Performing Test F

Figure 52:
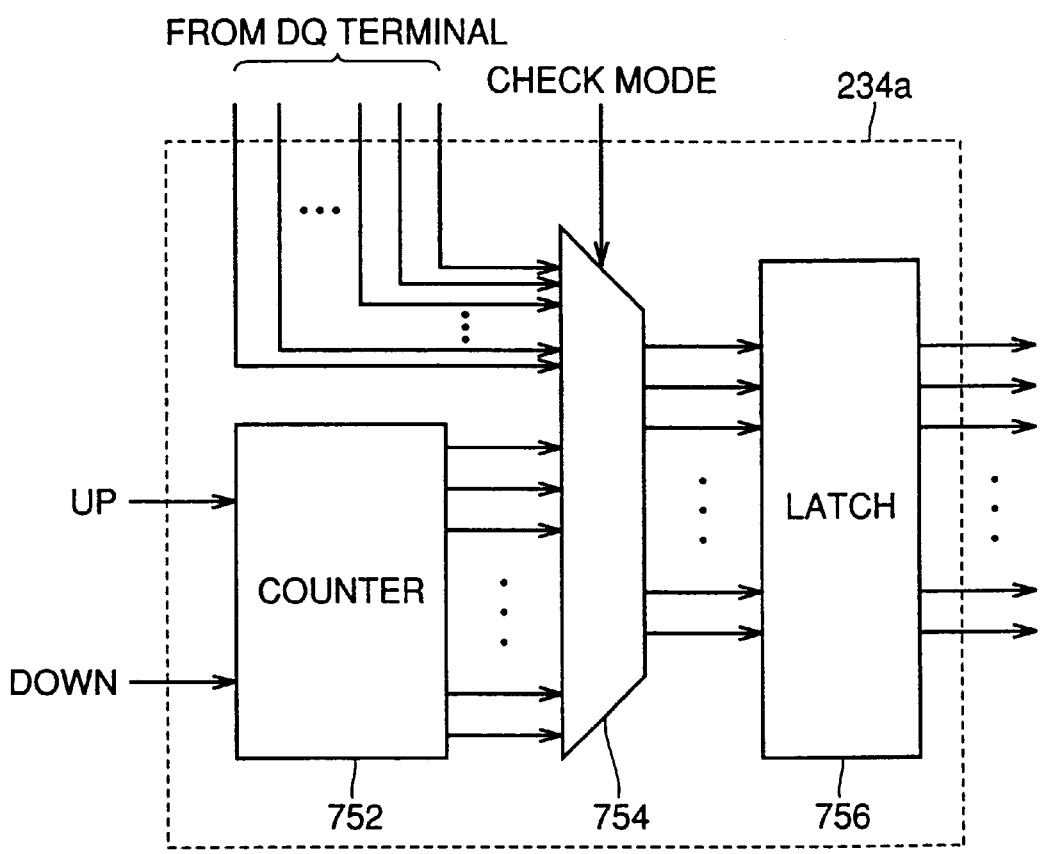
FIG. 52 is a circuit diagram showing a structure of a counter 234a used for performing test F.

FIG. 52 is a circuit diagram showing a configuration of a counter 234a used for performing test F.

Referring to FIG. 52, counter 234a includes a counter 752 which counts up when the signal UP is input and counts down when the signal DOWN is input; a select circuit 794 outputting data which is applied through data input/output terminal DQ from the outside in the check mode, and outputting an output of counter 752 as it is in the normal mode; and a latch circuit 756 receiving an output of select circuit 754.

As the counter is configured in this manner, an amount of delay of the delay stage can directly be applied from the outside at the time of testing. Therefore, it is possible to delicately confirm the amount of delay of the delay stage.

Configuration for Performing Test D

Figure 53:
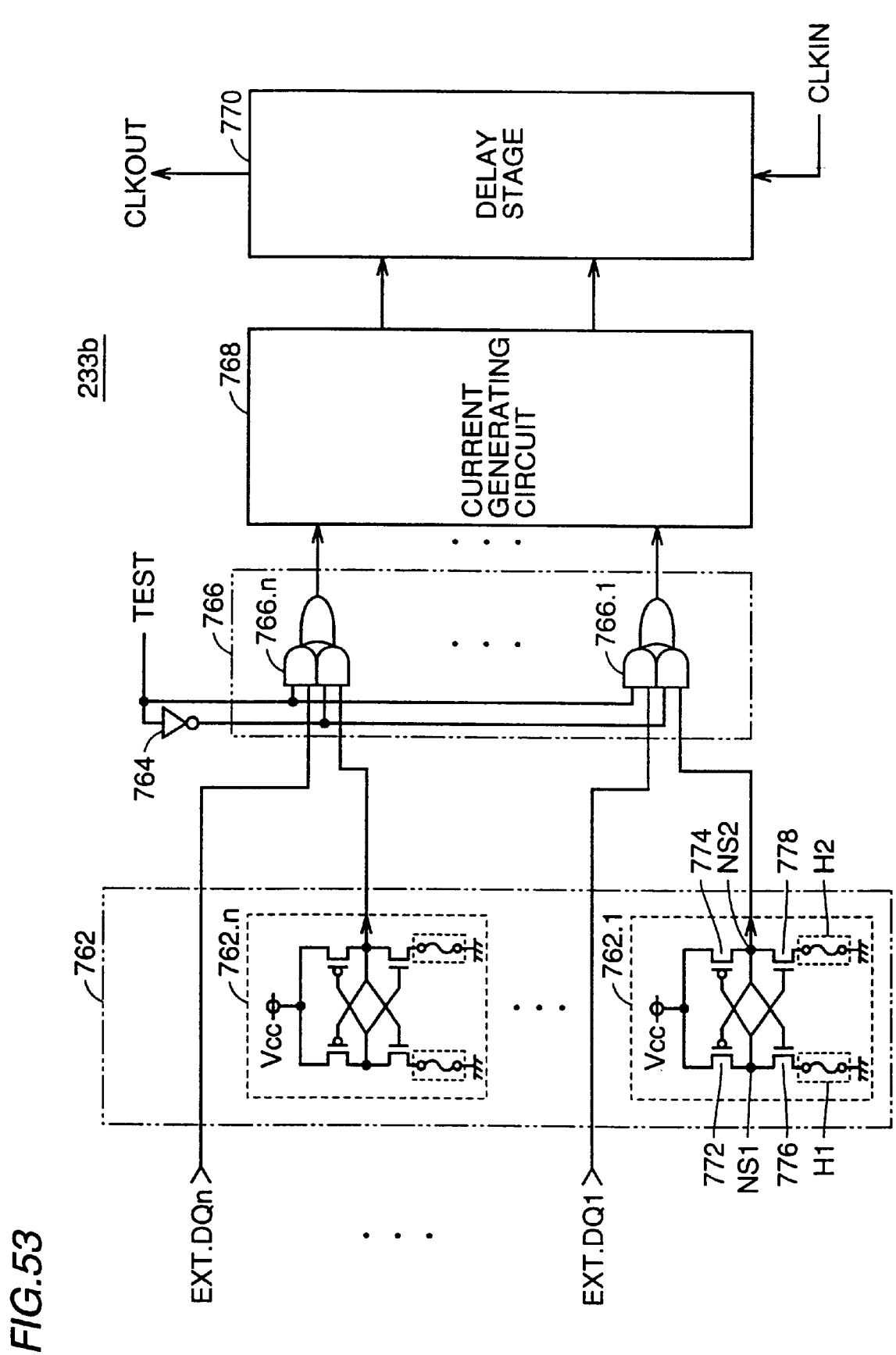
FIG. 53 is a circuit diagram showing a structure of a dummy circuit 233b for performing test D.

FIG. 53 is a circuit diagram showing a configuration of a dummy circuit 233b for performing test D.

The dummy circuit is provided in a path of the internal clock from a clock tree to an input of the phase comparator. Here, the internal clock is input to the phase comparator delayed, in order to cancel the amount of delay corresponding to the delay caused by an input buffer and the like through which the external clock signal CLK passes before it enters the phase comparator.

In case the amount of delay of the input buffer is different from what is expected or the amount of delay varies, it is desired that the dummy circuit allows tuning of the delay amount.

Referring to FIG. 53, dummy circuit 233b includes: a setting circuit 762 for setting delay data; a select circuit 766 outputting data applied from data input/output terminals DQ1 to DQn at the time of testing and outputting an output of setting circuit 762 as it is in the normal operation; a current generating circuit 768 receiving an output of select circuit 766; and a delay stage 770 receiving a control signal from current generating circuit 768, delaying the signal CLK IN by a corresponding amount of delay and providing the delay signal as the signal CLKOUT. Internal clock signal CLK (in) is input as the signal CLKIN to the dummy circuit, and an output signal CLKOUT of the dummy circuit is input to the phase comparator as the clock signal CCLK.

Setting circuit 762 includes setting portions 762.1 to 762.n. Select circuit 766 includes selectors 766.1 to 766.n.

Setting portion 762.1 includes an N channel MOS transistor 776 and a fuse element H1 connected in series between a node NS1 and the ground node and having its gate connected to node NS2; and a P channel MOS transistor 772 connected between node NS1 and a power supply node and having its gate connected to node NS2.

Setting portion 762.1 further includes an N channel MOS transistor 778 and a fuse element H2 connected in series between node NS2 and the ground node and having its gate connected to node NS1, and a P channel MOS transistor 774 connected between node NS2 and the power supply node and having its gate connected to node NS1. An output signal from the setting portion is output from node NS2.

Setting portion 762.n has a similar structure as setting portion 762.1. Therefore, description thereof is not repeated.

Current generating circuit 768 and delay stage 770 have similar configurations as current generating circuit 234 and delay stage 238 shown in FIG. 42, respectively. Therefore, description thereof is not repeated.

Figure 54:
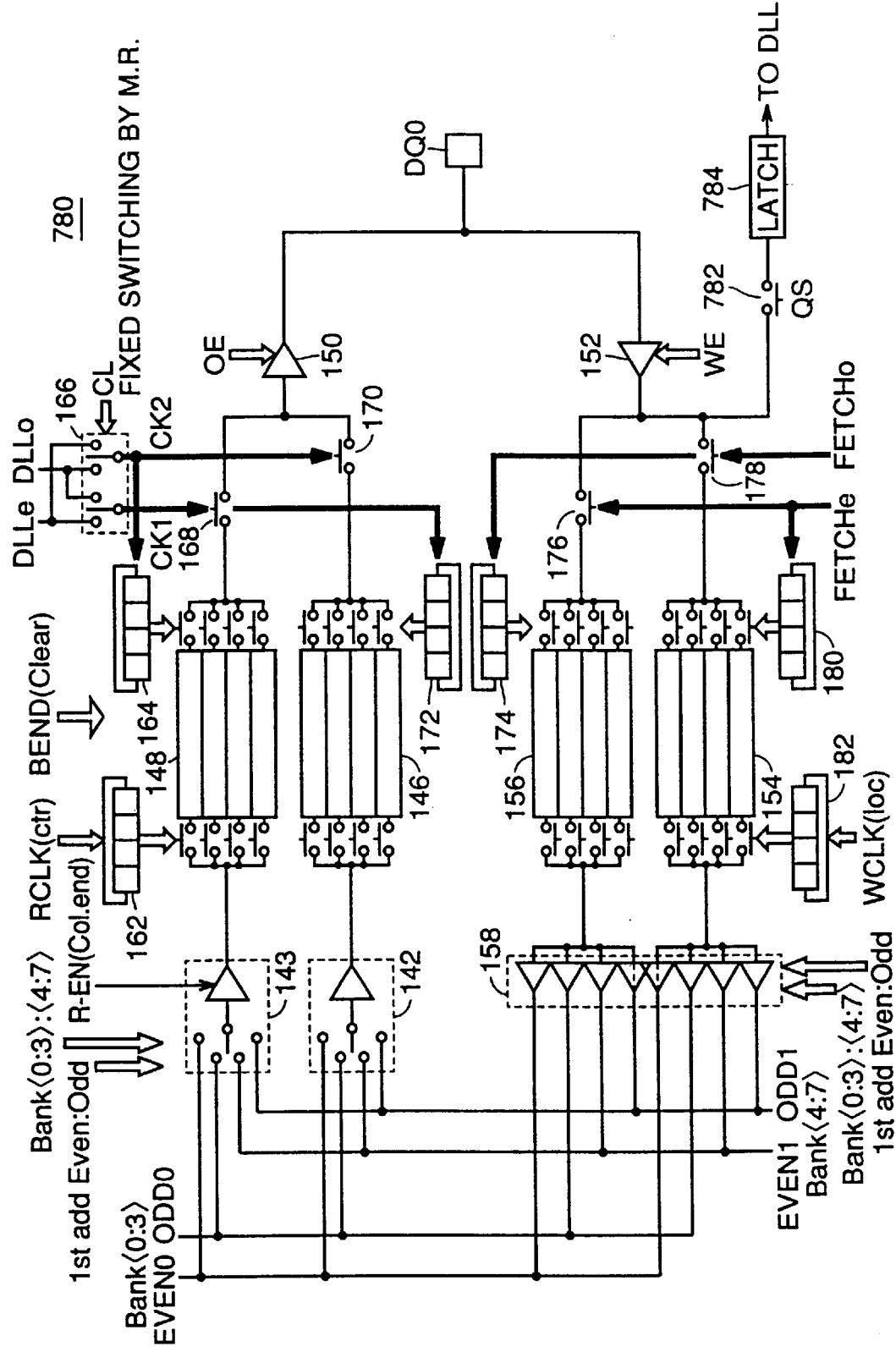
FIG. 54 is a circuit diagram showing a circuit structure of an input/output circuit 780 for inputting data for tuning through the data input/output terminal.

FIG. 54 is a circuit diagram showing a configuration of an input/output circuit 780 for inputting data for tuning through the data input/output terminal.

Referring to FIG. 54, in input/output circuit 780, an output of input buffer 152 is applied to a latch 784 through a switch 782. Switch 782 is rendered conductive in response to the strobe signal QS. An output of latch 784 is fed to the DLL circuit and input to dummy circuit 233b. Except these points, the configuration is the same as that of input/output circuit 64 shown in FIG. 10. Therefore, description thereof is not repeated.

The operation of tuning will be briefly described. At the time of testing, amount of delay is set in the current generating circuit from the outside through the data input/output terminal. At this time, the delay amount is changed variously, to find the optimal amount of delay.

By setting the found amount of delay in the setting circuit 762, the dummy circuit operates with the amount of delay as set in normal operation.

The setting of delay data to the setting circuit 762 is performed by blowing off either the fuse element H1 or H2 in setting portions 762.1 to 762.n. When fuse element H1 is blown off, the output of setting portion 762.n attains to the L level simultaneously with power on, and when fuse element H2 is blown off, the output of setting portion 762.n attains to the H level simultaneously with power on.

Offset in phase at the time of locking can be corrected by such a dummy circuit.

Configuration for Performing Test E

Figure 55:
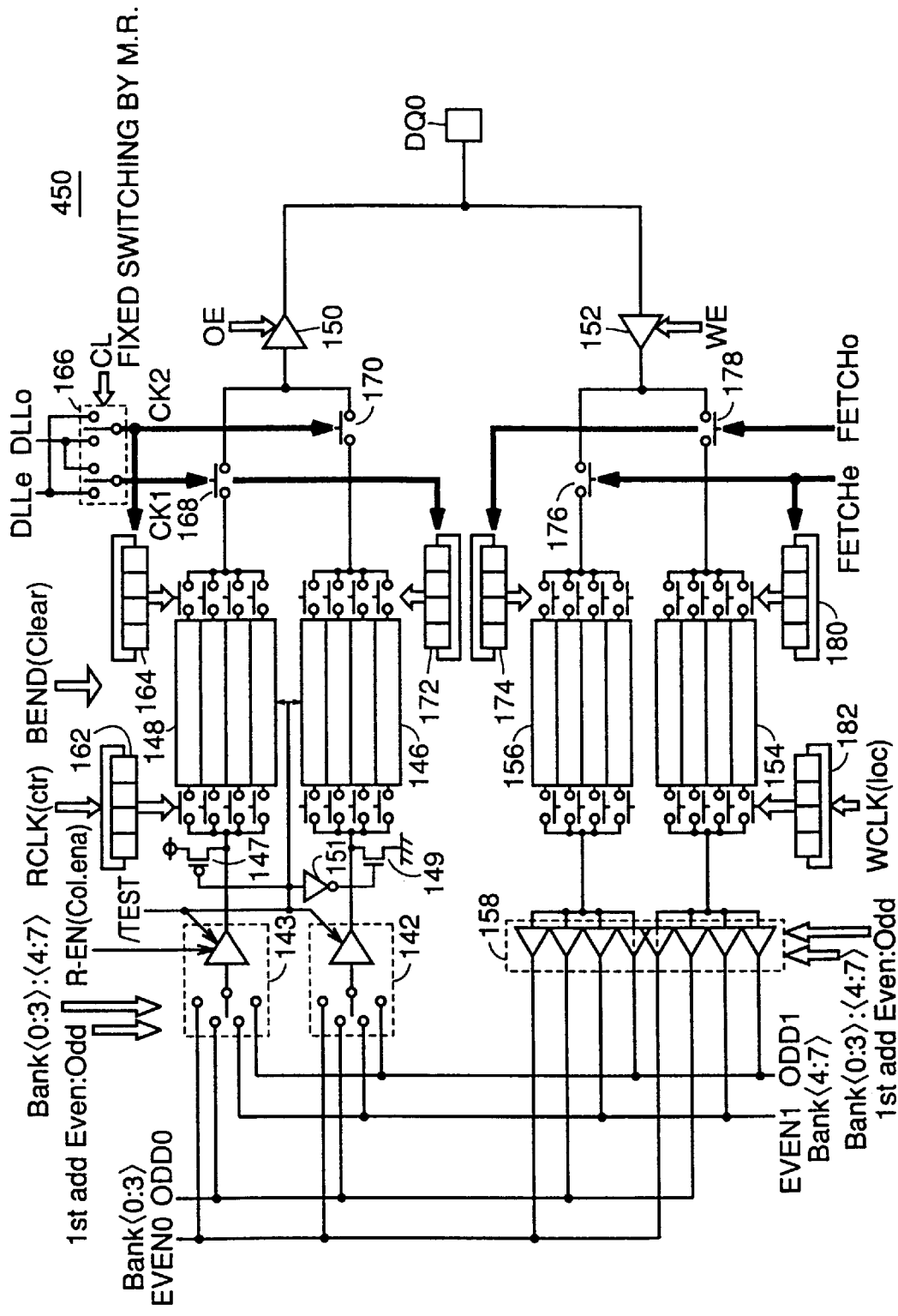
FIG. 55 is a circuit diagram showing a structure of an input/output circuit 450 used for performing test E.

FIG. 55 is a circuit diagram showing a configuration of an input/output circuit 450 used for performing test E.

In test E, H data and L data are output alternately from the data input/output terminal in synchronization with an output clock of the DLL circuit, so as to enable external monitoring of the period of the internal clock.

Referring to FIG. 55, input/output circuit 450 differs from the input/output circuit 64 in accordance with the first embodiment in that it includes a P channel MOS transistor 147 which applies a signal at "H" (high) level to an output node of receiver 143 in the test mode where test signal/test attains to the "L" (low) level, an inverter 151 receiving and inverting the test signal/test, and an N channel MOS transistor 149 receiving an output from inverter 151 and applies a signal at "L" level to the output node of receiver 142, and that receivers 142 and 143 are inactivated in the test mode by the test signal/TEST. Except these points, the structure is the same as the input/output circuit 64 described with reference to FIG. 10. Therefore, description thereof is not repeated.

When test E is performed, in the test mode, the test signal/TEST attains to the "L" level, and in place of the signal read through the data bus from the memory array, "H" data is written to latch 148 and "L" data is written to latch 146. The data in latches 148 and 146 are read alternately in response to clocks DLLe and DLLo generated by the DLL circuit. Therefore, in the test mode, "H" data and "L" data are output alternately from the terminal DQ0 to the outside.

Therefore, by monitoring the output data and the clock applied externally to the synchronous semiconductor memory device and by comparing the point of change of the output data and the clock edge, the state of operation of the DLL circuit can readily be known. More specifically, by monitoring time offset between the point of change of the output data and the clock edge, the state of locking of the DLL circuit and the offset from the locked state can be monitored indirectly from the outside.

Figure 56:
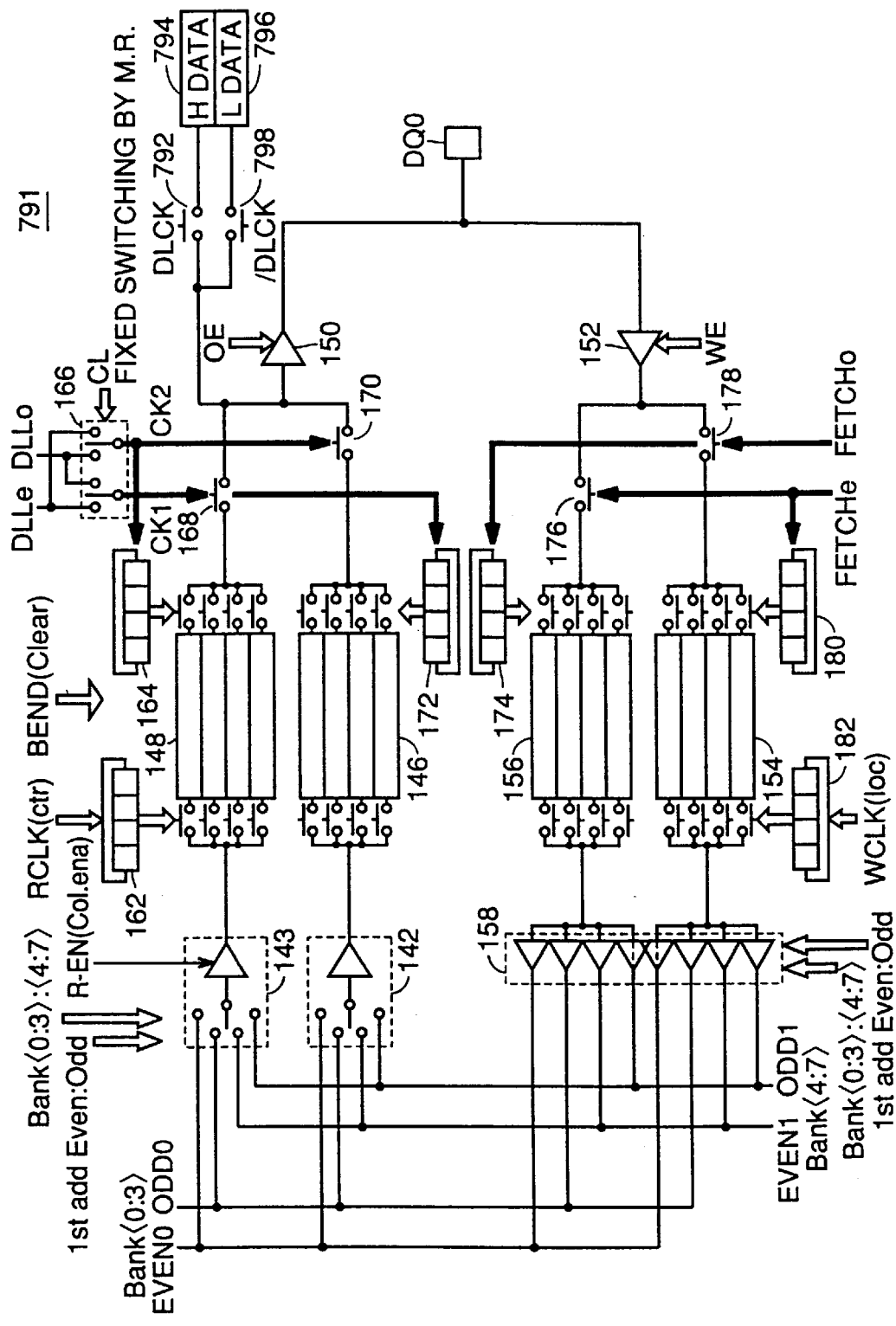
FIG. 56 is a circuit diagram showing a structure of an input/output circuit 791 for performing test E.

FIG. 56 is a circuit diagram showing a configuration of an input/output circuit 791 as a second example used for performing test E.

Referring to FIG. 56, an element 794 providing R data and an element 796 providing L data through switches 792 and 798, respectively, are connected to input nodes of output buffer 150. Switches 792 and 798 are alternately rendered conductive by the clock signals DLCK and complementary clock signals/DLCK. The clock signal DCLK is formed by frequency-dividing the clock generated by the DLL circuit, and the complementary clock signal/DLCK is an inversion thereof Except these points, the input/output circuit is similar to input/output circuit 64 shown in FIG. 10. Therefore, description thereof is not repeated.

In the test mode, switches 168 and 170 are rendered non-conductive.

Therefore, H data/L data are output using the signal provided by frequency-dividing the clock as a reference, and therefore the waveform of the internal clock is known from the outside.

In the fourth embodiment, by combining test A to test I described above, operations of various components of the DLL circuit can be confirmed in detail.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device, comprising:
  a first terminal group receiving as inputs a first data group in a normal operation mode and receiving as inputs said first data group and a second data group time divisionally in accordance with an external clock in a test mode;

a second terminal group receiving as inputs the second data group in the normal operation mode;

a first internal circuit operating in accordance with said first data group;

a second internal circuit operating in accordance with said second data group; and a test control circuit receiving said first data group from said first data terminal group and outputting the first data group to said first internal circuit and receiving said second data group from said second data terminal group and outputting the second data group to the second internal circuit, in the normal operation mode, and receiving said first and second data groups from said first input terminal group and outputting the first data group and the second data group to said first internal circuit and said second internal circuit, respectively, in the test mode.

2. The synchronous semiconductor memory device according to claim 1, wherein said first internal circuit includes
a memory block; and
said first data group represents a data group stored in said memory block.

3. The synchronous semiconductor memory device according to claim 1, further comprising a third internal circuit operating in accordance with a third data group; and a third terminal group receiving as inputs said third data group in the normal operation mode; wherein said test control circuit receives said third data group from said third data terminal group and outputs the third data group to said third internal circuit in the normal operation mode, and receives said third data group from said first input terminal group and outputs the received data group to said third internal circuit in the test mode; and said second and third data groups are input time divisionally, using a plurality of cycles of said external clock as a unit, from said first terminal group in said test mode.

4. The synchronous semiconductor memory device according to claim 1, wherein said first internal circuitry includes
a memory block; and
said test control circuit includes a driving circuit activated in the normal operation mode for outputting said first data group as a storage data group to be stored in said first internal circuitry, and a pattern generating circuit activated in said test mode for decoding test data input from a test data input/output terminal group included in said first terminal group, converting and outputting as said storage data group.

5. The synchronous semiconductor memory device according to claim 4, wherein said pattern generating circuit includes
a decode circuit decoding said test data input once in 1 clock cycle and generating a plurality of said storage data having bit width greater than the terminal number of said first terminal group, and a test data holding circuit for holding a plurality of said storage data, said test data holding circuit outputting a plurality of said storage data together to said memory block as said storage data group.

* * * * *